(12) United States Patent
Nozaki et al.

(10) Patent No.: US 11,934,102 B2
(45) Date of Patent: Mar. 19, 2024

(54) MANUFACTURING METHOD FOR CURED SUBSTANCE, MANUFACTURING METHOD FOR LAMINATE, AND MANUFACTURING METHOD FOR SEMICONDUCTOR DEVICE, AND TREATMENT LIQUID

(71) Applicant: FUJIFILM Corporation, Tokyo (JP)

(72) Inventors: Atsuyasu Nozaki, Shizuoka (JP); Misaki Takashima, Shizuoka (JP); Naoki Sato, Shizuoka (JP); Atsushi Nakamura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/337,442

(22) Filed: Jun. 20, 2023

(65) Prior Publication Data

US 2023/0350305 A1 Nov. 2, 2023

Related U.S. Application Data

(63) Continuation of application No. PCT/JP2022/029287, filed on Jul. 29, 2022.

(30) Foreign Application Priority Data

Aug. 31, 2021 (JP) ................................. 2021-140831
Oct. 29, 2021 (JP) ................................. 2021-177382

(51) Int. Cl.
*G03F 7/30* (2006.01)
*G03F 7/038* (2006.01)
(Continued)

(52) U.S. Cl.
CPC .......... *G03F 7/3057* (2013.01); *G03F 7/0387* (2013.01); *G03F 7/2051* (2013.01);
(Continued)

(58) Field of Classification Search
None
See application file for complete search history.

(56) References Cited

U.S. PATENT DOCUMENTS

| 5,310,625 A | 5/1994 | Angelopoulos et al. |
| 8,476,444 B2 | 7/2013 | Katayama et al. |
| (Continued) | | |

FOREIGN PATENT DOCUMENTS

| CN | 101981154 | 2/2011 |
| JP | H01221741 | 9/1989 |
| (Continued) | | |

OTHER PUBLICATIONS

English Machine Translation of JPH08339089A (Year: 1996).*
(Continued)

*Primary Examiner* — Mark F. Huff
*Assistant Examiner* — Nicholas E Brown
(74) *Attorney, Agent, or Firm* — JCIPRNET

(57) ABSTRACT

There is provided a manufacturing method for a cured substance, which makes it possible to obtain a cured substance having excellent breaking elongation, a manufacturing method for a laminate, including the manufacturing method for a cured substance, a manufacturing method for a semiconductor device, including the manufacturing method for a cured substance or the manufacturing method for a laminate, and there is provided a treatment liquid that is used in the manufacturing method for a cured substance. The manufacturing method for a cured substance includes a film forming step of applying a resin composition containing a precursor of a cyclization resin onto a base material to form a film, a treatment step of bringing a treatment liquid into contact with the film, and a heating step of heating the film after the treatment step, in which the treatment liquid contains at least one compound selected from the group
(Continued)

consisting of a basic compound having an amide group and a base generator having an amide group.

20 Claims, 1 Drawing Sheet

(51) Int. Cl.
    *G03F 7/20*     (2006.01)
    *G03F 7/32*     (2006.01)
    *G03F 7/40*     (2006.01)
    *H01L 21/027*     (2006.01)

(52) U.S. Cl.
    CPC ............... *G03F 7/327* (2013.01); *G03F 7/40* (2013.01); *H01L 21/0275* (2013.01)

(56) References Cited

U.S. PATENT DOCUMENTS

| | | | |
|---|---|---|---|
| 8,778,596 | B2 | 7/2014 | Katayama et al. |
| 2001/0006767 | A1* | 7/2001 | Kawamonzen ........ G03F 7/0233 |
| | | | 430/281.1 |
| 2013/0028587 | A1 | 1/2013 | Kaneko et al. |
| 2014/0186764 | A1* | 7/2014 | Yamada ................. G03G 9/132 |
| | | | 430/114 |
| 2020/0089113 | A1 | 3/2020 | Kawabata et al. |
| 2021/0302836 | A1* | 9/2021 | Yamazaki ............. G03F 7/0388 |

FOREIGN PATENT DOCUMENTS

| | | |
|---|---|---|
| JP | H01292250 | 11/1989 |
| JP | H03194559 | 8/1991 |
| JP | H07209879 | 8/1995 |
| JP | H08211629 | 8/1996 |
| JP | H08339089 | 12/1996 |
| JP | H08339089 A * | 12/1996 |
| JP | H11233949 | 8/1999 |
| JP | 2000330297 | 11/2000 |
| JP | 2018004909 | 1/2018 |
| JP | 2020033413 | 3/2020 |
| JP | 2021026053 | 2/2021 |
| TW | 201213350 | 4/2012 |
| TW | 202032267 | 9/2020 |
| WO | 2018221457 | 12/2018 |
| WO | 2020226131 | 11/2020 |

OTHER PUBLICATIONS

"Office Action of Japan Counterpart Application No. 2022-563223", dated Dec. 27, 2022, with English translation thereof, pp. 1-6.
"Office Action of Taiwanese Counterpart Application No. 111129738", dated May 15, 2023, with English translation thereof, pp. 1-12.
"International Search Report (Form PCT/ISA/210) of PCT/JP2022/029287", dated Aug. 30, 2022, with English translation thereof, pp. 1-7.
"Written Opinion of the International Searching Authority (Form PCT/ISA/237) of PCT/JP2022/029287", dated Aug. 30, 2022, with English translation thereof, pp. 1-6.
Chai Chunpeng et al., "Polymer Synthetic Materials", Beijing Institute of Technology Press, with English abstract, Jan. 2019, pp. 1-3.
"Office Action of China Counterpart Application", dated Oct. 29, 2023, with English translation thereof, p. 1-p. 18.

* cited by examiner

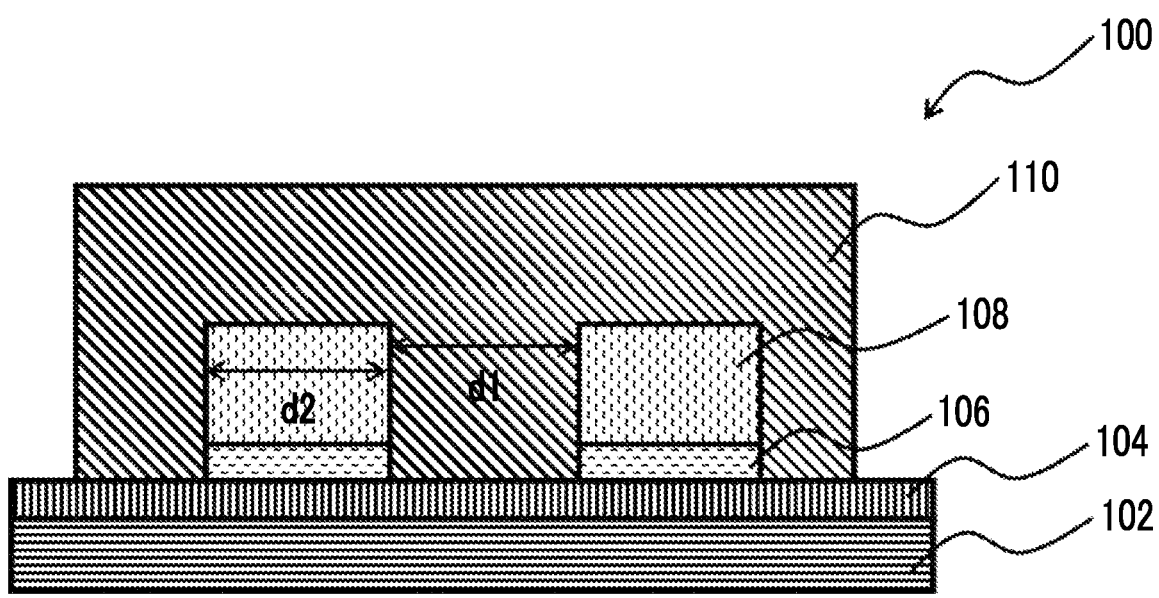

US 11,934,102 B2

MANUFACTURING METHOD FOR CURED SUBSTANCE, MANUFACTURING METHOD FOR LAMINATE, AND MANUFACTURING METHOD FOR SEMICONDUCTOR DEVICE, AND TREATMENT LIQUID

CROSS-REFERENCE TO RELATED APPLICATIONS

This application is a continuation application of International Application No. PCT/JP2022/029287, filed Jul. 29, 2022, the disclosure of which is incorporated herein by reference in its entirety. Further, this application claims priority from Japanese Patent Application No. 2021-140831, filed Aug. 31, 2021, and Japanese Patent Application No. 2021-177382, filed Oct. 29, 2021.

BACKGROUND OF THE INVENTION

1. Field of the Invention

The present invention relates to a manufacturing method for a cured substance, a manufacturing method for a laminate, and a manufacturing method for a semiconductor device, and a treatment liquid.

2. Description of the Related Art

A resin such as a polyimide is applied to various use applications since it has an excellent heat resistance and insulating properties. The above-described use applications are not particularly limited, and examples thereof in a semiconductor device for mounting include using a pattern containing such a resin as a material for an insulating film or a sealing material, or as a protective film. In addition, a pattern containing such a resin can also be used as a base film or a cover lay for a flexible substrate.

For example, in the above-described use applications, a cyclization resin such as polyimide is used in the form of a resin composition containing a precursor of the cyclization resin such as a polyimide precursor.

Such a resin composition is applied onto a base material by coating or the like, and then, as necessary, subjected to exposure, development, or heating, whereby a cured substance containing a cyclization resin (for example, a resin obtained by imidizing a polyimide precursor) can be formed on the base material.

Since the resin composition can be applied by a known coating method or the like and makes it possible to form a fine pattern, a pattern having a complicated shape, or the like by development, it can be said that the higher the degree of freedom in designing the cured substance, the more excellent the manufacturing adaptability. From the viewpoint of the excellent manufacturing adaptability described above in addition to the high performance of polyimide and the like, the industrial application and spreading of a manufacturing method for a cured substance using a resin composition containing a polyimide precursor are expected increasingly.

For example, JP1989-221741A (JP-H1-221741A) describes a pattern forming method characterized by exposing a photosensitive polyimide layer on a substrate to photocure it in an appropriate patterned manner, carrying out development for removing a non-exposed portion with a developer, subsequently immersing the substrate on which the photocured polyimide pattern layer has been formed, in a rinsing liquid for forming a photocurable polyimide pattern layer, which contains at least 5% to 30% by volume of a primary aliphatic amino compound and 2% to 20% by volume of an aprotic basic solvent, to rinse the substrate, and finally heat-treating the substrate having the photocured polyimide layer taken out from the rinsing liquid at a high temperature.

JP1995-209879A (JP-H7-209879A) describes a pattern forming method characterized in that in a method of forming a predetermined pattern from a photosensitive composition containing a photo-crosslinkable polymer having a specific repeating unit, two or more kinds of developers that differ in solubility in a photo-crosslinkable polymer are used in descending order of the solubility in a case of carrying out development by a spray method or puddle development method using an automatic machine.

SUMMARY OF THE INVENTION

In the related art, the manufacturing of a cured substance has been carried out by applying a resin composition containing a precursor of a cyclization resin such as a polyimide precursor onto a base material to form a film and then heating the precursor to obtain a cyclization resin, thereby manufacturing a cured substance. Due to the cyclization resin formation, the mechanical properties (for example, the breaking elongation) of the film are improved, and the reliability of a module including this film is improved.

Therefore, in the related art, attempts have been made to improve the breaking elongation of a film by accelerating the cyclization of the cyclization resin. However, there is still room for improvement in the breaking elongation.

An object of the present invention is to provide a manufacturing method for a cured substance, which makes it possible to obtain a cured substance having excellent breaking elongation, a manufacturing method for a laminate, including the manufacturing method for a cured substance, a manufacturing method for a semiconductor device, including the manufacturing method for a cured substance or the manufacturing method for a laminate, and to provide a treatment liquid that is used in the manufacturing method for a cured substance.

Examples of representative aspects of the present invention are described below.

<1> A manufacturing method for a cured substance: comprising:
  a film forming step of applying a resin composition containing a precursor of a cyclization resin onto a base material to form a film;
  a treatment step of bringing a treatment liquid into contact with the film; and
  a heating step of heating the film after the treatment step,
  in which the treatment liquid contains at least one compound selected from the group consisting of a basic compound having an amide group and a base generator having an amide group.

<2> The manufacturing method for a cured substance according to <1>, in which the basic compound is an amine, and the base generator is a compound that generates an amine.

<3> The manufacturing method for a cured substance according to <1> or <2>, in which the basic compound is a secondary amine or a tertiary amine, and the base generator is a compound that generates a secondary amine or a tertiary amine.

<4> The manufacturing method for a cured substance according to any one of <1> to <3>, in which the compound selected from the group consisting of the basic compound and the base generator has an acrylamide group or a methacrylamide group.
<5> The manufacturing method for a cured substance according to any one of <1> to <4>, in which the treatment liquid further contains a polymerization inhibitor.
<6> The manufacturing method for a cured substance according to any one of <1> to <5>, further comprising, between the film forming step and the treatment step:
an exposure step of selectively exposing the film; and
a development step of developing the exposed film with a developer to form a patterned film.
<7> The manufacturing method for a cured substance according to any one of <1> to <6>, in which the treatment liquid is a rinsing liquid.
<8> The manufacturing method for a cured substance according to any one of <1> to <7>, in which the treatment step is a rinsing step of cleaning the film with the treatment liquid.
<9> The manufacturing method for a cured substance according to any one of <1> to <5>, further comprising, between the film forming step and the treatment step:
an exposure step of selectively exposing the film,
in which the treatment step is a step of developing the film to form a patterned film by using the treatment liquid as a developer.
<10> The manufacturing method for a cured substance according to claim <9>, further comprising, after the treatment step:
a second treatment step of bringing a second treatment liquid into contact with the patterned film,
in which the second treatment liquid contains at least one compound selected from the group consisting of a basic compound having an amide group and a base generator having an amide group.
<11> The manufacturing method for a cured substance according to any one of <6> to <10>, in which the development is negative tone development.
<12> The manufacturing method for a cured substance according to any one of <1> to <11>, in which a content of an organic solvent is 50% by mass or more with respect to a total mass of the treatment liquid.
<13> The manufacturing method for a cured substance according to any one of <1> to <12>, in which the precursor of the cyclization resin is a polyimide precursor.
<14> The manufacturing method for a cured substance according to any one of <1> to <13>, in which the heating step is a step of accelerating the cyclization of the precursor of the cyclization resin by heating under action of at least one basic compound selected from the group consisting of the basic compound having an amide group and a basic compound generated from the base generator having an amide group.
<15> The manufacturing method for a cured substance according to any one of <1> to <14>, in which a heating temperature in the heating step is 120° C. to 230° C.
<16> A manufacturing method for a laminate, comprising a plurality of times of the manufacturing method for a cured substance according to any one of <1> to <15>.
<17> The manufacturing method for a laminate according to <16>, further comprising a metal layer forming step of forming a metal layer on a cured substance between the manufacturing methods for a cured substance which are carried out the plurality of times.
<18> A manufacturing method for a semiconductor device, comprising:
the manufacturing method for a cured substance according to any one of <1> to <15>; or
the manufacturing method for a laminate according to <16> or <17>.
<19> A treatment liquid that is a treatment liquid used in a manufacturing method for a cured substance, the manufacturing method including a film forming step of applying a resin composition containing a precursor of a cyclization resin onto a base material to form a film, a treatment step of bringing a treatment liquid into contact with the film, and a heating step of heating the film after the treatment step, the treatment liquid comprising:
at least one compound selected from the group consisting of a basic compound having an amide group and a base generator having an amide group.
<20> The treatment liquid according to <19>, in which the manufacturing method for a cured substance further includes an exposure step of selectively exposing the film formed by the film forming step, and a development step of developing the exposed film with a developer to form a patterned film, and the treatment step is a rinsing step of cleaning the patterned film with the treatment liquid.

According to the present invention, there are provided a manufacturing method for a cured substance, which makes it possible to obtain a cured substance having excellent breaking elongation, a manufacturing method for a laminate, including the manufacturing method for a cured substance, and a manufacturing method for a semiconductor device, including the manufacturing method for a cured substance or the manufacturing method for a laminate.

BRIEF DESCRIPTION OF THE DRAWINGS

FIG. 1 is a schematic cross-sectional view of a test vehicle used in a biased HAST test.

DESCRIPTION OF THE PREFERRED EMBODIMENTS

Hereinafter, the main embodiments of the present invention will be described. However, the present invention is not limited to the specified embodiments.

In the present specification, a numerical range described by using "to" means a range including numerical values described before and after the preposition "to" as a lower limit value and an upper limit value, respectively.

In the present specification, the term "step" means not only an independent step but also a step that cannot be clearly distinguished from other steps as long as the desired action of the step can be achieved.

In describing a group (an atomic group) in the present specification, in a case where a description regarding substitution and unsubstitution is not provided, the description means the group includes a group (an atomic group) having a substituent as well as a group (an atomic group) having no substituent. For example, the "alkyl group" includes not only an alkyl group that does not have a substituent (an unsubstituted alkyl group) but also an alkyl group that has a substituent (a substituted alkyl group).

In the present specification, the "exposure" includes not only exposure using light but also exposure using particle beams such as an electron beam and an ion beam, unless otherwise specified. In addition, examples of the light that is used for exposure include an actinic ray such as an emission line spectrum of a mercury lamp, a far ultraviolet ray represented by an excimer laser, an extreme ultraviolet ray (EUV light), an X-ray, or an electron beam, and a radioactive ray.

In the present specification, "(meth)acrylate" means one or both of "acrylate" and "methacrylate", "(meth)acryl" means one or both of "acryl" and "methacryl", and "(meth)acryloyl" means one or both of "acryloyl" and "methacryloyl".

In the structural formulae of the present specification, Me represents a methyl group, Et represents an ethyl group, Bu represents a butyl group, and Ph represents a phenyl group.

In the present specification, the total solid content refers to the total mass of components excluding a solvent from the entire components of the composition. In addition, in the present specification, the concentration of solid contents is a mass percentage of other components excluding a solvent with respect to the total mass of the composition.

In the present specification, weight-average molecular weight (Mw) and number-average molecular weight (Mn) are each a value measured using gel permeation chromatography (GPC) unless otherwise specified, which are defined as a polystyrene equivalent value. In the present specification, the weight-average molecular weight (Mw) and the number-average molecular weight (Mn) can be determined, for example, by using HLC-8220 GPC (manufactured by Tosoh Corporation) and using GUARD COLUMN HZ-L, TSKgel Super HZM-M, TSK gel Super HZ4000, TSK gel Super HZ3000, and TSK gel Super HZ2000 (all of which are manufactured by Tosoh Corporation) as a column connected in series. The measurements of the above molecular weights are carried out using tetrahydrofuran (THF) as an eluent unless otherwise specified. However, N-methyl-2-pyrrolidone (NMP) can also be used in a case where THF is not suitable as the eluent, for example, in a case where the solubility is low. In addition, the detection in GPC measurement is carried out using a detector with an ultraviolet ray (a UV ray) of a wavelength of 254 nm unless otherwise specified.

In the present specification, in a case where the positional relationship of respective layers constituting the laminate is described as "upper" or "lower", another layer may be on the upper side or the lower side of the reference layer among the plurality of layers of interest. That is, a third layer or element may be further interposed between the reference layer and the other layer, and the reference layer and the other layer need not be in contact with each other. In addition, unless otherwise specified, the direction in which the layers are laminated on the base material is referred to as "upward", or in a case where a resin composition layer is present, the direction from the base material to the resin composition layer is referred to as "upper". The opposite direction thereof is referred to as "downward". Furthermore, such setting of upward and downward directions is for convenience in the present specification, and in a practical aspect, the "upward" direction in the present specification may be different from a vertically upward direction.

In the present specification, a composition may contain, as each component contained in the composition, two or more compounds corresponding to the component unless otherwise particularly specified. The content of each component in the composition means the total content of all the compounds corresponding to the component unless otherwise particularly specified.

In the present specification, unless otherwise specified, the temperature is 23° C., the atmospheric pressure is 101,325 Pa (1 atm), and the relative humidity is 50% RH.

In addition, in the present specification, a combination of preferred aspects is a more preferred aspect.

(Manufacturing Method for a Cured Substance)

A manufacturing method for a cured substance according to the embodiment of the present invention includes a film forming step of applying a resin composition containing a precursor of a cyclization resin onto a base material to form a film, a treatment step of bringing a treatment liquid into contact with the film, and a heating step of heating the film after the treatment step, in which the treatment liquid contains at least one compound selected from the group consisting of a basic compound having an amide group and a base generator having an amide group.

According to the manufacturing method for a cured substance according to the embodiment of the present invention, it is possible to obtain a cured substance having excellent breaking elongation.

The mechanism by which the above effect is obtained is unknown; however, it is presumed as follows.

In the manufacturing method for a cured substance, a resin composition containing a precursor of a cyclization resin such as a polyimide precursor is applied onto a base material or the like to form a film, and then the film is heated to obtain a cured substance.

Here, it is required that this cured substance has excellent mechanical strength (large breaking elongation).

The manufacturing method for a cured substance according to the embodiment of the present invention includes a treatment step of bringing a treatment liquid into contact with the film prior to the heating step, and the treatment liquid contains at least one compound selected from the group consisting of a basic compound having an amide group and a base generator having an amide group.

Due to having high compatibility with a component in the film such as a precursor of a cyclization resin, the basic compound having an amide group or the base generator having an amide group is conceived to easily permeate into the film.

Then, in a case where the film is heated, it is conceived that the cyclization of the precursor of the cyclization resin in the film is accelerated under the action of at least one of the permeated basic compound or a basic compound generated from the permeated base generator. As a result, according to the manufacturing method for a cured substance according to the embodiment of the present invention, it is conceivable to be capable of obtaining a cured substance having large breaking elongation.

Further, from the viewpoints of the extension of the life of the device and the reliability of the operation in various operating environments, it is required to maintain the insulating properties of the cured substance over a long period of time and maintain the insulating properties in a harsh environment (for example, high temperature condition or high humidity condition).

According to the manufacturing method for a cured substance according to the embodiment of the present invention, it is conceivable to be capable of obtaining a cured substance containing a cyclization resin having a high cyclization rate by accelerating the cyclization of the precursor of the cyclization resin described above. In the cyclization resin having a high cyclization rate, for example, the decomposition or modification of the resin itself is suppressed. Therefore, it is conceived that the cured substance obtained by the manufacturing method for a cured substance according to the embodiment of the present invention easily maintains the insulating properties as described above. Therefore, the manufacturing method for a cured substance according to the embodiment of the present invention is conceived to be useful even in a case where the long-term use and the use in the harsh environment as described above are required.

In addition, in recent years, the size of the area of the substrate (base material) on which the insulating film is used has been increased from a wafer size of 8 inches to a wafer size of 12 inches or to a panel-level size. In addition, in order to install a wiring line such as a copper wiring line, the number of layers to be laminated has been gradually increased from 1 layer to 2 layers, 3 layers, 4 layers, and 5 layers.

With the increase in the size of the area of the substrate (base material) and the increase in the number of layers to be laminated, at the time of such manufacturing, it is desired that the heating in the heating step described above is carried out at a low temperature due to the reason that the warping of the wafer or the panel has become remarkable.

In addition, it is desired that the heating in the heating step described above is carried out at a low temperature for the purpose of, for example, suppressing thermal damage to other materials in the device, speeding up the manufacturing process, or realizing energy saving. According to the manufacturing method for a cured substance according to the embodiment of the present invention, even in a case where the heating in the heating step is carried out at a low temperature (for example, 230° C. or lower and further, 200° C. or lower, 180° C. or lower, or the like), it is conceivable to be capable of obtaining a cured substance having large breaking elongation by accelerating the cyclization of the precursor of the cyclization resin described above. Therefore, the manufacturing method for a cured substance according to the embodiment of the present invention is conceived to be useful even in a case where heating at such a low temperature is required.

Here, JP1989-221741A (JP-H1-221741A) and JP1995-209879A (JP-H7-209879A) do not describe a treatment liquid containing at least one compound selected from the group consisting of a basic compound having an amide group and a base generator having an amide group.

Hereinafter, the manufacturing method for a cured substance according to the embodiment of the present invention will be described in detail.

<Film Forming Step>

The manufacturing method for a cured substance according to the embodiment of the present invention includes a film forming step of applying a resin composition onto a base material to form a film.

Details of the resin composition that is used in the present invention will be described later.

[Base Material]

The kind of base material can be appropriately determined depending on the use application, and examples thereof are a base material for semiconductor production, such as silicon, silicon nitride, polysilicon, silicon oxide, or amorphous silicon, quartz, glass, an optical film, a ceramic material, a vapor-deposited film, a magnetic film, a reflective film, a metal base material (for example, it may be any one of a base material formed from a metal or a base material having a metal layer formed by plating, vapor deposition, or the like) such as Ni, Cu, Cr, or Fe, paper, spin on glass (SOG), a thin film transistor (TFT) array base material, a mold base material, and an electrode plate of a plasma display panel (PDP), which are not particularly limited. In the present invention, in particular, a base material for semiconductor production is preferable, and a silicon base material, a Cu base material, or a mold base material is more preferable.

In addition, these base materials may have, on the surface, a layer such as an intimate attachment layer formed from hexamethyl disilazane (HMDS) or the like, or an oxide layer.

In addition, the shape of the base material is not particularly limited, and it may be a circular shape or may be a rectangular shape.

Regarding the size of the base material, for example in a case of a circular shape, the diameter thereof is 100 to 450 mm and preferably 200 to 450 mm. In a case where the shape is rectangular, for example, the length of the short side is 100 to 1,000 mm and preferably 200 to 700 mm.

Further, as the base material, for example, a base material having a plate shape and preferably a base material (a base material) having a panel shape are used.

In a case where the resin composition is applied to form a film on a surface of a resin layer (for example, a layer consisting of a cured substance) or on a surface of a metal layer, the resin layer or the metal layer serves as the base material.

The means for applying the resin composition onto a base material is preferably coating.

Specific examples of the means for applying the resin composition onto a base material include a dip coating method, an air knife coating method, a curtain coating method, a wiring line bar coating method, a gravure coating method, an extrusion coating method, a spray coating method, a spin coating method, a slit coating method, and an ink jet method. From the viewpoint of the uniformity of the film thickness, the spin coating method, the slit coating method, the spray coating method, or the ink jet method is more preferable, and from the viewpoint of the uniformity of the film thickness and the viewpoint of productivity, a spin coating method or a slit coating method is preferable. A film having a desired thickness can be obtained by adjusting the concentration of solid contents of the resin composition and application conditions according to the means for applying the resin composition onto a base material. In addition, the means (coating method) for applying the resin composition onto a base material can be appropriately selected depending on the shape of the base material. In a case where a circular base material such as a wafer is used, the spin coating method, the spray coating method, the ink jet method, and the like are preferable, and in a case where a rectangular base material is used, the slit coating method, the spray coating method, the ink jet method, and the like are preferable. For example, the spin coating method can be applied at a rotation speed of 500 to 3,500 rpm for about 10 seconds to 3 minutes.

In addition, as the means for applying the resin composition onto a base material, it is also possible to apply a method (transfer method) of transferring a film previously formed on a temporary support by such a means as described above, onto a base material.

Regarding the transfer method, the production methods disclosed in paragraphs 0023 and 0036 to 0051 of JP2006-023696A and paragraphs 0096 to 0108 of JP2006-047592A can also be suitably used in the present invention.

In addition, a step of removing the excess film at the end part of the base material may be carried out. Examples of such a step include edge bead rinse (EBR) and back rinse.

Further, a pre-wetting step of applying various solvents onto a base material before applying the resin composition onto the base material to improve the wettability of the base material and then applying the resin composition onto the base material may be adopted.

<Drying Step>

The above film may be subjected to a step (a drying step) of drying the film (or the layer) formed for removing the solvent, after the film forming step (the layer forming step).

That is, the manufacturing method for a cured substance according to the embodiment of the present invention may include a drying step of drying the film formed by the film forming step.

In addition, it is preferable that the drying step is carried out after the film forming step and before the treatment step. It is noted that in a case where the manufacturing method for a cured substance includes an exposure step described later, it is preferable that the drying step is carried out before the exposure step.

The drying temperature of the film in the drying step is preferably 50° C. to 150° C., more preferably 70° C. to 130° C., and still more preferably 90° C. to 110° C. In addition, the drying may be carried out by reducing the pressure. Examples of the drying time include 30 seconds to 20 minutes, and the drying time is preferably 1 minute to 10 minutes and more preferably 2 minutes to 7 minutes.

<Treatment Step>

The manufacturing method for a cured substance according to the embodiment of the present invention includes a treatment step of bringing a treatment liquid into contact with the film.

[Treatment Liquid]

The treatment liquid that is used in the treatment step contains at least one compound selected from the group consisting of a basic compound having an amide group and a base generator having an amide group.

Here, from the viewpoint of reducing the residue in the cured substance, the treatment liquid according to the embodiment of the present invention preferably contains a basic compound having an amide group, and more preferably contains a basic compound having an amide group having a low boiling point. The boiling point will be described later.

In the present invention, the amide group refers to a group represented by *—NR$^N$—C(=O)—*, and the amide group or a part of the amide group may form a ring structure. The above R$^N$ represents a hydrogen atom or a monovalent organic group, and it is preferably a hydrogen atom or a hydrocarbon group, more preferably a hydrogen atom or an alkyl group, and still more preferably a hydrogen atom or a methyl group.

All the above * represent a bonding site to a carbon atom.

The number of amide groups in the basic compound having an amide group is not particularly limited; however, it is preferably 1 to 10, more preferably 1 to 4, still more preferably 1 or 2, and particularly preferably 1.

The number of amide groups in the base generator having an amide group is not particularly limited; however, it is preferably 1 to 10, more preferably 1 to 4, still more preferably 1 or 2, and particularly preferably 1.

In addition, from the viewpoint of the storage stability of the resin composition and the breaking elongation of the cured substance to be obtained, the basic compound is preferably an amine and more preferably a secondary amine or a tertiary amine.

From the viewpoint of the breaking elongation of the cured substance to be obtained, the base generator is preferably a compound that generates an amine, and more preferably a compound that generates a secondary amine or a tertiary amine.

Here, the amine means a compound in which a hydrogen atom of ammonia is substituted with a hydrocarbon group or an aromatic atomic group, and it refers to as a primary amine in a case where the number of substitutions is one, refers to as a secondary amine in a case where the number of substitutions is two, and refers to as a tertiary amine in a case where the number of substitutions is three.

In a case where the basic compound is an amine (in a case where the basic compound having an amide group is a primary amine, a secondary amine, or a tertiary amine, and has an amino group), the number of amino groups in the basic compound is not particularly limited; however, it is preferably 1 to 10, more preferably 1 to 4, still more preferably 1 or 2, and particularly preferably 1.

In addition, in a case where the basic compound that is generated from the base generator is an amine, the number of amino groups in the basic compound is not particularly limited; however, it is preferably 1 to 10, more preferably 1 to 4, still more preferably 1 or 2, and particularly preferably 1.

The basic compound having an amide group preferably contains an acrylamide group or a methacrylamide group as a structure containing the amide group.

The base generator having an amide group preferably contains an acrylamide group or a methacrylamide group as a structure containing the amide group.

In a case where the base generator having an amide group contains an acrylamide group or a methacrylamide group as a structure containing the amide group, the acrylamide group or the methacrylamide group may be present in a structure that becomes the basic compound to be generated or may be present in a structure that becomes a residue after the basic compound is generated; however, it is preferable to be present in a structure that becomes the basic compound to be generated.

In a case of containing, in the treatment liquid, a basic compound containing an acrylamide group or a methacrylamide group or a base generator containing an acrylamide group or a methacrylamide group, it is conceived that, during the heating step, a chemical reaction such as polymerization may occur between the acrylamide group or the methacrylamide group and a polymerizable group in a resin or a polymerizable compound, thereby reducing the amount of outgas in the treatment liquid.

—Basic Compound Having Amide Group—

The basic compound having an amide group, which is used in the present invention, is preferably a compound having a structure represented by Formula (1-1).

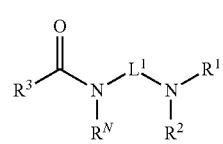

(1-1)

In Formula (1-1), R$^1$ and R$^2$ each independently represent a hydrogen atom or a monovalent organic group, R$^1$ and R$^2$ may be bonded to each other to form a ring structure, L$^1$ represents a divalent linking group, L$^1$ and at least one of R$^1$ or R$^2$ may be bonded to form a ring structure, R$^N$ represents a hydrogen atom or a monovalent organic group, and R$^3$ represents a monovalent organic group.

In Formula (1-1), R$^1$ and R$^2$ are each independently preferably a hydrogen atom or a hydrocarbon group, and more preferably a hydrogen atom or an alkyl group.

The hydrocarbon group or alkyl group in $R^1$ and $R^2$ preferably has 1 to 20 carbon atoms, more preferably 1 to 10 carbon atoms, and still more preferably 1 to 4 carbon atoms. In addition, in the present specification, in a case where it is simply described as a hydrocarbon group, an alkyl group, an alkylene group, or the like, it shall include any linear, branched, or cyclic structure, or a structure represented by bonding this structure.

In Formula (1-1), at least one of $R^1$ or $R^2$ is preferably a monovalent organic group, and it is more preferable that all of them are a monovalent organic group.

Here, $R^1$ and $R^2$ may be bonded to each other to form a ring structure. The ring structure to be formed may be an aromatic ring structure or an aliphatic ring structure. In addition, the ring structure to be formed is preferably a 5-membered ring structure or a 6-membered ring structure.

In addition, in Formula (1-1), an aspect in which $R^1$ and $R^2$ are not bonded and a ring structure is not formed can also be used.

In Formula (1-1), $L^1$ is preferably a hydrocarbon group or a group represented by a bond between a hydrocarbon group and at least one structure selected from the group consisting of —O—, —C(=O)—, —S—, —SO$_2$—, and —NR—, and it is more preferably a hydrocarbon group. The above R represents a hydrogen atom or a monovalent organic group, and it is preferably a hydrogen atom or a hydrocarbon group, more preferably a hydrogen atom or an alkyl group, and still more preferably a hydrogen atom. However, it is preferable that each of the bonding sites at which $L^1$ is bonded to two nitrogen atoms is a hydrocarbon group.

The hydrocarbon group in $L^1$ is preferably an alkylene group.

The hydrocarbon group in $L^1$ preferably has 1 to 20 carbon atoms, more preferably 1 to 10 carbon atoms, and still more preferably 1 to 4 carbon atoms.

$L^1$ and at least one of $R^1$ or $R^2$ may be bonded to form a ring structure. The ring structure to be formed may be an aromatic ring structure or an aliphatic ring structure. In addition, the ring structure to be formed is preferably a 5-membered ring structure or a 6-membered ring structure.

In addition, in Formula (1-1), an aspect in which both $L^1$, $R^1$, and $R^2$ are not bonded and a ring structure is not formed can also be used.

In Formula (1-1), the above $R^N$ represents a hydrogen atom or a monovalent organic group, and it is preferably a hydrogen atom or a hydrocarbon group, more preferably a hydrogen atom or an alkyl group, and still more preferably a hydrogen atom or a methyl group.

In Formula (1-1), $R^3$ represents a monovalent organic group, and it is preferably a hydrocarbon group and more preferably an alkyl group or an alkenyl group.

The alkyl group preferably has 1 to 20 carbon atoms, more preferably has 1 to 10 carbon atoms, and still more preferably has 1 to 4 carbon atoms.

The alkenyl group preferably has 2 to 20 carbon atoms, more preferably 2 to 10 carbon atoms, and still more preferably 2 to 4 carbon atoms.

In particular, an aspect in which $R^3$ is a vinyl group or a 2-methyl vinyl group is also one of the preferred aspects of the present invention.

In addition, the basic compound having an amide group may be a polymer compound.

Examples of the polymer compound which is a basic compound having an amide group include a polymer compound having a repeating unit having an amide group and an amino group. The amino group is preferably a secondary amino group or a tertiary amino group.

Examples of the polymer compound include a polymer compound containing a repeating unit represented by Formula (1-2).

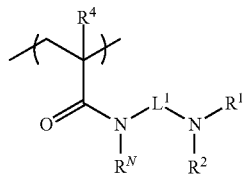

(1-2)

In Formula (1-2), $R^1$ and $R^2$ each independently represent a hydrogen atom or a monovalent organic group, $R^1$ and $R^2$ may be bonded to each other to form a ring structure, $L^1$ represents a divalent linking group, $L^1$ and at least one of $R^1$ or $R^2$ may be bonded to form a ring structure, $R^N$ represents a hydrogen atom or a monovalent organic group, and $R^4$ represents a hydrogen atom or a monovalent organic group.

In Formula (1-2), $R^1$, $R^2$, $R^N$, and $L^1$ respectively have the same meanings as $R^1$, $R^2$, $R^N$, and $L^1$ in Formula (1-1), and the same applies to the preferred aspects thereof. In Formula (1-2), $R^4$ is preferably a hydrogen atom or an alkyl group, and more preferably a hydrogen atom or a methyl group.

<<Physical Properties>>

The molecular weight of the basic compound having an amide group is not particularly limited; however, it is preferably as small as possible. It is, for example, preferably 500 or less and more preferably 200 or less. The lower limit value thereof is not particularly limited; however, examples thereof include 45.

However, in a case where the basic compound having an amide group is a polymer compound, the weight-average molecular weight of the polymer compound is preferably as small as possible, and it is, for example, preferably 2,000 or less.

The boiling point of the basic compound having an amide group at 1 atm is not particularly limited; however, it is preferably 200° C. or lower, more preferably 180° C. or lower, and still more preferably 160° C. or lower. Hereinafter, "1 atm" may also be denoted as "normal pressure" or "normal pressure (101,325 Pa)", which has the same meaning.

The melting point of the basic compound having an amide group at 1 atm is not particularly limited; however, the basic compound is preferably a liquid at normal temperature (23° C.).

In addition, in a case where the treatment liquid contains a solvent, the boiling point of the basic compound having an amide group at 1 atm is preferably equal to or higher than a temperature obtained by subtracting 20° C. from the boiling point of the solvent contained in the treatment liquid at 1 atm, and it is more preferably equal to or higher than the boiling point of the solvent contained in the treatment liquid at 1 atm. For example, in a case where the boiling point of the solvent at 1 atm is 100° C., in the basic compound having an amide group, it is preferable that the boiling point is 80° C. or higher, and it is more preferable that the boiling point at 1 atm is 100° C. or higher.

The pKa of the conjugate acid of the basic compound having an amide group is not particularly limited; however, it is preferably 0 or more, more preferably 3 or more, and still more preferably 6 or more. The upper limit of the pKa of the conjugate acid is not particularly limited; however, it is preferably 30 g or less.

The "pKa" is represented by the negative common logarithm pKa of the equilibrium constant Ka of a dissociation reaction, in a case of assuming that hydrogen ions are released from the acid in the dissociation reaction. In the present specification, unless otherwise specified, pKa is a value calculated by ACD/ChemSketch (registered trade name).

In a case where the conjugate acid has a plurality of pKa values, at least one of them is preferably within the above range.

Specific Example

Examples of the basic compound having an amide group include, but are not limited to, the following compounds.

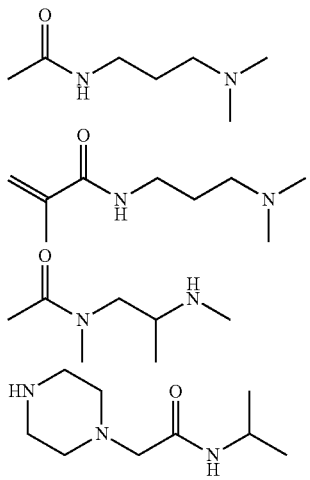

<<Content>>

The content of the basic compound having an amide group is preferably 15% by mass or less, more preferably 10% by mass or less, and still more preferably 5% by mass or less, with respect to the total mass of the treatment liquid. The lower limit of the content is not particularly limited; however, it is, for example, preferably 0.1% by mass or more.

In addition, the content of the basic compound having an amide group is preferably 70% to 100% by mass with respect to the total solid content of the treatment liquid. The treatment liquid may contain only one kind of basic compound having an amide group or may contain two or more kinds thereof. In a case where two or more kinds of basic compounds having an amide group are used, the total amount thereof is preferably in the above range.

—Another Basic Compound—

The treatment liquid may further contain a basic compound having no amide group (also referred to as "another basic compound"). The other basic compound is preferably an organic base from the viewpoint of the reliability in a case of being remained in the cured film (the adhesiveness to the base material in a case where the cured substance is further heated).

In addition, the other basic compound is preferably a basic compound having an amino group and more preferably a primary amine, a secondary amine, a tertiary amine, an ammonium salt, or the like. However, in order to accelerate the imidization reaction, it is preferably a primary amine, a secondary amine, a tertiary amine, or an ammonium salt, more preferably a secondary amine, a tertiary amine, or an ammonium salt, still more preferably a secondary amine or a tertiary amine, and particularly preferably a tertiary amine.

From the viewpoint of mechanical properties (the breaking elongation) of the cured substance, it is preferable that the other basic compound hardly remains in the cured film (the obtained cured substance), and from the viewpoint of accelerating imidization, it is preferable that the residual amount of the other basic compound hardly decreases due to vaporization or the like before heating.

Therefore, the boiling point of the other basic compound is preferably 30° C. to 350° C., more preferably 80° C. to 270° C., and still more preferably 100° C. to 230° C. at normal pressure (101,325 Pa).

In addition, the boiling point of the other basic compound is preferably equal to or higher than the temperature obtained by subtracting 20° C. from the boiling point of the solvent contained in the treatment liquid, and it is more preferably equal to or higher than the boiling point of the solvent contained in the treatment liquid.

For example, in a case where the boiling point of the organic solvent is 100° C., the basic compound to be used preferably has a boiling point of 80° C. or higher and more preferably a boiling point of 100° C. or higher.

The treatment liquid may contain only one kind of the other basic compound having an amide group or may contain two or more kinds thereof.

Specific examples of the other basic compound include ethanolamine, diethanolamine, triethanolamine, ethylamine, diethylamine, triethylamine, hexylamine, dodecylamine, cyclohexylamine, cyclohexylmethylamine, cyclohexyldimethylamine, aniline, N-methylaniline, N,N-dimethylaniline, diphenylamine, pyridine, butylamine, isobutylamine, dibutylamine, tributylamine, dicyclohexylamine, diazabicycloundecene (DBU), 1,4-diazabicyclo[2.2.2]octane (DABCO), N,N-diisopropylethylamine, tetramethylammonium hydroxide, tetrabutylammonium hydroxide, ethylenediamine, butanediamine, 1,5-diaminopentane, N-methylhexylamine, N-methyldicyclohexylamine, trioctylamine, N-ethylethylenediamine, N,N-diethylethylenediamine, N,N,N',N'-tetrabutyl-1,6-hexanediamine, spermidine, diaminocyclohexane, bis(2-methoxyethyl)amine, piperidine, methylpiperidine, dimethylpiperidine, piperazine, tropane, N-phenylbenzylamine, 1,2-dianilinoethane, 2-aminoethanol, toluidine, aminophenol, hexylaniline, phenylenediamine, phenylethylamine, dibenzylamine, pyrrole, N-methylpyrrole, N,N,N,N-tetramethylethylenediamine, and N,N,N,N-tetramethyl-1,3-propanediamine.

—Base Generator Having Amide Group—

Examples of the base generator having an amide group, which is used in the present invention, include those having an amide group among base generators that are used in a resin composition according to the present invention described later. Examples of the preferred form thereof also include a case where the treatment liquid and the resin composition, which is a resin composition according to the present invention and contains a precursor of a cyclization resin, each contain a base generator having an amide group.

In addition, the base generator having an amide group may be a photobase generator or may be a thermal-base generator; however, it is preferably a thermal-base generator.

Specific Example

Examples of the base generator having an amide group include, but are not limited to, the following compounds.

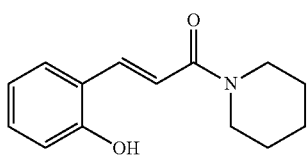 [SMILES: O=C(/C=C/c1ccccc1O)N1CCCCC1]

<<Content>>

The content of the base generator having an amide group is preferably 10% by mass or less and more preferably 5% by mass or less with respect to the total mass of the treatment liquid. The lower limit of the content is not particularly limited; however, it is preferably 0.1% by mass or more.

The treatment liquid may contain only one kind of base generator having an amide group or may contain two or more kinds thereof. In a case where two or more kinds of base generators having an amide group are used, the total amount thereof is preferably in the above range.

—Another Base Generator—

The treatment liquid may contain a base generator having no amide group (also referred to as "another base generator"). As the other base generator, it is possible to use, without particular limitation, those having no amide group among base generators that are used in a resin composition according to the present invention described later.

In addition, the other base generator may be a photobase generator or may be a thermal-base generator; however, it is preferably a thermal-base generator.

—Polymerization Inhibitor—

The treatment liquid preferably further contains a polymerization inhibitor.

An aspect in which the treatment liquid according to the present invention contains at least one compound selected from the group consisting of a basic compound having an acrylamide group or a methacrylamide group and a base generator having an acrylamide group or a methacrylamide group, and contains a polymerization inhibitor is also one of the preferred aspects of the present invention.

The polymerization inhibitor is not particularly limited; however, examples thereof include a phenol-based compound, a quinone-based compound, an amino-based compound, an N-oxyl-free radical-based compound, a nitro-based compound, a nitroso-based compound, a heteroaromatic ring-based compound, and a metal compound.

As a specific compound of the polymerization inhibitor, p-hydroquinone, o-hydroquinone, o-methoxyphenol, p-methoxyphenol, di-tert-butyl-p-cresol, pyrogallol, p-tert-butylcatechol, 1,4-benzoquinone, diphenyl-p-benzoquinone, 4,4'-thiobis(3-methyl-6-tert-butylphenol), 2,2'-methylenebis(4-methyl-6-tert-butylphenol), an N-nitrosophenylhydroxyamine cerium (III) salt, an N-nitroso-N-phenylhydroxyamine aluminum salt, N-nitrosodiphenylamine, N-phenyl naphthylamine, ethylenediamine tetraacetic acid, 1,2-cyclohexanediamine tetraacetic acid, glycol ether diamine tetraacetic acid, 2,6-di-tert-butyl-4-methyl phenol, 5-nitroso-8-hydroxyquinoline, 1-nitroso-2-naphtol, 2-nitroso-1-naphtol, 2-nitroso-5-(N-ethyl-N-sulfopropylamino)phenol, an N-nitroso-N-(1-naphthyl)hydroxyamine ammonium salt, bis(4-hydroxy-3,5-tert-butyl)phenylmethane, 1,3,5-tris(4-t-butyl-3-hydroxy-2,6-dimethylbenzyl)-1,3,5-triazine-2,4,6-(1H,3H,5H)-trione, a 4-hydroxy-2,2,6,6-tetramethylpiperidin-1-oxyl free radical, 2,2,6,6-tetramethylpiperidin-1-oxyl free radical, phenothiazine, phenoxazine, 1,1-diphenyl-2-picrylhydrazyl, dibutyl-dithiocarbamate copper (II), nitrobenzene, an N-nitroso-N-phenylhydroxylamine aluminum salt, an N-nitroso-N-phenylhydroxylamine ammonium salt, or the like is suitably used. In addition, the polymerization inhibitors described in paragraph 0060 of JP2015-127817A and the compounds described in paragraphs 0031 to 0046 of WO2015/125469A can also be used, the contents of which are incorporated in the present specification.

In a case where the treatment liquid contains a polymerization inhibitor, the content of the polymerization inhibitor is preferably 0.01% to 20% by mass, more preferably 0.01% to 15% by mass, still more preferably 0.01% to 10% by mass, even still more preferably 0.02% to 15% by mass, and particularly preferably 0.05% to 10% by mass, with respect to the total solid content of the treatment liquid.

One kind of polymerization inhibitor may be used, or two or more kinds thereof may be used. In a case where two or more kinds of polymerization inhibitors are used, the total thereof is preferably within the above-described range.

—Solvent—

The treatment liquid may contain a solvent. Examples of the solvent include water and an organic solvent, where an organic solvent is preferable.

Suitable examples of the organic solvent include esters such as ethyl acetate, n-butyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, δ-valerolactone, an alkyl alkyloxyacetate (example: a methyl alkyloxyacetate, an ethyl alkyloxyacetate, and a butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (example: a methyl 3-alkyloxypropionate and an ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (example: a methyl 2-alkyloxypropionate, an ethyl 2-alkyloxypropionate, and a propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), a methyl 2-alkyloxy-2-methylpropionate and an ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether (PGME), propylene glycol monomethyl ether acetate (PGMEA), propylene glycol monoethyl ether acetate, and propylene glycol monopropyl ether acetate; ketones such as methyl ethyl ketone, cyclohexanone, cyclopentanone, 2-heptanone, 3-heptanone, and N-methyl-2-pyrrolidone; cyclic hydrocarbons, for example, aromatic hydrocarbons such as toluene, xylene, and anisole, and cyclic terpenes such as limonene; sulfoxides such as dimethyl sulfoxide; and alcohols such as methanol, ethanol, propanol, isopropanol, butanol, pentanol, octanol, diethylene glycol, propylene glycol, methylisobutyl carbinol, and triethylene glycol; and amides such as N-methylpyrrolidone, N-ethylpyrrolidone, and dimethylformamide.

In addition, these basic compounds can be used as the solvent and the basic compound in a case where the basic compound having an amide group or the other basic compound is a liquid in an environment in which the treatment liquid is used.

In a case where the treatment liquid contains a solvent, the content of the solvent with respect to the total mass of the treatment liquid is preferably 50% by mass or more, more preferably 70% by mass or more, and still more preferably 90% by mass or more.

In addition, in a case where the treatment liquid contains an organic solvent, the content of the organic solvent with respect to the total mass of the treatment liquid is preferably 50% by mass or more, more preferably 70% by mass or more, and still more preferably 90% by mass or more.

One kind of solvent may be used, or two or more kinds thereof may be used. In a case where two or more kinds of solvents are used, the total thereof is preferably within the above-described range.

In a case where the treatment liquid contains two or more kinds of solvents, the solvents preferably include at least two kinds selected from the group consisting of an ether-based solvent and an ester-based solvent. Preferable examples of such an aspect include an aspect including PGMEA and γ-butyrolactone and an aspect including butyl acetate and γ-butyrolactone.

—Other Components—

The treatment liquid may further contain other components.

Examples of the other components include a known surfactant and a known antifoaming agent.

It is preferable to include, between the film forming step and the treatment step, an exposure step of selectively exposing the film and a development step of developing the exposed film with a developer to form a patterned film. Hereinafter, an aspect in which the film forming step, the exposure step, the development step, and the treatment step are carried out will also be described as an aspect A.

In the aspect A, the treatment step serves as a step of bringing the patterned film obtained by the development step into contact with the treatment liquid.

[Supply Method for Treatment Liquid]

A supply method for a treatment liquid is not particularly limited as long as the treatment liquid can be brought into contact with the film. However, examples thereof include a method of suppling a treatment liquid onto a film obtained in the film forming step, a method of supplying a treatment liquid onto an exposed film, after the exposure step described later, and an aspect of supplying a treatment liquid onto a patterned film.

The supply method is not particularly limited and includes a method of immersing a base material in a treatment liquid, a method of carrying out supply by puddling (liquid filling) on a base material, a supply method of supplying a treatment liquid to a base material by a shower, and a method of continuously supplying a treatment liquid onto a base material by a means such as a straight nozzle.

From the viewpoint of the permeability of the treatment liquid into an image area, the removability of a non-image area, and the manufacturing efficiency, there is a method in which a treatment liquid is supplied with a shower nozzle, a straight nozzle, a spray nozzle, or the like, and a method in which a treatment liquid is continuously supplied with a spray nozzle is preferable. From the viewpoint of the permeability of the treatment liquid into the image area, a method in which a treatment liquid supplied with a spray nozzle is kept on a base material is more preferable.

The supply method for a treatment liquid may be carried out by a combination of supply methods (for example, a combination of supply by puddling and supply by a shower or a combination of supply by puddling and supply by a straight nozzle). For example, the puddle supply has an effect that the film swells and a subsequent treatment liquid easily permeates, and the shower supply or the spray supply has an effect that the removability of the non-image area is improved. In addition, it suffices that the treatment liquid is used in at least one of the methods to be used in combination.

Here, in the present invention, an aspect in which the treatment step with the treatment liquid is carried out after supplying, onto a pattern, a liquid containing neither the basic compound having an amide group nor the base generator having an amide group (for example, after supplying, onto a patterned film, a rinsing liquid containing neither the basic compound having an amide group nor the base generator having an amide group and then cleaning the pattern) may be adopted.

A method of supplying, onto a pattern, the treatment liquid which contains neither the basic compound having an amide group nor the base generator having an amide group in the above aspect, is not particularly limited; however, examples thereof include supply by puddling.

The method of supplying a treatment liquid onto a pattern in the above aspect is not particularly limited; however, preferred examples thereof include supply by a shower and supply by a straight nozzle.

In a case of supplying, by puddling, a treatment liquid containing neither the basic compound having an amide group nor the base generator having an amide group, it is conceived that at least one compound selected from the group consisting of a basic compound having an amide group and a base generator having an amide group in a treatment liquid to be supplied after a pattern swells permeates easily into the pattern, and thus an effect such as improvement of breaking elongation is more easily obtained. In addition, in a case where a treatment liquid is supplied by a shower, a straight nozzle, or the like, the removability (the rinsing property) of development debris and the like may be also excellent.

In addition, in the supply method for a treatment liquid in the treatment step, a step of continuously supplying a treatment liquid to a base material, a step of keeping a treatment liquid in a substantially stationary state on a base material, a step of vibrating a treatment liquid on a base material by ultrasonic waves or the like, and a step obtained by combining these steps can be adopted.

Among these, the treatment step is preferably a step of supplying or continuously supplying the treatment liquid to the developed pattern by a widely radiating method such as spraying or showering.

In addition, it is also preferable that the development in the development step is carried out by puddle development, and at least one time of supply of the treatment liquid supply in the treatment step is carried out by supply by a shower or continuous supply by a straight nozzle or the like. According to the above aspect, since the pattern is swollen due to puddle development, at least one compound selected from the group consisting of a basic compound and a base generator in a treatment liquid permeates easily into the pattern, and thus it is conceived that an effect such as improvement of breaking elongation is more easily obtained.

Here, in the supply of the treatment liquid, a plurality of kinds of treatment liquids according to the present invention may be simultaneously supplied to the film, or the treatment liquid according to the present invention and a treatment liquid (another treatment liquid) containing neither the basic compound having an amide group nor the base generator having an amide group may be simultaneously supplied thereto.

In a case where a plurality of kinds of treatment liquids according to the present invention may be simultaneously supplied to the film, the kinds and contents of solvents contained in the respective treatment liquids may be the same or different from each other.

In a case where the solvents are different from each other, the combination thereof is, for example, preferably a combination of ethers and esters.

In addition, the kinds and contents of at least one compound selected from the group consisting of a basic compound having an amide group and a base generator having an amide group, which are contained in the respective treatment liquids, may be the same or different from each other.

In cases where the above compounds are different from each other, the preferred combination thereof is, for example, a combination of acrylamide and methacrylamide or a combination of methacrylamide and acetamide.

In addition, the kinds and contents of other components such as the other basic compound contained in the respective treatment liquids may be the same or different from each other.

In a case where the treatment liquid according to the present invention and a treatment liquid (another treatment liquid) containing neither the basic compound having an amide group nor the base generator having an amide group are supplied simultaneously, the solvent contained in the treatment liquid according to the present invention and the solvent contained in the other treatment liquid may be the same as or different from each other.

For example, the preferred combination is a combination in which the solvent contained in the treatment liquid according to the present invention is PGMEA, butyl acetate, or γ-butyrolactone and the solvent contained in the other treatment liquid is PGMEA, butyl acetate, or γ-butyrolactone.

In a case of simultaneously supplying a plurality of kinds of treatment liquids, it is possible to simultaneously supply the plurality of kinds of treatment liquids to the film for example, by a method in which a device equipped with a plurality of supply means for supplying treatment liquids, such as nozzles, is used to supply a first kind of treatment liquid from one supply means and to supply a second kind of treatment liquid from another supply means.

The ratio between the using amounts of these treatment liquids is not particularly limited and may be determined, for example, in consideration of the components contained in the film and the shape of the pattern to be obtained.

The treatment time in the treatment step (that is, the time during which the treatment liquid and the pattern come into contact with each other) is preferably 10 seconds to 10 minutes and more preferably 20 seconds to 5 minutes. The temperature of the treatment liquid at the time of the treatment step is not particularly specified; however, rinsing can be preferably carried out at 10° C. to 45° C. and more preferably 18° C. to 30° C.

<<Exposure Step>>

The manufacturing method for a cured substance according to the embodiment of the present invention may include an exposure step of selectively exposing the film formed by the film forming step.

The selective exposure means that a part of the film is exposed. In addition, by selectively exposing the film, an exposed region (an exposed portion) and an unexposed region (a non-exposed portion) are formed in the film.

The exposure amount is not particularly specified as long as the resin composition can be cured; however, it is, for example, preferably 50 to 10,000 mJ/cm$^2$ and more preferably 200 to 8,000 mJ/cm$^2$ in terms of conversion of exposure energy at a wavelength of 365 nm.

The exposure wavelength can be appropriately determined in a range of 190 to 1,000 nm and preferably in a range of 240 to 550 nm.

Examples of the exposure wavelength, which are mentioned in the relationship with the light source, include (1) a semiconductor laser (wavelength: 830 nm, 532 nm, 488 nm, 405 nm, 375 nm, 355 nm, or the like); (2) a metal halide lamp; (3) a high-pressure mercury lamp, a g-line (wavelength: 436 nm), an h-line (wavelength: 405 nm), an i-line (wavelength: 365 nm), or Broad (three wavelengths of the g, h, and i-line); (4) an excimer laser, a KrF excimer laser (wavelength: 248 nm), an ArF excimer laser (wavelength: 193 nm), or an $F_2$ excimer laser (wavelength: 157 nm); (5) an extreme ultraviolet (EUV) ray (wavelength: 13.6 nm); (6) an electron beam; and (7) a second harmonic wave of 532 nm and a third harmonic wave of 355 nm of a YAG laser. With respect to the resin composition, it is preferable to apply an exposure step with a light source that has an exposure wavelength including an i-line, where examples of the exposure include a high-pressure mercury lamp and Broad. In particular, exposure with a high-pressure mercury lamp is preferable, and among the above, exposure with an i-line is preferable. In this case, particularly high exposure sensitivity can be obtained.

In addition, the exposure method is not particularly limited as long as at least a part of the film consisting of the resin composition is exposed; however, examples thereof include exposure using a photo mask and exposure by a laser direct imaging method.

<Post-Exposure Heating Step>

The film may be subjected to a step of carrying out heating after the exposure (a post-exposure heating step).

That is, the manufacturing method for a cured substance according to the embodiment of the present invention may include a post-exposure heating step of heating the film exposed by the exposure step.

The post-exposure heating step can be carried out after the exposure step and before the development step.

The heating temperature in the post-exposure heating step is preferably 50° C. to 140° C. and more preferably 60° C. to 120° C.

The heating time in the post-exposure heating step is preferably 30 seconds to 300 minutes and more preferably 1 minute to 10 minutes.

In the post-exposure heating step, the temperature elevation rate from the temperature at the start of heating to the maximum heating temperature is preferably 1 to 12° C./min, more preferably 2 to 10° C./min, and still more preferably 3 to 10° C./min.

In addition, the temperature elevation rate may be appropriately changed during heating.

The heating means in the post-exposure heating step is not particularly limited, and a known hot plate, oven, infrared heater, or the like can be used.

In addition, it is also preferable to carry out the heating in an atmosphere having a low oxygen concentration by allowing an inert gas such as nitrogen, helium, argon, or the like to flow.

<<Development Step>>

The manufacturing method for a cured substance according to the embodiment of the present invention may include a development step of developing the film exposed by the exposure step using a developer to form a patterned film.

In a case of carrying out the development, one of the exposed portion and the non-exposed portion of the film is removed, and a patterned film is formed.

Here, the development in which the non-exposed portion of the film is removed by the development step is referred to as negative tone development, and the development in which the exposed portion of the film is removed by the development step is referred to as positive tone development.

In the present invention, the development in the development step is preferably negative tone development.

[Developer]

In the present invention, the developer is a liquid that is used for forming an image by removing a non-exposed portion or an exposed portion.

Examples of the developer that is used in the development step include a developer containing an organic solvent.

Suitable examples of the developer include esters such as ethyl acetate, n-butyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, δ-valerolactone, an alkyl alkyloxyacetate (example: a methyl alkyloxyacetate, an ethyl alkyloxyacetate, and a butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (example: a methyl 3-alkyloxypropionate and an ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (example: a methyl 2-alkyloxypropionate, an ethyl 2-alkyloxypropionate, and a propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), a methyl 2-alkyloxy-2-methylpropionate and an ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether (PGME), propylene glycol monomethyl ether acetate (PGMEA), propylene glycol monoethyl ether acetate, and propylene glycol monopropyl ether acetate; ketones such as methyl ethyl ketone, cyclohexanone, cyclopentanone, 2-heptanone, 3-heptanone, and N-methyl-2-pyrrolidone; cyclic hydrocarbons, for example, aromatic hydrocarbons such as toluene, xylene, and anisole, and cyclic terpenes such as limonene; sulfoxides such as dimethyl sulfoxide; and alcohols such as methanol, ethanol, propanol, isopropanol, butanol, pentanol, octanol, diethylene glycol, propylene glycol, methylisobutyl carbinol, and triethylene glycol; and amides such as N-methylpyrrolidone, N-ethylpyrrolidone, and dimethylformamide.

In addition, in a case where the developer contains a basic compound as described later and the basic compound (for example, an organic base) is a liquid in an environment in which the developer is used, the basic compound described later can be used as the solvent and as the basic compound.

As the solvent of the developer, one kind of solvent or a mixture of two or more kinds thereof can be used. In the present invention, in particular, a developer containing at least one selected from the group consisting of cyclopentanone, γ-butyrolactone, dimethyl sulfoxide, N-methyl-2-pyrrolidone, and cyclohexanone is preferable, a developer containing at least one selected from the group consisting of cyclopentanone, γ-butyrolactone, and dimethyl sulfoxide is more preferable, and a developer containing cyclopentanone is most preferable.

In addition, as described later, by supplying two or more kinds of these developers to the film, two or more kinds of developers may be mixedly used on the film.

The content of the solvent with respect to the total mass of the developer is preferably 50% by mass or more, more preferably 70% by mass or more, still more preferably 80% by mass or more, and particularly preferably 90% by mass or more. In addition, the above content may be 100% by mass.

—Basic Compound and Base Generator—

In the aspect A, the developer may contain at least one compound selected from the group consisting of a basic compound having an amide group, another basic compound, a base generator having an amide group, and another base generator.

Preferred aspects of the basic compound having an amide group, the other basic compound, the base generator having an amide group, and the other base generator are respectively the same as the preferred aspects of these components contained in the above-described treatment liquid.

As a developer, the treatment liquid in the above-described treatment step may be used.

In addition, at the time of the development, the development may be carried out by simultaneously supplying, to the film, the treatment liquid in the above-described treatment step and a developer that does not correspond to the above-described treatment liquid.

In addition, an aspect in which the developer contains neither the basic compound nor the base generator is also one of the preferred aspects of the present invention in order to suppress the swelling of the pattern due to a basic compound during development. According to the above aspect, the variation of the pattern shape may be suppressed.

The developer may further contain another component. Examples of the other component include a known surfactant and a known antifoaming agent.

[Supply Method for Developer]

The supply method for a developer is not particularly limited as long as a desired pattern can be formed, and it includes a method of immersing a base material on which a film has been formed in a developer, puddle development of supplying a developer to a film formed on a base material using a nozzle, and a method of continuously supplying a developer. The kind of nozzle is not particularly limited, and examples thereof include a straight nozzle, a shower nozzle, and a spray nozzle.

With respect to a thin film, a method of supplying a developer with a straight nozzle or a method of continuously supplying a developer with a spray nozzle is preferable from the viewpoint of the permeability of the developer, the removability of the non-image area, and the manufacturing efficiency, and a method of supplying a developer with a spray nozzle is more preferable from the viewpoint of the permeability of the developer into the image area.

In addition, after the continuous supply by a straight nozzle, the base material is spun to remove the developer from the base material, and then the developer is continuously supplied by the straight nozzle again after the spin drying, a step of spinning the base material to remove the developer from the base material may be adopted, and this step may be repeated a plurality of times.

In addition, in the supply method for a developer in the development step, a step of continuously supplying a developer to a base material, a step of keeping a developer in a substantially stationary state on a base material, a step of vibrating a developer on a base material by ultrasonic waves or the like, and a step obtained by combining these steps can be adopted.

Here, in the development, a plurality of kinds of developers may be simultaneously supplied to the film to carry out the development.

Examples of such an aspect include an aspect in which development is carried out by simultaneously supplying, to a film, two or more kinds of developers not corresponding to the above-described treatment liquid (a development aspect 1), an aspect in which development is carried out by simultaneously supplying, to a film, one or more kinds of developers corresponding to the above-described treatment liquid and one or more kinds of developers not corresponding to the above-described treatment liquid (a development aspect 2), and an aspect in which development is carried out by simultaneously supplying, to a film, two or more kinds of developers corresponding to the above-described treatment liquid (a development aspect 3).

The preferred aspect in the development aspect 1 is, for example, preferably a combination of ketones and ethers, and more preferably a combination of cyclopentanone and PGMEA.

In addition, a combination of one or more kinds of solvents having a ClogP value of 0.35 or less and one or more kinds of solvents having a ClogP value of 0.55 or more is also preferably mentioned.

The ClogP value can be calculated using ChemDraw 20.1.1.

In the development aspect 1, it is possible to simultaneously supply the plurality of kinds of developers to the film for example, by a method in which a device equipped with a plurality of supply means for supplying developers, such as nozzles, is used to supply cyclopentanone from one supply means and to supply PGMEA from another supply means.

The above-described supply method is the same for the development aspects 2 and 3.

The ratio between the using amounts of these developers is not particularly limited and may be determined, for example, in consideration of the components contained in the film, the development speed, and the shape of the pattern to be obtained.

In the development aspect 2, it is also preferable that the above-described developer corresponding to the treatment liquid and the above-described developer not corresponding to the treatment liquid contain solvents different from each other.

According to such an aspect, for example, in a case of using a developer having more excellent developability than the treatment liquid in combination with the treatment liquid, it may be possible to improve the development speed, the pattern shape after development, or the like as compared with a case where only the treatment liquid is used as the developer.

As an example of such an aspect, it is preferable that the developer corresponding to the treatment liquid contains at least one solvent selected from the group consisting of ethers and esters, and the developer not corresponding to the treatment liquid contains at least one solvent selected from the group consisting of ketones, and it is more preferable that the developer corresponding to the treatment liquid contains at least one solvent selected from the group consisting of PGMEA, butyl acetate, and γ-butyrolactone, and the developer not corresponding to the treatment liquid contains cyclopentanone.

In addition, in the development aspect 2, it is also preferable that the above-described developer corresponding to the treatment liquid and the above-described developer not corresponding to the treatment liquid contain the same solvent.

According to such an aspect, it is conceived that the basic compound having an amide group, the base generator having an amide group, and the like, which are contained in the treatment liquid, dissolve easily or diffuse easily.

The ratio of the using amount between the developer corresponding to the treatment liquid and the developer not corresponding to the treatment liquid in the development aspect 2 is not particularly limited and may be determined, for example, in consideration of the components contained in the film, the development speed, and the shape of the pattern to be obtained.

In the development aspect 3, the solvents contained in the developers corresponding to the respective treatment liquids may be the same or different from each other.

In addition, the basic compound having an amide group, the base generator having an amide group, the basic compound, and the like, which are contained in the developer corresponding to the treatment liquid, may be the same or different from each other.

The development time is preferably 10 seconds to 10 minutes and more preferably 20 seconds to 5 minutes. The temperature of the developer at the time of the development is not particularly specified; however, rinsing can be preferably carried out at 10° C. to 45° C. and more preferably 18° C. to 30° C.

In the treatment step, it is also preferable that the treatment liquid is a rinsing liquid.

The rinsing liquid is a liquid that is used for cleaning a film, and it is a liquid used for, for example, cleaning a patterned film after exposure or development.

In addition, it is preferable that the treatment step is a rinsing step of cleaning the film with the treatment liquid.

The rinsing step is preferably a rinsing step of cleaning the patterned film after the exposure step and the development step, with the treatment liquid.

Specifically, in a case of supplying a treatment liquid onto the patterned film after the development step, according to the above-described supply method for a treatment liquid, the patterned film can be cleaned with the treatment liquid.

In addition, it is also preferable that the manufacturing method for a cured substance according to the embodiment of the present invention includes, between the film forming step and the treatment step, an exposure step of selectively exposing the film, where the treatment step is a step of developing the film to form a patterned film by using the treatment liquid as a developer. Hereinafter, an aspect in which the film forming step, the exposure step, and the development step of developing the film to form a patterned film by using the treatment liquid as a developer is also described as an aspect B.

The exposure step in the aspect B is the same as the exposure step in the aspect A, and the same applies to the preferred aspect thereof.

The development step in the aspect B is the same as the development step in the aspect A except that the treatment liquid is used as a developer, and the same applies to the preferred aspect thereof. Further, in the aspect B, it is also preferable to supply two or more kinds of developers to the film as in the development aspect 2 or the development aspect 3 described above.

In the aspect B, it is also preferable to include, after the treatment step (the development step), a second treatment step of bringing a second treatment liquid into contact with the patterned film, where the second treatment liquid contains at least one compound selected from the group consisting of a basic compound having an amide group and a base generator having an amide group.

A preferred aspect of the composition and supply method of the second treatment liquid is the same as the preferred aspect of the composition and supply method of the treatment liquid.

In addition, it is also preferable that the second treatment liquid is a rinsing liquid.

In addition, it is preferable that the second treatment step is a rinsing step of cleaning the patterned film with the treatment liquid.

<Heating Step>

The manufacturing method for a cured substance according to the embodiment of the present invention includes a heating step of heating the film.

In addition, the manufacturing method for a cured substance according to the embodiment of the present invention may include a pattern obtained by another method without carrying out the development step, or a heating step of heating a film obtained by the film forming step.

In the heating step, the resin such as the polyimide precursor is cyclized to become a resin such as polyimide.

In addition, the crosslinking of unreacted crosslinkable groups in the specific resin or a polymerizable compound other than the specific resin also proceeds.

The heating temperature (the maximum heating temperature) in the heating step is preferably 50° C. to 450° C., more preferably 120° C. to 230° C., and still more preferably 150° C. to 230° C. In order to suppress the warping of a wafer or panel, it is preferable to heat the wafer at a low temperature. In this case, the heating temperature (the maximum heating temperature) is preferably 150° C. to 200° C., more preferably 150° C. to 190° C., and still more preferably 150° C. to 180° C.

The heating step is preferably a step of accelerating, by heating, the cyclization of the precursor of the cyclization resin in the film under the action of at least one basic compound selected from the group consisting of the basic compound having an amide group and a basic compound generated from the base generator having an amide group (that is, the basic compound or a basic compound generated from the base generator, which is contained in at least one of the developer or the treatment liquid), and it is more preferably a step of accelerating the imidization of the polyimide precursor in the film.

The heating in the heating step is preferably carried out at a temperature elevation rate of 1 to 12° C./min from the temperature at the start of heating to the maximum heating temperature. The temperature elevation rate is more preferably 2 to 10° C./min and still more preferably 3 to 10° C./min. In a case where the above temperature elevation rate is set to 1° C./min or higher, the excessive volatilization of the acid or solvent can be prevented while securing productivity, and in a case where the above temperature elevation rate is to 12° C./min or lower, the residual stress of the cured substance can be relaxed.

In addition, in a case of an oven that enables rapid heating, the heating is preferably carried out at a temperature elevation rate of 1 to 8° C./sec from the temperature at the start of heating to the maximum heating temperature, more preferably 2 to 7° C./sec, and still more preferably 3 to 6° C./sec.

The temperature at the start of heating is preferably 20° C. to 150° C., more preferably 20° C. to 130° C., and still more preferably 25° C. to 120° C. The temperature at the start of heating refers to a temperature at which the step of heating to the maximum heating temperature is started. For example, in a case where the resin composition is applied on a base material and then dried, the temperature at the start of heating is the temperature of the film (the layer) after drying, and for example, it is preferable to raise the temperature from a temperature lower by 30° C. to 200° C. than the boiling point of the solvent contained in the resin composition.

The heating time (the heating time at the maximum heating temperature) is preferably 5 to 360 minutes, more preferably 10 to 300 minutes, and still more preferably 15 to 240 minutes.

In particular, in a case of forming a multilayered laminate, the heating temperature is preferably 30° C. or higher, more preferably 80° C. or higher, still more preferably 100° C. or higher, and particularly preferably 120° C. or higher, from the viewpoint of adhesiveness between layers. The upper limit the heating temperature is preferably 350° C. or lower, more preferably 250° C. or lower, still more preferably 240° C. or lower, and particularly preferably 230° C. or lower, and it can be set to 200° C. or lower or can be set to 180° C. or lower.

The heating may be carried out stepwise. For example, a step in which the temperature is raised from 25° C. to 120° C. at 3° C./min, held at 120° C. for 60 minutes, raised from 120° C. to 180° C. at 2° C./min, and held at 180° C. for 120 minutes, may be carried out. In addition, it is also preferable to carry out the treatment while irradiating with ultraviolet rays as described in U.S. Pat. No. 9,159,547B. By such a pretreatment step, it is possible to improve the properties of the film. The pretreatment step may be carried out for a short time of about 10 seconds to 2 hours and more preferably 15 seconds to 30 minutes. The pretreatment may be carried out in two or more stages, for example, a first stage pretreatment step may be carried out in a range of 100° C. to 150° C., and then a second stage pretreatment step may be carried out in a range of 150° C. to 200° C.

Further, cooling may be carried out after heating, and the cooling rate, in this case, is preferably 1 to 5° C./min.

From the viewpoint of preventing the decomposition of the specific resin, it is preferable that the heating step is carried out in an atmosphere of a low oxygen concentration, for example, by allowing an inert gas such as nitrogen, helium, argon, or the like to flow, or carrying out heating under reduced pressure. The oxygen concentration is preferably 50 ppm (volume ratio) or lower, and more preferably 20 ppm (volume ratio) or lower.

The heating means in the heating step is not particularly limited; however, examples thereof include a hot plate, an infrared furnace, an electric heating oven, a hot air oven, and an infrared oven.

<Post-Development Exposure Step>

In addition to the heating step, the film after the treatment step may be subjected to a post-development exposure step of exposing the pattern after the development step.

That is, the manufacturing method for a cured substance according to the embodiment of the present invention may include a post-development exposure step of exposing the film after the treatment step.

In the post-development exposure step, it is possible to accelerate, for example, a reaction in which the cyclization of a polyimide precursor or the like proceeds by photosensitization of a photobase generator, a reaction in which the elimination of an acid-decomposable group proceeds by photosensitization of a photoacid generator, and the like. In the post-development exposure step, it is sufficient that at least a part of the film after the treatment step is exposed; however, it is preferable that the whole of the film after the treatment step is exposed.

The exposure amount in the post-development exposure step is preferably 50 to 20,000 $mJ/cm^2$ and more preferably 100 to 15,000 $mJ/cm^2$ in terms of conversion of exposure energy at the wavelength at which the photosensitive compound has a sensitivity.

The post-development exposure step can be carried out using, for example, the light source in the above-described exposure step, and it is preferable to use broadband light.

<Metal Layer Forming Step>

The film after the treatment step (preferably, a film after the heating step) may be subjected to a metal layer forming step of forming a metal layer on the pattern.

That is, it is preferable that the manufacturing method for a cured substance according to the embodiment of the present invention includes a metal layer forming step of forming a metal layer on the film (the cured substance) after the treatment step. The film after the treatment step is preferably a film after the heating step.

For the metal layer, existing metal kinds can be used without particular limitations. Examples thereof include copper, aluminum, nickel, vanadium, titanium, chromium, cobalt, gold, tungsten, tin, silver, and an alloy including these metals, preferred examples thereof are copper and aluminum, and a more preferred example thereof is copper.

A forming method for the metal layer is not particularly limited, and the existing method can be applied. For example, the methods disclosed in JP2007-157879A, JP2001-521288A, JP2004-214501A, JP2004-101850A, U.S. Pat. No. 7,888,181B2, and U.S. Pat. No. 9,177,926B2 can be used. For example, photolithography, physical vapor deposition method (PVD), chemical vapor phase growth method (CVD), lift-off, electrolytic plating, electroless plating, etching, printing, and a method obtained by combining these may be conceivable. More specific examples of the method of forming the metal layer include a patterning method obtained by combining sputtering, photolithography, and etching, and a patterning method combining photolithography and electrolytic plating. Examples of the preferred aspect of the plating include electrolytic plating using a copper sulfate plating liquid or a copper cyanide plating liquid.

The thickness of the metal layer at the thickest portion is preferably 0.01 to 50 μm and more preferably 1 to 10 μm.

<Use Application>

As a field to which the manufacturing method for a cured substance according to the embodiment of the present invention or the cured substance according to the embodiment of the present invention can be applied, an insulating film of an electronic device, an interlayer insulating film for a re-distribution layer, a stress buffer film, and the like are mentioned. In addition, a sealing film, a base material (a base film or cover lay of a flexible print substrate, an interlayer insulating film), or an insulating film applicable for mounting as described above, which is patterned by etching is mentioned. For these use applications, for example, Science & Technology Co., Ltd., "High functionality and applied technology of polyimide" April 2008, CMC Technical library "Basics and development of polyimide materials" supervised by Masaaki Kakimoto, published in November 2011, "Latest Polyimide Basics and Applications" edited by Japan Polyimide & Aromatic Polymers Study Group, NTS Inc., August 2010, or the like can be referred to.

In addition, the manufacturing method for a cured substance according to the embodiment of the present invention and the cured substance according to the embodiment of the present invention can also be used for the production of board surfaces such as an offset board surface or a screen board surface, for etching of molded parts, for the production of protective lacquers and dielectric layers in electronics, in particular, microelectronics.

(Laminate and manufacturing method for laminate) A laminate according to the embodiment of the present invention refers to a structure having a plurality of layers consisting of the cured substance according to the embodiment of the present invention.

The laminate according to the embodiment of the present invention is a laminate including two or more layers consisting of a cured substance, and it may be a laminate in which three or more layers are laminated.

At least one of the two or more layers consisting of a cured substance which are included in the laminate is a layer consisting of the cured substance according to the embodiment of the present invention, and from the viewpoint of suppressing the shrinkage of the cured substance or the deformation of the cured substance due to the shrinkage, it is also preferable that all the layers consisting of a cured substance which are included in the laminate are layers consisting of the cured substance according to the embodiment of the present invention.

That is, it is preferable that the manufacturing method for a laminate according to the embodiment of the present invention includes the manufacturing method for a cured substance according to the embodiment of the present invention, and it is more preferable to include repeating, a plurality of times, the manufacturing method for a cured substance according to the embodiment of the present invention.

In the laminate according to the embodiment of the present invention, an aspect in which two or more layers of layers consisting of a cured substance are included and a metal layer is provided between any layers consisting of the cured substance is preferable. The metal layer is preferably formed in the metal layer forming step.

That is, it is preferable that the manufacturing method for a laminate according to the present invention further includes a metal layer forming step of forming a metal layer on a layer consisting of the cured substance, between the manufacturing methods for a cured substance which are carried out a plurality of times. The preferred aspect of the metal layer forming step is as described above.

Examples of the preferred laminate include a laminate including at least a layer structure in which three layers of a layer consisting of a first cured substance, a metal layer, and a layer consisting of a second cured substance are laminated in order.

It is preferable that both the layer consisting of the first cured substance and the layer consisting of the second cured substance are layers consisting of the cured substance according to the embodiment of the present invention. The resin composition which is used for forming a layer consisting of the first cured substance and the resin composition which is used for forming a layer consisting of the second cured substance may have the same composition or may have compositions different from each other. The metal layer in the laminate according to the embodiment of the present invention is preferably used as the metal wire of the re-distribution layer or the like.

<Laminating Step>

The manufacturing method for a laminate according to the embodiment of the present invention preferably further includes a laminating step.

The laminating step is a series of steps including carrying out again the following steps in the following order on the surface of the pattern (the resin layer) or the metal layer; (a) a film forming step (a layer forming step), (b) an exposure step, (c) a development step, (d) a treatment step, and (e) a heating step. However, the aspect thereof may be such that (a) the film forming step, (d) the treatment step, and (e) the heating step are repeated. In addition, (f) a metal layer forming step may be provided after (e) the heating step. It is needless to say that the laminating step may further include appropriately the above-described drying step.

In a case where another laminating step is further carried out after the laminating step, a surface activation treatment step may be further carried out after the exposure step, the heating step, or the metal layer forming step. Examples of the surface activation treatment include plasma treatment. Details of the surface activation treatment will be described later.

The laminating step is preferably carried out 2 to 20 times and more preferably 2 to 9 times.

For example, a configuration having resin layers of 2 or more layers and 20 or less layers, such as a resin layer/a metal layer/a resin layer/a metal layer/a resin layer/a metal layer, is preferable, and a configuration having resin layers of 2 or more layers and 9 or less layers is more preferable.

In the above layers, the compositions, shapes, film thicknesses, and the like may be the same or may be different from each other.

In the present invention, an aspect in which a metal layer is provided, and then furthermore, a cured substance (a resin layer) of the resin composition is formed to cover the metal layer is particularly preferable. Specific examples thereof include an aspect in which (a) the film forming step, (b) the exposure step, (c) the development step, (d) the treatment step, (e) the heating step, (f) the metal layer forming step are repeated in order, an aspect in which (a) the film forming step, (d) the treatment step, (e) the heating step, and (f) the metal layer forming step are repeated in order, and an aspect in which (a) the film forming step, (b) the exposure step, (d) the treatment step, (e) the heating step, and (f) the metal layer forming step are repeated in order.

By alternately carrying out the laminating step of laminating the resin composition layer (the resin layer) of the present and the metal layer forming step, the resin composition layer (the resin layer) according to the embodiment of the present invention and the metal layer can be alternately laminated.

(Surface Activation Treatment Step)

The manufacturing method for a laminate according to the embodiment of the present invention preferably includes a surface activation treatment step of subjecting at least a part of the metal layer or a part of the resin composition layer to a surface activation treatment.

The surface activation treatment step is usually carried out after the metal layer forming step. However, after the development step, the metal layer forming step may be carried out after the resin composition layer is subjected to the surface activation treatment step.

At least a part of the metal layer may be subjected to the surface activation treatment, at least a part of the resin composition layer after the exposure may be subjected to the surface activation treatment, or both at least a part of the metal layer and at least a part of the resin composition layer after the exposure may be subjected to the surface activation treatment. It is preferable to carry out the surface activation treatment on at least a part of the metal layer, and it is preferable to carry out the surface activation treatment on a part or whole of the region of the metal layer having a surface on which the resin composition layer is formed. In a case where a surface of the metal layer is subjected to the surface activation treatment in this manner, it is possible to improve the adhesiveness to the resin composition layer (film) to be provided on the surface thereof.

In addition, it is preferable that the surface activation treatment is carried out on a part or whole of the resin composition layer (the resin layer) after the exposure. In a case where a surface of the resin composition layer is subjected to the surface activation treatment in this manner, it is possible to improve the adhesiveness to a metal layer or a resin layer to be provided on the surface that has been subjected to the surface activation treatment. In particular, in a case where the resin composition layer is cured, such as in a case where negative tone development is carried out, it is less likely to be damaged by the surface treatment, and thus the adhesiveness is likely to be improved.

Specifically, the surface activation treatment is selected from plasma treatment of various raw material gases (oxygen, hydrogen, argon, nitrogen, nitrogen/hydrogen mixed gas, argon/oxygen mixed gas, and the like), corona discharge treatment, etching treatment with $CF_4/O_2$, $NF_3/O_2$, $SF_6$, $NF_3$, or $NF_3/O_2$, surface treatment with an ultraviolet ray (UV) ozone method, immersion treatment in an organic surface treating agent including a compound having at least one of an amino group or a thiol group after immersion in a hydrochloric acid aqueous solution to remove the oxide film, and mechanical roughening treatment using a brush. It is preferably plasma treatment and particularly preferably oxygen plasma treatment using oxygen as the raw material gas. In a case of corona discharge treatment, the energy is preferably 500 to 200,000 $J/m^2$, more preferably 1,000 to 100,000 $J/m^2$, and most preferably 10,000 to 50,000 $J/m^2$.

(Manufacturing Method for Semiconductor Device)

The present invention also discloses a manufacturing method for a semiconductor device, which includes the manufacturing method for a cured substance according to the embodiment of the present invention or the manufacturing method for a laminate according to the embodiment of the present invention. As the specific example of the semiconductor device using the resin composition for forming an interlayer insulating film for a re-distribution layer, the description in paragraphs 0213 to 0218 and the description of FIG. 1 of JP2016-027357A can be referred to, the content of which is incorporated in the present specification.

(Resin Composition)

The resin composition is a resin composition that is used in the manufacturing method for a cured substance according to the embodiment of the present invention, the manufacturing method for a laminate according to the embodiment of the present invention, or the manufacturing method for a semiconductor device according to the embodiment of the present invention will be described.

The resin composition includes a precursor of a cyclization resin.

Hereinafter, details of each component contained in the resin composition will be described.

<Specific Resin>

The resin composition according to the present invention contains a precursor (a specific resin) of a cyclization resin.

The cyclization resin is preferably a resin having an imide ring structure or an oxazole ring structure in the main chain structure.

In the present invention, the main chain indicates the relatively longest bonding chain in the resin molecule.

Examples of the cyclization resin include polyimide, polybenzoxazole, and polyamideimide.

The precursor of the cyclization resin refers to a resin in which the chemical structure changes by an external stimulus, thereby becoming a cyclization resin. It is preferably a resin of which the chemical structure changes by heat, thereby becoming a cyclization resin, and it is more preferably a resin which undergoes a ring closure reaction by heat to form a ring structure, thereby becoming a cyclization resin.

Examples of the precursor of the cyclization resin include a polyimide precursor, a polybenzoxazole precursor, and a polyamideimide precursor.

That is, the resin composition according to the present invention preferably contains, as the specific resin, at least one resin (specific resin) selected from the group consisting of a polyimide precursor, a polybenzoxazole precursor, and a polyamideimide precursor.

The resin composition according to the present invention preferably contains a polyimide precursor as the specific resin.

In addition, the specific resin preferably has a polymerizable group and more preferably contains a radically polymerizable group.

In a case where the specific resin has a radically polymerizable group, the resin composition according to the embodiment of the present invention preferably contains a radical polymerization initiator described later, and it more preferably contains a radical polymerization initiator described later and a radical crosslinking agent described later. Further, a sensitizing agent described later can be contained as necessary. From such a resin composition according to the embodiment of the present invention, for example, a negative tone photosensitive film is formed.

In addition, the specific resin may have a polarity converting group such as an acid-decomposable group.

In a case where the specific resin has an acid-decomposable group, it is preferable that the resin composition according to the present invention contains a photoacid generator described later. From such a resin composition according to the present invention, for example, a positive tone photosensitive film or a negative tone photosensitive film, which is a chemical amplification type photosensitive film, is formed.

[Polyimide Precursor]

The kind or the like of the polyimide precursor that is used in the present invention is not particularly specified; however, it is preferable that the polyimide precursor contains a repeating unit represented by Formula (2).

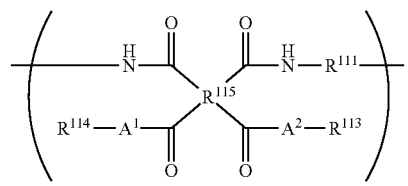

In Formula (2), $A^1$ and $A^2$ each independently represent an oxygen atom or —NH—, $R^{111}$ represents a divalent organic group, $R^{115}$ represents a tetravalent organic group, and $R^{113}$ and $R^{114}$ each independently represent a hydrogen atom or a monovalent organic group.

$A^1$ and $A^2$ in Formula (2) each independently represent an oxygen atom or —NH—, and an oxygen atom is preferable.

$R^{111}$ in Formula (2) represents a divalent organic group. Examples of the divalent organic group include a group having a linear or branched aliphatic group, a cyclic aliphatic group, or an aromatic group. A linear or branched aliphatic group having 2 to 20 carbon atoms, a cyclic aliphatic group having 3 to 20 carbon atoms, an aromatic group having 3 to 20 carbon atoms, or a group consisting of a combination of these groups is preferable, and a group containing an aromatic group having 6 to 20 carbon atoms is more preferable. In the linear or branched aliphatic group, the hydrocarbon group in the chain may be substituted with a group containing a heteroatom, and in the cyclic aliphatic group and the aromatic group, the hydrocarbon group of the ring member may be substituted with a group containing a heteroatom. Examples of the preferred embodiment of the present invention include groups respectively represented by —Ar— and —Ar-L-Ar—, and where a group represented by —Ar-L-Ar— is particularly preferable. However, Ar's are each independently an aromatic group, and L is a single bond, an aliphatic hydrocarbon group having 1 to 10 carbon atoms, which may be substituted with a fluorine atom, —O—, —CO—, —S—, —SO$_2$—, or —NHCO—, or a group consisting of a combination of two or more of the above. The preferred ranges thereof are as described above.

$R^{111}$ is preferably derived from a diamine. Examples of the diamine that is used for producing the polyimide precursor include a linear aliphatic or branched aliphatic diamine, a cyclic aliphatic diamine, or an aromatic diamine. One kind of diamine may be used alone, or two or more kinds thereof may be used.

Specifically, the diamine is preferably a diamine containing a linear or branched aliphatic group having 2 to 20 carbon atoms, a cyclic aliphatic group having 3 to 20 carbon atoms, an aromatic group having 3 to 20 carbon atoms, or a group consisting of a combination thereof, and more preferably a diamine containing an aromatic group having 6 to 20 carbon atoms. In the linear or branched aliphatic group, the hydrocarbon group in the chain may be substituted with a group containing a heteroatom, and in the cyclic aliphatic group and the aromatic group, the hydrocarbon group of the ring member may be substituted with a group containing a heteroatom. Examples of the group containing an aromatic group include the following groups.

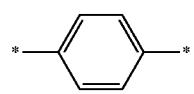

AR-1

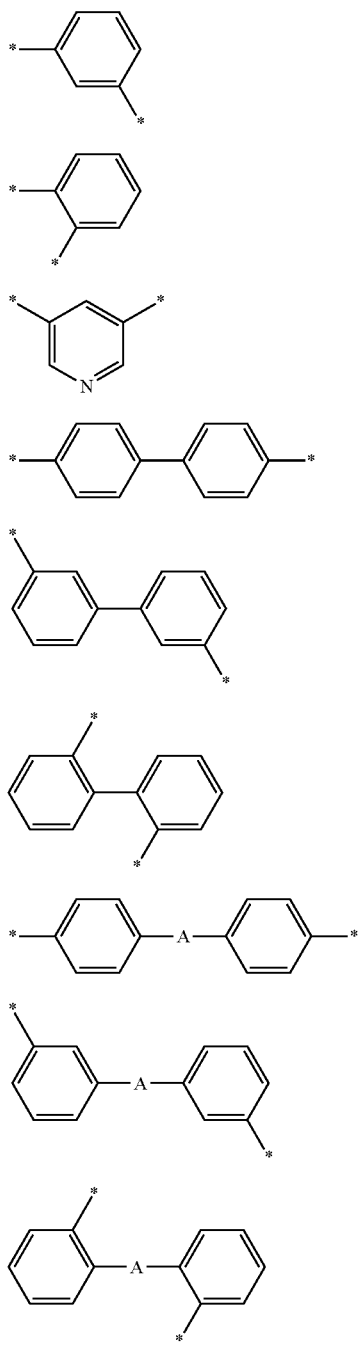

In the formulae, A represents a single bond or a divalent linking group. It is preferably a single bond, or an aliphatic hydrocarbon group having 1 to 10 carbon atoms, which may be substituted with a fluorine atom, —O—, —C(=O)—, —S—, —SO$_2$—, —NHCO—, or a group selected from combinations thereof, more preferably a single bond or a group selected from an alkylene group having 1 to 3 carbon atoms, which may be substituted with a fluorine atom, —O—, —C(=O)—, —S—, or —SO$_2$—, and still more preferably —CH$_2$—, —O—, —S—, —SO$_2$—, —C(CF$_3$)$_2$—, or —C(CH$_3$)$_2$—.

In the formulae, * represents a bonding site to another structure.

Specific examples of the diamine include at least one diamine selected from 1,2-diaminoethane, 1,2-diaminopropane, 1,3-diaminopropane, 1,4-diaminobutane, or 1,6-diaminohexane; 1,2- or 1,3-diaminocyclopentane, 1,2-, 1,3-, or 1,4-diaminocyclohexane, 1,2-, 1,3-, or 1,4-bis(aminomethyl)cyclohexane, bis-(4-aminocyclohexyl)methane, bis-(3-aminocyclohexyl)methane, 4,4'-diamino-3,3'-dimethylcyclohexylmethane, or isophorone diamine; m- or p-phenylene diamine, diaminotoluene, 4,4'- or 3,3'-diaminobiphenyl, 4,4'-diaminodiphenyl ether, 3,3-diaminodiphenyl ether, 4,4'- or 3,3'-diaminodiphenylmethane, 4,4'- or 3,3'-diaminodiphenyl sulfone, 4,4'- or 3,3'-diaminodiphenyl sulfide, 4,4'- or 3,3'-diaminobenzophenone, 3,3'-dimethyl-4,4'-diaminobiphenyl, 2,2'-dimethyl-4,4'-diaminobiphenyl, 3,3'-dimethoxy-4,4'-diaminobiphenyl, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl)hexafluoropropane, bis(3-amino-4-hydroxyphenyl)sulfone, bis(4-amino-3-hydroxyphenyl)sulfone, 4,4'-diaminoparaterphenyl, 4,4-bis(4-aminophenoxy)biphenyl, bis[4-(4-aminophenoxy)phenyl]sulfone, bis[4-(3-aminophenoxy)phenyl]sulfone, bis[4-(2-aminophenoxy)phenyl]sulfone, 1,4-bis(4-aminophenoxy)benzene, 9,10-bis(4-aminophenyl)anthracene, 3,3'-dimethyl-4,4'-diaminodiphenyl sulfone, 1,3-bis(4-aminophenoxy)benzene, 1,3-bis(3-aminophenoxy)benzene, 1,3-bis(4-aminophenyl)benzene, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy)phenyl]hexafluoropropane, 9,9-bis(4-aminophenyl)-10-hydroanthracene, 3,3', 4,4'-tetraaminobiphenyl, 3,3', 4,4'-tetraaminodiphenyl ether, 1,4-diaminoanthraquinone, 1,5-diaminoanthraquinone, 3,3-dihydroxy-4,4'-diaminobiphenyl, 9,9'-bis(4-aminophenyl)fluorene, 4,4'-dimethyl-3,3'-diaminodiphenyl sulfone, 3,3', 5,5'-tetramethyl-4,4'-diaminodiphenylmethane, 2,4- or, 2,5-diaminocumene, 2,5-dimethyl-p-phenylene diamine, acetoguanamine, 2,3,5,6-tetramethyl-p-phenylene diamine, 2,4,6-trimethyl-m-phenylene diamine, bis(3-aminopropyl)tetramethyl disiloxane, bis(p-aminophenyl)octamethylpentasiloxane, 2,7-diaminofluorene, 2,5-diaminopyridine, 1,2-bis(4-aminophenyl)ethane, diaminobenzanilide, esters of diaminobenzoic acid, 1,5-diaminonaphthalene, diaminobenzotrifluoride, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl]hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenyl sulfone, 4,4'-bis(3-amino-5-trifluoromethylphenoxy)diphenyl sulfone, 2,2-bis[4-(4-amino-3-trifluoromethylphenoxy)phenyl]hexafluoropropane, 3,3', 5,5'-tetramethyl-4,4'-diaminobiphenyl, 4,4'-diamino-2,2'-bis(trifluoromethyl)biphenyl, 2,2', 5,5', 6,6'-hexafluorotolidine, or 4,4'-diaminoquaterphenyl.

Further, the diamines (DA-1) to (DA-18) described in paragraphs 0030 to 0031 of WO2017/038598A are also preferable.

Further, the diamine having two or more alkylene glycol units in the main chain, described in paragraphs 0032 to 0034 of WO2017/038598A, is also preferably used.

$R^{111}$ is preferably represented by —Ar-L-Ar— from the viewpoint of the flexibility of the organic film to be obtained. However, Ar's are each independently an aromatic group, and L is an aliphatic hydrocarbon group having 1 to 10 carbon atoms, which may be substituted with a fluorine atom, —O—, —CO—, —S—, —SO$_2$—, or —NHCO—, or a group consisting of a combination of two or more of the above. Ar is preferably a phenylene group, and L is preferably an aliphatic hydrocarbon group having 1 or 2 carbon atoms, which may be substituted with a fluorine atom, —O—, —CO—, —S—, or —SO$_2$—. The aliphatic hydrocarbon group here is preferably an alkylene group.

In addition, from the viewpoint of the i-line transmittance, $R^{111}$ is preferably a divalent organic group represented by Formula (51) or Formula (61) below. In particular, from the viewpoint of the i-line transmittance and ease of availability, a divalent organic group represented by Formula (61) is more preferable.

Formula (51)

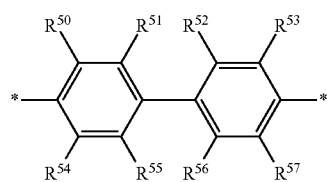

(51)

In Formula (51), $R^{50}$ to $R^{57}$ each independently represent a hydrogen atom, a fluorine atom, or a monovalent organic group, and at least one of $R^{50}$, . . . , or $R^{57}$ represents a fluorine atom, a methyl group, or a trifluoromethyl group, and *'s each independently represent a bonding site to the nitrogen atom in Formula (2).

Examples of the monovalent organic group as $R^{50}$ to $R^{57}$ include an unsubstituted alkyl group having 1 to 10 (preferably 1 to 6 carbon atoms) carbon atoms and a fluorinated alkyl group having 1 to 10 (preferably 1 to 6 carbon atoms) carbon atoms.

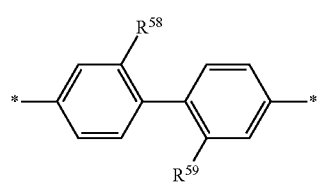

(61)

In Formula (61), $R^{58}$ and $R^{59}$ each independently represent a fluorine atom, a methyl group, or a trifluoromethyl group, and *'s each independently represent a bonding site to the nitrogen atom in Formula (2).

Examples of the diamine that provides a structure of Formula (51) or (61), 2,2'-dimethylbenzidine, 2,2'-bis(trifluoromethyl)-4,4'-diaminobiphenyl, and 2,2'-bis(fluoro)-4,4'-diaminobiphenyl, 4,4'-diaminooctafluorobiphenyl. These may be used alone or in a combination of two or more thereof.

$R^{115}$ in Formula (2) represents a tetravalent organic group. The tetravalent organic group is preferably a tetravalent organic group containing an aromatic ring and more preferably a group represented by Formula (5) or Formula (6).

In Formula (5) or Formula (6), *'s each independently represent a bonding site to another structure.

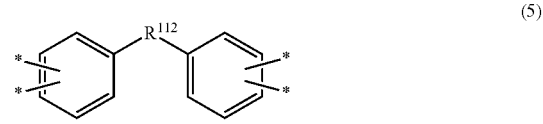

(5)

(6)

In Formula (5), $R^{112}$ is a single bond or a divalent linking group. It is preferably a single bond or a group selected from an aliphatic hydrocarbon group having 1 to 10 carbon atoms, which may be substituted with a fluorine atom, —O—, —CO—, —S—, —SO$_2$—, —NHCO—, or a combination thereof, more preferably a single bond or a group selected from an alkylene group having 1 to 3 carbon atoms, which may be substituted with a fluorine atom, —O—, —CO—, —S—, or —SO$_2$—, and still more preferably a divalent group selected from the group consisting of —CH$_2$—, —C(CF$_3$)$_2$—, —C(CH$_3$)$_2$—, —O—, —CO—, —S—, and —SO$_2$—.

Specific examples of $R^{115}$ include a tetracarboxylic acid residue that remains after the removal of the anhydride group from the tetracarboxylic acid dianhydride. The polyimide precursor may contain only one kind of tetracarboxylic acid dianhydride residue or may contain two or more kinds thereof, as a structure corresponding to $R^{115}$.

The tetracarboxylic acid dianhydride is preferably represented by Formula (O).

(O)

In Formula (O), $R^{115}$ represents a tetravalent organic group. $R^{115}$ has the same meaning as $R^{115}$ in Formula (2), and the same applies to the preferred range thereof.

Specific examples of the tetracarboxylic acid dianhydride include pyromellitic acid dianhydride (PMDA), 3,3', 4,4'-biphenyltetracarboxylic acid dianhydride, 3,3', 4,4'-diphenylsulfide tetracarboxylic acid dianhydride, 3,3', 4,4'-diphenylsulfone tetracarboxylic acid dianhydride, 3,3', 4,4'-benzophenone tetracarboxylic acid dianhydride, 3,3', 4,4'-diphenylmethane tetracarboxylic acid dianhydride, 2,2', 3,3'-diphenylmethane tetracarboxylic acid dianhydride, 2,3,3', 4'-biphenyltetracarboxylic acid dianhydride, 2,3,3', 4'-benzophenone tetracarboxylic acid dianhydride, 4,4'-oxydiphthalic acid dianhydride, 2,3,6,7-naphthalene tetracarboxylic acid dianhydride, 1,4,5,7-naphthalene tetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl) hexafluoropropane dianhydride, 1,3-diphenylhexafluoropropane-3,3,4,4-tetracarboxylic acid dianhydride, 1,4,5,6-naphthalene tetracarboxylic acid dianhydride, 2,2', 3,3'-diphenyl tetracarboxylic acid dianhydride, 3,4,9,10-perylene tetracarboxylic acid dianhydride, 1,2,4,5-naphthalene tetracarboxylic acid dianhydride, 1,4,5,8-naphthalene tetracarboxylic acid dianhydride, 1,8,9,10-phenanthrene tetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzene tetracarboxylic acid dianhydride, and alkyl derivatives having 1 to 6 carbon atoms thereof as well as alkoxy derivatives having 1 to 6 carbon atoms thereof.

In addition, preferred examples thereof include the tetracarboxylic acid dianhydrides (DAA-1) to (DAA-5) described in paragraph 0038 of WO2017/038598A.

In Formula (2), it is also possible that at least one of $R^{111}$ or $R^{115}$ has an OH group. More specifically, examples of $R^{111}$ include a residue of a bisaminophenol derivative.

$R^{113}$ and $R^{114}$ in Formula (2) each independently represent a hydrogen atom or a monovalent organic group. The monovalent organic group preferably includes a linear or branched alkyl group, a cyclic alkyl group, an aromatic group, or a polyalkyleneoxy group. In addition, at least one of $R^{113}$ or $R^{114}$ preferably contains a polymerizable group, and more preferably both of them contain a polymerizable group. It is also preferable that at least one of $R^{11}$ or $R^{114}$ contains two or more polymerizable groups. The polymerizable group is preferably a group capable of undergoing a crosslinking reaction under the action of heat, a radical, or the like, where the group is a radically polymerizable group. Specific examples of the polymerizable group include a group having an ethylenically unsaturated bond, an alkoxymethyl group, a hydroxymethyl group, an acyloxymethyl group, an epoxy group, an oxetanyl group, a benzoxazolyl group, a blocked isocyanate group, and an amino group. The radically polymerizable group contained in the polyimide precursor is preferably a group having an ethylenically unsaturated bond.

Examples of the group having an ethylenically unsaturated bond include a vinyl group, an allyl group, an isoallyl group, a 2-methylallyl group, a group (for example, a vinylphenyl group) having an aromatic ring that is directly bonded to a vinyl group, a (meth)acrylamide group, a (meth)acryloyloxy group, and a group represented by Formula (III), where a group represented by Formula (III) is preferable.

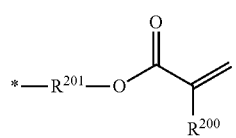

(III)

In Formula (III), $R^{200}$ represents a hydrogen atom, a methyl group, an ethyl group, or a methylol group, where a hydrogen atom or a methyl group is preferable.

In Formula (III), * represents a bonding site to another structure.

In Formula (III), $R^{201}$ represents an alkylene group having 2 to 12 carbon atoms, —CH$_2$CH(OH)CH$_2$—, a cycloalkylene group, or a polyalkyleneoxy group.

Suitable examples of $R^{201}$ include an alkylene group such as an ethylene group, a propylene group, a trimethylene group, a tetramethylene group, a pentamethylene group, a hexamethylene group, an octamethylene group, or a dodecamethylene group, a 1,2-butanediyl group, a 1,3-butanediyl group, —CH$_2$CH(OH)CH$_2$—, and a polyalkyleneoxy group, where an alkylene group such as an ethylene group or a propylene group, —CH$_2$CH(OH)CH$_2$—, a cyclohexyl group, or a polyalkyleneoxy group is more preferable, and an alkylene group such as an ethylene group or a propylene group, or a polyalkyleneoxy group is still more preferable.

In the present invention, the polyalkyleneoxy group refers to a group to which two or more alkyleneoxy groups are directly bonded. The alkylene group in the plurality of alkyleneoxy groups contained in the polyalkyleneoxy group may be the same or different from each other.

In a case where the polyalkyleneoxy group contains a plurality of kinds of alkyleneoxy groups having different alkylene groups, the sequence of the alkyleneoxy groups in the polyalkyleneoxy group may be a random sequence, may be a sequence having a block, or may be a sequence having an alternating pattern or the like.

The number of carbon atoms of the alkylene group (including the number of carbon atoms of the substituent in a case where the alkylene group has a substituent) is preferably 2 or more, more preferably 2 to 10, still more preferably 2 to 6, even still more preferably 2 to 5, even further still more preferably 2 to 4, particularly preferably 2 or 3, and most preferably 2.

In addition, the alkylene group may have a substituent. Examples of the preferred substituent include an alkyl group, an aryl group, and a halogen atom.

In addition, the number of alkyleneoxy groups contained in the polyalkyleneoxy group (the number of repetitions of the polyalkyleneoxy group) is preferably 2 to 20, more preferably 2 to 10, and still more preferably 2 to 6.

The polyalkyleneoxy group is preferably a polyethyleneoxy group, a polypropyleneoxy group, a polytrimethyleneoxy group, a polytetramethyleneoxy group, or a group obtained by bonding a plurality of ethyleneoxy groups with a plurality of propyleneoxy groups, more preferably a polypropyleneoxy group or a polyethyleneoxy group, and still more preferably an polyethyleneoxy group, from the viewpoint of solubility in a solvent and solvent resistance. In the group obtained by bonding a plurality of ethyleneoxy groups with a plurality of propyleneoxy groups, the ethyleneoxy groups and the propyleneoxy groups may be randomly arranged, may be arranged by forming a block, or may be arranged in an alternately patterned manner or the like. The preferred aspect of the number of repetitions of the ethyleneoxy group and the like in these groups is as described above.

In Formula (2), in a case where $R^{113}$ is a hydrogen atom, or in a case where $R^{114}$ is a hydrogen atom, the polyimide precursor may form a conjugate salt together with a tertiary amine compound having an ethylenically unsaturated bond. Examples of the tertiary amine compound having such an ethylenically unsaturated bond include N,N-dimethylaminopropyl methacrylate.

In Formula (2), at least one of $R^{113}$ or $R^{114}$ may be a polarity converting group such as an acid-decomposable group. The acid-decomposable group is not particularly limited as long as it decomposes by the action of the acid to generate an alkali-soluble group such as a phenolic hydroxy group or a carboxy group; however, it is preferably an acetal group, a ketal group, a silyl group, or a silyl ether group, a tertiary alkyl ester group, or the like, and from the viewpoint of exposure sensitivity, it is more preferably an acetal group or a ketal group.

Specific examples of the acid-decomposable group include a tert-butoxycarbonyl group, an isopropoxycarbonyl group, a tetrahydropyranyl group, a tetrahydrofuranyl group, an ethoxyethyl group, a methoxyethyl group, an ethoxymethyl group, a trimethylsilyl group, a tert-butoxycarbonylmethyl group, and a trimethylsilyl ether group. From the viewpoint of exposure sensitivity, an ethoxyethyl group or a tetrahydrofuranyl group is preferable.

In addition, the polyimide precursor preferably has a fluorine atom in the structure thereof. The content of fluorine atoms in the polyimide precursor is preferably 10% by mass or more, and it is preferably 20% by mass or less.

In addition, for the purpose of improving adhesiveness to a substrate, the polyimide precursor may be copolymerized with an aliphatic group having a siloxane structure. Specifically, an aspect in which bis(3-aminopropyl)tetramethyldisiloxane, bis(p-aminophenyl)octamethyl pentasiloxane, or the like is used as the diamine can be mentioned.

The repeating unit represented by Formula (2) is preferably a repeating unit represented by Formula (2-A). That is, at least one polyimide precursor that is used in the present invention is preferably a precursor having a repeating unit represented by Formula (2-A). In a case where the polyimide precursor contains a repeating unit represented by Formula (2-A), it is possible to further widen the width of the exposure latitude.

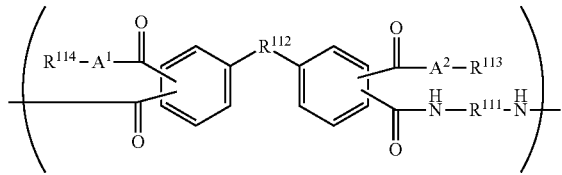

Expression (2-A)

In Formula (2-A), $A^1$ and $A^2$ represent an oxygen atom, $R^{111}$ and $R^{112}$ each independently represent a divalent organic group, $R^{113}$ and $R^{114}$ each independently represent a hydrogen atom or a monovalent organic group, and at least one of $R^{113}$ or $R^{114}$ is a group containing a polymerizable group, where both of them are preferably a group containing a polymerizable group.

$A^1$, $A^2$, $R^{111}$, $R^{113}$, and $R^{114}$ are each independently have the same meaning as $A^1$, $A^2$, $R^{111}$, $R^{113}$, and $R^{114}$ in Formula (2), respectively, and the same applies to the preferred ranges thereof.

$R^{112}$ has the same meaning as $R^{112}$ in Formula (5), and the same applies to the preferred range thereof.

The polyimide precursor may contain one kind of repeating unit represented by Formula (2) or may contain two or more kinds thereof. In addition, the polyimide precursor may contain structural isomers of the repeating unit represented by Formula (2). In addition, it is needless to say that the polyimide precursor may also contain another kind of repeating unit in addition to the above repeating unit represented by Formula (2).

One embodiment of the polyimide precursor in the present invention includes an aspect in which the content of the repeating unit represented by Formula (2) is 50% by mole or more of all the repeating units. The above-described total content is more preferably 70% by mole or more, still more preferably 90% by mole or more, and particularly preferably more than 90% by mole. The upper limit of the total content is not particularly limited, and all the repeating units in the polyimide precursor excluding the terminal may be the repeating unit represented by Formula (2).

The weight-average molecular weight (Mw) of the polyimide precursor is preferably 5,000 to 100,000, more preferably 10,000 to 50,000, and still more preferably 15,000 to 40,000. In addition, the number-average molecular weight (Mn) thereof is preferably 2,000 to 40,000, more preferably 3,000 to 30,000, and still more preferably 4,000 to 20,000.

The dispersivity of the molecular weight of the polyimide precursor is preferably 1.5 or more, more preferably 1.8 or more, and still more preferably 2.0 or more. The upper limit value of the dispersivity of the molecular weight of the polyimide precursor is not particularly limited; however, it is, for example, preferably 7.0 or less, more preferably 6.5 or less, and still more preferably 6.0 or less.

In the present specification, the dispersivity of the molecular weight is a value obtained by calculating "weight-average molecular weight/number-average molecular weight".

In addition, in a case where the resin composition contains a plurality of kinds of polyimide precursors as the specific resin, it is preferable that the weight-average molecular weight, the number-average molecular weight, and the dispersivity of at least one kind of polyimide precursor are in the above ranges. Further, it is also preferable that the weight-average molecular weight, the number-average molecular weight, and the dispersivity, calculated by using the plurality of kinds of polyimide precursors as one resin, are within the above ranges.

[Polybenzoxazole Precursor]

The structure or the like of the polybenzoxazole precursor that is used in the present invention is not particularly determined; however, it preferably includes a repeating unit represented by Formula (3).

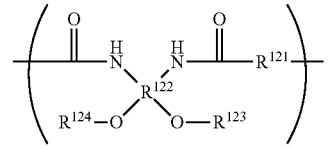

(3)

In Formula (3), $R^{121}$ represents a divalent organic group, $R^{122}$ represents a tetravalent organic group, and $R^{123}$ and $R^{124}$ each independently represent a hydrogen atom or a monovalent organic group.

In Formula (3), $R^{123}$ and $R^{124}$ have the same meanings as $R^{113}$ in Formula (2), and the same applies to the preferred ranges thereof. That is, it is preferable that at least one of them is a polymerizable group.

In Formula (3), $R^{121}$ represents a divalent organic group. The divalent organic group is preferably a group containing at least one of an aliphatic group or an aromatic group. The aliphatic group is preferably a linear aliphatic group. $R^{121}$ is preferably a dicarboxylic acid residue. One kind of dicarboxylic acid residue may be used alone, or two or more kinds thereof may be used.

The dicarboxylic acid residue is preferably a dicarboxylic acid containing an aliphatic group or a dicarboxylic acid residue containing an aromatic group, and more preferably a dicarboxylic acid residue containing an aromatic group.

The dicarboxylic acid containing an aliphatic group is preferably a dicarboxylic acid containing a linear or branched (preferably linear) aliphatic group, and more preferably a dicarboxylic acid consisting of a linear or branched (preferably linear) aliphatic group and two —COOH. The linear or branched (preferably linear) aliphatic group preferably has 2 to 30 carbon atoms, more preferably 2 to 25 carbon atoms, still more preferably 3 to 20 carbon atoms, even still more preferably 4 to 15 carbon atoms, particularly preferably 5 to 10 carbon atoms. The linear aliphatic group is preferably an alkylene group.

Examples of the dicarboxylic acid containing a linear aliphatic group include malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimelliic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and furthermore, dicarboxylic acids represented by the following formulae.

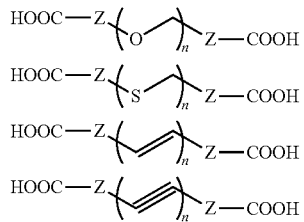

(In the formulae, Z is a hydrocarbon group having 1 to 6 carbon atoms, and n is an integer of 1 to 6).

The dicarboxylic acid containing an aromatic group is preferably a dicarboxylic acid having the following aromatic group and more preferably a dicarboxylic acid consisting of only the following group having an aromatic group and two pieces of —COOH.

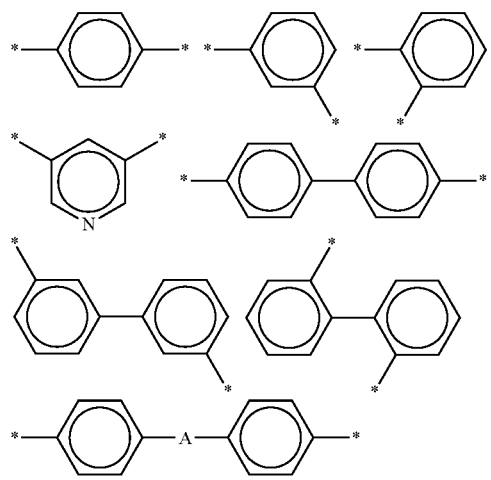

In the formulae, A represents a divalent group selected from the group consisting of —CH$_2$—, —O—, —S—, —SO$_2$—, —CO—, —NHCO—, —C(CF$_3$)$_2$—, and —C(CH$_3$)$_2$—, and *'s each independently represent a bonding site to another structure.

Specific examples of the dicarboxylic acid containing an aromatic group include 4,4'-carbonyldibenzoic acid, 4,4'-dicarboxydiphenyl ether, and terephthalic acid.

In Formula (3), R$^{122}$ represents a tetravalent organic group. The tetravalent organic group has the same meaning as R$^{115}$ in Formula (2) described above, and the same applies to the preferred range thereof.

In addition, R$^{122}$ is preferably a group derived from a bisaminophenol derivative. Examples of the group derived from the bisaminophenol derivative include 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis-(3-amino-4-hydroxyphenyl)methane, 2,2-bis(3-amino-4-hydroxyphenyl)propane, 2,2-bis-(3-amino-4-hydroxyphenyl)hexafluoropropane, 2,2-bis-(4-amino-3-hydroxyphenyl)hexafluoropropane, bis-(4-amino-3-hydroxyphenyl)methane, 2,2-bis-(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, and 1,3-diamino-4,6-dihydroxybenzene. These bisaminophenols may be used alone or may be mixedly used.

Among the bisaminophenol derivatives, the bisaminophenol derivative having the following aromatic group is preferable.

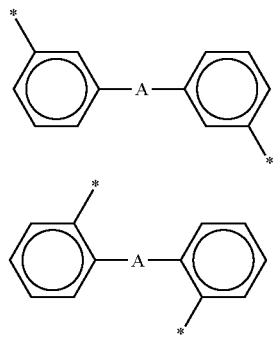

-continued

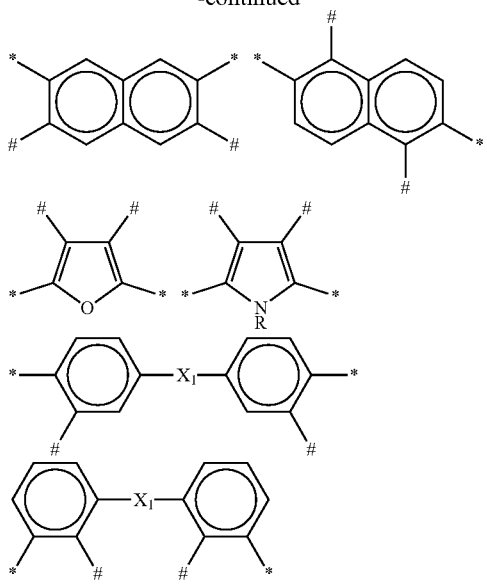

In the formulae, $X_1$ represents —O—, —S—, —C(CF$_3$)$_2$—, —CH$_2$—, —SO$_2$—, or —NHCO—, and * and #each represent a bonding site to another structure. R represents a hydrogen atom or a monovalent substituent, where a hydrogen atom or a hydrocarbon group is preferable, and a hydrogen atom or an alkyl group is more preferable. In addition, it is also preferable that $R^{122}$ has a structure represented by the above formula. In a case where $R^{122}$ has a structure represented by the above formula, it is preferable that any two of a total of four of *'s and #'s are bonding sites to the nitrogen atom to which $R^{122}$ in Formula (3) is bonded and the other two are bonding sites to the oxygen atom to which $R^{122}$ Formula (3) is bonded, it is more preferable that two *'s are bonding sites to the oxygen atom to which $R^{122}$ in Formula (3) is bonded and two #'s are bonding sites to the nitrogen atom to which $R^{122}$ Formula (3) is bonded or that two *'s are bonding sites to the nitrogen atom to which $R^{122}$ in Formula (3) is bonded and two #'s are bonding sites to the oxygen atom to which $R^{122}$ Formula (3) is bonded, and it is still more preferable that two *'s are bonding sites to the oxygen atom to which $R^{122}$ in Formula (3) is bonded and two #'s are bonding sites to the nitrogen atom to which $R^{122}$ Formula (3) is bonded.

The bisaminophenol derivative is also preferably a compound represented by Formula (A-s).

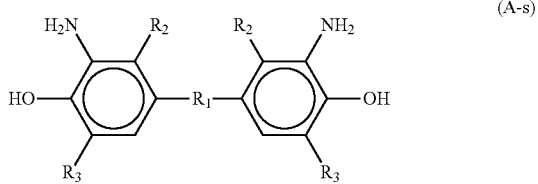

In Formula (A-s), $R_1$ is a hydrogen atom, an alkylene, a substituted alkylene, —O—, —S—, —SO$_2$—, —CO—, —NHCO—, a single bond, or an organic group selected from the group of Formula (A-sc). $R_2$'s are each any one of a hydrogen atom, an alkyl group, an alkoxy group, an acyloxy group, or a cyclic alkyl group, and may be the same or different from each other. $R_3$'s are each any one of a hydrogen atom, a linear or branched alkyl group, an alkoxy group, an acyloxy group, or a cyclic alkyl group, and may be the same or different from each other.

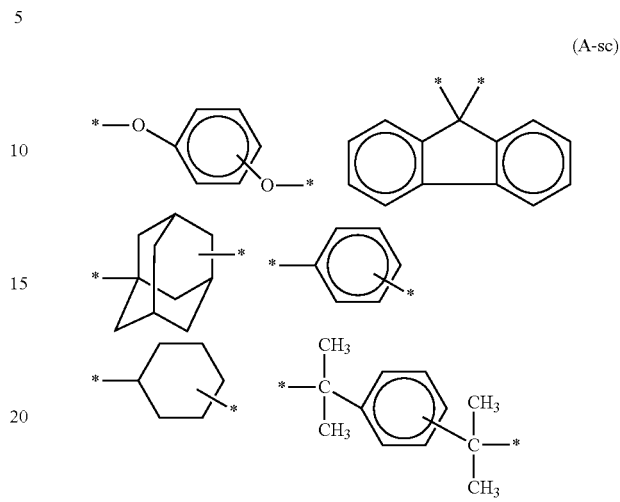

(In Formula (A-sc), * indicates bonding to the aromatic ring of the aminophenol group of the bisaminophenol derivative represented by Formula (A-s).)

In Formula (A-s), it is conceived that in a case where a substituent is also provided at the ortho position of the phenolic hydroxy group, that is, $R_3$, the distance between the carbonyl carbon of the amide bond and the hydroxy group becomes closer, and such a case is particularly preferable since the effect that the cyclization rate becomes high in a case where curing is carried out at a low temperature is further enhanced.

In addition, in Formula (A-s), in a case where $R_2$ is an alkyl group and $R_3$ is an alkyl group, it is possible to maintain the high transparency to the i-line and the effect that the cyclization rate is high in a case where curing is carried out at a low temperature, which is preferable.

In addition, in Formula (A-s), it is more preferable that $R_1$ is an alkylene or a substituted alkylene. Specific examples of the alkylene and the substituted alkylene, which is involved in $R_1$ include linear or branched alkyl groups having 1 to 8 carbon atoms. However, among them, —CH$_2$—, —CH(CH$_3$)—, or —C(CH$_3$)$_2$— is more preferable since it is possible to obtain a polybenzoxazole precursor excellent in balance in terms of having sufficient solubility in a solvent while maintaining the high transparency to the i-line and the effect that the cyclization rate is high in a case where curing is carried out at a low temperature.

As a method of producing the bisaminophenol derivative represented by Formula (A-s), for example, paragraph Nos. 0085 to 0094 and Example 1 (paragraph Nos. 0189 to 0190) of JP2013-256506A can be referenced, the content of which is incorporated in the present specification by reference.

Specific examples of the structure of the bisaminophenol derivative represented by Formula (A-s) include those described in paragraph Nos. 0070 to 0080 of JP2013-256506A, the content of which is incorporated in the present specification. Needless to say, it is not limited to these.

The polybenzoxazole precursor may contain another kind of repeating unit in addition to the repeating unit of Formula (3).

From the viewpoint that the occurrence of warping associated with ring closure can be suppressed, the polybenzoxazole precursor preferably contains a diamine residue represented by Formula (SL) as another kind of repeating unit.

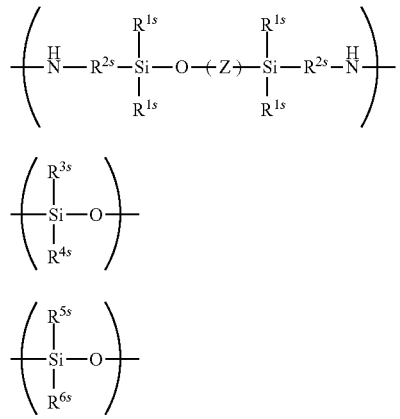

(SL)

a b

In Formula (SL), Z has a structure and a b structure, $R^{1s}$ is a hydrogen atom or a hydrocarbon group having 1 to 10 carbon atoms, $R^{2s}$ is a hydrocarbon group having 1 to 10 carbon atoms, and at least one of $R^{3s}$, $R^{4s}$, $R^{5s}$, or $R^{6s}$ is an aromatic group, where the rest are a hydrogen atom or an organic group having 1 to 30 carbon atoms and may be the same or different from each other. The polymerization of the a structure and the b structure may be block polymerization or random polymerization. Regarding the contents of the structures in the Z portion in terms of "% by mole", the content of the a structure is 5% to 95% by mole and the content of the b structure is 95% to 5% by mole, the sum (the content of the a structure+the content of the b structure) is 100% by mole.

In Formula (SL), examples of the preferred Z include one in which RSs and $R^{6s}$ in the b structure are a phenyl group. In addition, the molecular weight of the a structure represented by Formula (SL) is preferably 400 to 4,000 and more preferably 500 to 3,000. In a case where the molecular weight is set within the above-described range, it is possible to more effectively decrease a modulus of elasticity of a polybenzoxazole precursor after the dehydration ring closure and to achieve both effects of suppressing warping and improving solubility in a solvent.

In a case where a diamine residue represented by Formula (SL) is contained as another kind of repeating unit, it is also preferable that a tetracarboxylic acid residue that has remained after removing an anhydride group from the tetracarboxylic acid dianhydride is further contained as a repeating unit. Examples of such a tetracarboxylic acid residue include the examples of $R^{115}$ in Formula (2).

The weight-average molecular weight (Mw) of the polybenzoxazole precursor is preferably 18,000 to 30,000, more preferably 20,000 to 29,000, and still more preferably 22,000 to 28,000. In addition, the number-average molecular weight (Mn) thereof is preferably 7,200 to 14,000, more preferably 8,000 to 12,000, and still more preferably 9,200 to 11,200.

The dispersivity of the molecular weight of the polybenzoxazole precursor is preferably 1.4 or more, more preferably 1.5 or more, and still more preferably 1.6 or more. The upper limit value of the dispersivity of the molecular weight of the polybenzoxazole precursor is not particularly determined; however, it is, for example, preferably 2.6 or less, more preferably 2.5 or less, still more preferably 2.4 or less, even still more preferably 2.3 or less, and even further still more preferably 2.2 or less.

In addition, in a case where the resin composition contains a plurality of kinds of polybenzoxazole precursors as the specific resin, it is preferable that the weight-average molecular weight, the number-average molecular weight, and the dispersivity of at least one kind of polybenzoxazole precursor are in the above ranges. Further, it is also preferable that the weight-average molecular weight, the number-average molecular weight, and the dispersivity, calculated by using the plurality of kinds of polybenzoxazole precursors as one resin, are within the above ranges.

[Polyamideimide Precursor]

The polyamideimide precursor preferably contains a repeating unit represented by Formula (PAI-2).

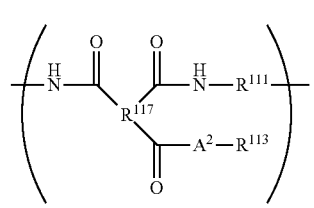

(PAI-2)

In Formula (PAI-2), $R^{117}$ represents a trivalent organic group, $R^{111}$ represents a divalent organic group, $A^2$ represents an oxygen atom or —NH—, and $R^{113}$ represents a hydrogen atom or a monovalent organic group.

In Formula (PAI-2), examples of $R^{117}$ include a linear or branched aliphatic group, a cyclic aliphatic group, an aromatic group, a heteroaromatic group, and a group obtained by linking two or more of these groups through a single bond or a linking group, where $R^{117}$ is preferably a linear aliphatic group having 2 to 20 carbon atoms, a branched aliphatic group having 3 to 20 carbon atoms, a cyclic aliphatic group having 3 to 20 carbon atoms, an aromatic group having 6 to 20 carbon atoms, or a group obtained by combining two or more of these groups through a single bond or a linking group, and $R^{117}$ is more preferably an aromatic group having 6 to 20 carbon atoms or a group obtained by combining two or more aromatic groups having 6 to 20 carbon atoms through a single bond or a linking group.

The linking group is preferably —O—, —S—, —C(=O)—, —S(=O)$_2$—, an alkylene group, a halogenated alkylene group, an arylene group, or a linking group obtained by linking two or more these, and it is more preferably —O—, —S—, an alkylene group, a halogenated alkylene group, an arylene group, or a linking group obtained by linking two or more these.

The alkylene group is preferably an alkylene group having 1 to 20 carbon atoms, more preferably an alkylene group having 1 to 10 carbon atoms, and still more preferably an alkylene group having 1 to 4 carbon atoms.

The halogenated alkylene group is preferably a halogenated alkylene group having 1 to 20 carbon atoms, more preferably a halogenated alkylene group having 1 to 10 carbon atoms, and still more preferably a halogenated alkylene group having 1 to 4 carbon atoms. In addition, examples of the halogen atom in the halogenated alkylene group include a fluorine atom, a chlorine atom, a bromine atom, and an iodine atom, where a fluorine atom is preferable. The halogenated alkylene group may have a hydrogen atom, or all hydrogen atoms in the halogenated alkylene group may be substituted with a halogen atom. However, it is preferable that all hydrogen atoms are substituted with a halogen atom. Examples of the preferred halogenated alkylene group include a (ditrifluoromethyl)methylene group.

The arylene group is preferably a phenylene group or a naphthylene group, more preferably a phenylene group, and still more preferably a 1,3-phenylene group or a 1,4-phenylene group.

In addition, $R^{117}$ is preferably derived from a tricarboxylic acid compound in which at least one carboxy group may be subjected to halogenation. Here, the halogenation is preferably chlorination.

In the present invention, a compound having three carboxy groups is referred to as a tricarboxylic acid compound.

Two carboxy groups of the three carboxy groups of the tricarboxylic acid compound may be subjected to acid anhydrization.

Examples of the tricarboxylic acid compound which may be halogenated, which is used in the production of the polyamideimide precursor, include a branched aliphatic, cyclic aliphatic, or aromatic tricarboxylic acid compound.

One kind of these tricarboxylic acid compounds may be used alone, or two or more kinds thereof may be used.

Specifically, the tricarboxylic acid compound is preferably a tricarboxylic acid compound containing a linear aliphatic group having 2 to 20 carbon atoms, a branched aliphatic group having 3 to 20 carbon atoms, a cyclic aliphatic group having 3 to 20 carbon atoms, an aromatic group having 6 to 20 carbon atoms, or a group obtained by combining two or more of these groups through a single bond or a linking group, and more preferably a tricarboxylic acid compound containing an aromatic group having 6 to 20 carbon atoms or a group obtained by combining two or more aromatic groups having 6 to 20 carbon atoms through a single bond or a linking group.

Specific examples of the tricarboxylic acid compound include 1,2,3-propanetricarboxylic acid, 1,3,5-pentanetricarboxylic acid, citric acid, trimellitic acid, 2,3,6-naphthalenetricarboxylic acid, and a compound in which phthalic acid (or phthalic anhydride) and benzoic acid are linked through a single bond, —O—, —CH$_2$—, —C(CH$_3$)$_2$—, —C(CF$_3$)$_2$—, —SO$_2$—, or a phenylene group.

These compounds may be a compound (for example, a trimellitic acid anhydride) in which two carboxy groups have been subjected to acid anhydrization or may be a compound (for example, trimellitic anhydride chloride) in which at least one carboxy group has been halogenated.

In Formula (PAI-2), $R^{111}$, $A^2$, and $R^{113}$ respectively have the same meanings as $R^{111}$, $A^2$, and $R^{113}$ in Formula (2) described above, and the same applies to the preferred aspects thereof.

The polyamideimide precursor may further contain other repeating units.

Examples of the other repeating units include the above-described repeating unit represented by Formula (2) and a repeating unit represented by Formula (PAI-1).

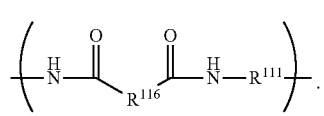
(PAI-1)

In Formula (PAI-1), $R^{116}$ represents a divalent organic group, and $R^{111}$ represents a divalent organic group.

In Formula (PAI-1), examples of $R^{116}$ include a linear or branched aliphatic group, a cyclic aliphatic group, an aromatic group, a heteroaromatic group, and a group obtained by linking two or more of these groups through a single bond or a linking group, where $R^{116}$ is preferably a linear aliphatic group having 2 to 20 carbon atoms, a branched aliphatic group having 3 to 20 carbon atoms, a cyclic aliphatic group having 3 to 20 carbon atoms, an aromatic group having 6 to 20 carbon atoms, or a group obtained by combining two or more of these groups through a single bond or a linking group, and $R^{116}$ is more preferably an aromatic group having 6 to 20 carbon atoms or a group obtained by combining two or more aromatic groups having 6 to 20 carbon atoms through a single bond or a linking group.

The linking group is preferably —O—, —S—, —C(=O)—, —S(=O)$_2$—, an alkylene group, a halogenated alkylene group, an arylene group, or a linking group obtained by linking two or more these, and it is more preferably —O—, —S—, an alkylene group, a halogenated alkylene group, an arylene group, or a linking group obtained by linking two or more these.

The alkylene group is preferably an alkylene group having 1 to 20 carbon atoms, more preferably an alkylene group having 1 to 10 carbon atoms, and still more preferably an alkylene group having 1 to 4 carbon atoms.

The halogenated alkylene group is preferably a halogenated alkylene group having 1 to 20 carbon atoms, more preferably a halogenated alkylene group having 1 to 10 carbon atoms, and still more preferably a halogenated alkylene group having 1 to 4 carbon atoms. In addition, examples of the halogen atom in the halogenated alkylene group include a fluorine atom, a chlorine atom, a bromine atom, and an iodine atom, where a fluorine atom is preferable. The halogenated alkylene group may have a hydrogen atom, or all hydrogen atoms in the halogenated alkylene group may be substituted with a halogen atom. However, it is preferable that all hydrogen atoms are substituted with a halogen atom. Examples of the preferred halogenated alkylene group include a (ditrifluoromethyl)methylene group.

The arylene group is preferably a phenylene group or a naphthylene group, more preferably a phenylene group, and still more preferably a 1,3-phenylene group or a 1,4-phenylene group.

In addition, $R^{116}$ is preferably derived from a dicarboxylic acid compound or a dicarboxylic acid dihalide compound.

In the present invention, a compound having two carboxy groups is referred to as a dicarboxylic acid compound, and a compound having two halogenated carboxy groups is referred to as a dicarboxylic acid dihalide compound.

The carboxy group in the dicarboxylic acid dihalide compound may be halogenated; however, it is, for example, preferably chlorinated. That is, the dicarboxylic acid dihalide compound is preferably a dicarboxylic acid dichloride compound.

Examples of the dicarboxylic acid compound which may be halogenated or the dicarboxylic acid dihalide compound, which is used in the production of the polyamideimide precursor, include a linear or branched aliphatic, cyclic aliphatic, or aromatic dicarboxylic acid compound, and a dicarboxylic acid dihalide compound.

One kind of these dicarboxylic acid compounds or dicarboxylic acid dihalide compounds may be used alone, or two or more kinds thereof may be used.

Specifically, the dicarboxylic acid compound or the dicarboxylic acid dihalide compound is preferably a dicarboxylic acid compound or dicarboxylic acid dihalide compound containing a linear aliphatic group having 2 to 20 carbon atoms, a branched aliphatic group having 3 to 20 carbon atoms, a cyclic aliphatic group having 3 to 20 carbon atoms, an aromatic group having 6 to 20 carbon atoms, or a group obtained by combining two or more of these groups through a single bond or a linking group, and more preferably a dicarboxylic acid compound or dicarboxylic acid dihalide compound containing an aromatic group having 6 to 20 carbon atoms or a group obtained by combining two or more aromatic groups having 6 to 20 carbon atoms through a single bond or a linking group.

In addition, specific example of the dicarboxylic acid compound include malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimelliic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, phthalic acid, isophthalic acid, terephthalic acid, 4,4'-biphenylcarboxylic acid, 4,4'-dicarboxydiphenyl ether, and benzophenone-4,4'-dicarboxylic acid.

Specific examples of the dicarboxylic acid dihalide compound include a compound having a structure in which two carboxy groups in the specific examples of the dicarboxylic acid compound are halogenated.

In Formula (PAI-1), $R^{111}$ has the same meaning as $R^{111}$ in Formula (2) described above, and the same applies to the preferred aspect thereof.

In addition, the polyamideimide precursor preferably has a fluorine atom in the structure thereof. The content of fluorine atoms in the polyamideimide precursor is preferably 10% by mass or more, and it is more preferably 20% by mass or less.

In addition, for the purpose of improving adhesiveness to a substrate, the polyamideimide precursor may be copolymerized with an aliphatic group having a siloxane structure. Specifically, an aspect in which bis(3-aminopropyl)tetramethyldisiloxane, bis(p-aminophenyl)octamethyl pentasiloxane, or the like is used as the diamine component can be mentioned.

One embodiment of the polyamideimide precursor in the present invention includes an aspect in which the total content of the repeating unit represented by Formula (PAI-2), the repeating unit represented by Formula (PAI-1), and the repeating unit represented by Formula (2) is 50% by mole or more of all the repeating units. The above-described total content is more preferably 70% by mole or more, still more preferably 90% by mole or more, and particularly preferably more than 90% by mole. The upper limit of the total content is not particularly limited, and all the repeating units in the polyamideimide precursor excluding the terminal may be any one of the repeating unit represented by Formula (PAI-2), the repeating unit represented by Formula (PAI-1), or the repeating unit represented by Formula (2).

In addition, another embodiment of the polyamideimide precursor in the present invention includes an aspect in which the total content of the repeating unit represented by Formula (PAI-2) and the repeating unit represented by Formula (PAI-1) is 50% by mole or more of all the repeating units. The above-described total content is more preferably 70% by mole or more, still more preferably 90% by mole or more, and particularly preferably more than 90% by mole. The upper limit of the total content is not particularly limited, and all the repeating units in the polyamideimide precursor excluding the terminal may be any one of the repeating unit represented by Formula (PAI-2) or the repeating unit represented by Formula (PAI-1).

The weight-average molecular weight (Mw) of the polyamideimide precursor is preferably 2,000 to 500,000, more preferably 5,000 to 100,000, and still more preferably 10,000 to 50,000. In addition, the number-average molecular weight (Mn) thereof is preferably 800 to 250,000, more preferably 2,000 to 50,000, and still more preferably 4,000 to 25,000.

The dispersivity of the molecular weight of the polyamideimide precursor is preferably 1.5 or more, more preferably 1.8 or more, and still more preferably 2.0 or more. The upper limit value of the dispersivity of the molecular weight of the polyamideimide precursor is not particularly limited; however, it is, for example, preferably 7.0 or less, more preferably 6.5 or less, and still more preferably 6.0 or less. In addition, in a case where the resin composition contains a plurality of kinds of polyamideimide precursors as the specific resin, it is preferable that the weight-average molecular weight, the number-average molecular weight, and the dispersivity of at least one kind of polyamideimide precursor are in the above ranges. Further, it is also preferable that the weight-average molecular weight, the number-average molecular weight, and the dispersivity, calculated by using the plurality of kinds of polyamideimide precursors as one resin, are within the above ranges.

[Production Method for Polyimide Precursor and Like]

The polyimide precursor the like can be obtained, for example, by a method of reacting a tetracarboxylic acid dianhydride with a diamine at a low temperature, a method of reacting a tetracarboxylic acid dianhydride with a diamine at a low temperature to obtain a polyamic acid and subjecting the polyamic acid to esterification by using a condensing agent or an alkylating agent, a method of obtaining a diester with a tetracarboxylic acid dianhydride and alcohol and then reacting the diester with a diamine in the presence of a condensing agent, and a method of obtaining a diester with a tetracarboxylic acid dianhydride and alcohol, subsequently subjecting the rest dicarboxylic acid to acid-halogenation using a halogenating agent, and carrying out reaction with a diamine. Among the above production method, a method of obtaining a diester with a tetracarboxylic acid dianhydride and alcohol, subsequently subjecting the rest dicarboxylic acid to acid-halogenation using a halogenating agent, and carrying out a reaction with a diamine is more preferable.

Examples of the condensing agent include dicyclohexylcarbodiimide, diisopropylcarbodiimide, 1-ethoxycarbonyl-2-ethoxy-1,2-dihydroquinoline, 1,1-carbonyldioxy-di-1,2,3-benzotriazole, N,N'-disuccinimidyl carbonate, and trifluoroacetic anhydride.

Examples of the alkylating agent include N,N-dimethylformamide dimethyl acetal, N,N-dimethylformamide diethyl acetal, N,N-dialkylformamide dialkyl acetal, trimethyl orthoformate, triethyl orthoformate.

Examples of the halogenating agent include thionyl chloride, oxalyl chloride, and phosphorus oxychloride.

In the production method for a polyimide precursor the like, it is preferable to use an organic solvent at the time of the reaction. One kind of organic solvent may be used, or two or more kinds thereof may be used.

The organic solvent can be appropriately determined depending on the raw material; however, examples thereof include pyridine, diethylene glycol dimethyl ether (diglyme), N-methylpyrrolidone, N-ethylpyrrolidone, ethyl propionate, dimethylacetamide, dimethylformamide, tetrahydrofuran, and γ-butyrolactone.

In the production method for a polyimide precursor the like, it is preferable to add a basic compound at the time of the reaction. One kind of basic compound may be used, or two or more kinds thereof may be used.

The basic compound can be appropriately determined depending on the raw material; however, examples thereof include triethylamine, diisopropylethylamine, pyridine, 1,8-diazabicyclo[5.4.0]undec-7-ene, and N,N-dimethyl-4-aminopyridine.

—Terminal Blocking Agent—

In the production method for a polyimide precursor the like, it is preferable to block the carboxylic acid anhydride, the acid anhydride derivative, or the amino group, remaining at the terminal of the resin such as the polyimide precursor, in order to further improve the storage stability. In a case of blocking the carboxylic acid anhydride and the acid anhydride derivative, remaining at the resin terminal, examples of the terminal blocking agent include a monoalcohol, phenol, thiol, thiophenol, and a monoamine. It is more preferable to use a monoalcohol, phenols, or a monoamine from the viewpoint of reactivity and film stability. Examples of the preferred monoalcohol compound include primary alcohol such as methanol, ethanol, propanol, butanol, hexanol, octanol, dodecynol, benzyl alcohol, 2-phenylethanol, 2-methoxyethanol, 2-chloromethanol, and furfuryl alcohol; secondary alcohol such as isopropanol, 2-butanol, cyclohexyl alcohol, cyclopentanol, and 1-methoxy-2-propanol; and tertiary alcohol such as t-butyl alcohol and adamantane alcohol. Examples of the preferred compounds of phenols include phenols such as phenol, methoxyphenol, methylphenol, naphthalene-1-ol, naphthalene-2-ol, and hydroxystyrene. In addition, examples of the preferred monoamine compound include aniline, 2-ethynyl aniline, 3-ethynyl aniline, 4-ethynyl aniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of these may be used, and a plurality of different terminal groups may be introduced by reacting a plurality of terminal blocking agents.

In addition, in a case of blocking the amino group at the terminal of the resin, it is possible to carry out blocking with a compound having a functional group capable of reacting with the amino group. The preferred blocking agent for the amino group is preferably a carboxylic acid anhydride, a carboxylic acid chloride, a carboxylic acid bromide, a sulfonic acid chloride, sulfonic acid anhydride, or a sulfonic acid carboxylic acid anhydride, and more preferably a carboxylic acid anhydride or a carboxylic acid chloride. Examples of the preferred carboxylic acid anhydride compound include acetic anhydride, propionic anhydride, oxalic anhydride, succinic anhydride, maleic acid anhydride, phthalic anhydride, and benzoic anhydride, 5-norbornen-2,3-dicarboxylic acid anhydride. Examples of the preferred carboxylic acid chloride compound include acetyl chloride, acrylic acid chloride, propionyl chloride, methacrylic acid chloride, pivaloyl chloride, cyclohexanecarbonyl chloride, 2-ethylhexanoyl chloride, cinnamoyl chloride, 1-adamantanecarbonyl chloride, heptafluorobutyryl chloride, stearic acid chloride, and benzoyl chloride.

—Solid Precipitation—

A production method for a polyimide precursor or the like may include a step of precipitating a solid may be included. Specifically, it is possible to obtain a polyimide precursor by filtering out a water-absorbing by-product of the dehydration condensing agent that is present together in the reaction solution as necessary, subsequently putting the obtained polymer component in a poor solvent such as water, an aliphatic lower alcohol, or a mixed solution thereof, precipitating the polymer component to be precipitated as a solid, and then carrying out drying. In order to improve the degree of purification, operations such as redissolution, reprecipitation, and drying of the polyimide precursor may be repeated. Further, a step of removing ionic impurities using an ion exchange resin may be included.

[Content]

The content of the specific resin in the resin composition according to the present invention is preferably 20% by mass or more, more preferably 30% by mass or more, still more preferably 40% by mass or more, and even still more preferably 50% by mass or more, with respect to the total solid content of the resin composition. In addition, the content of the resin in the resin composition according to the present invention is preferably 99.5% by mass or less, more preferably 99% by mass or less, still more preferably 98% by mass or less, still more preferably 97% by mass or less, and even still more preferably 95% by mass or less, with respect to the total solid content of the resin composition.

The resin composition according to the present invention may contain only one kind of specific resin or may contain two or more kinds thereof. In a case where two or more kinds thereof are contained, the total amount thereof is preferably within the above range.

In addition, it is also preferable that the resin composition according to the present invention contains at least two kinds of resins.

Specifically, the resin composition according to the present invention may contain in total two or more kinds of the specific resins and other resins described later or may contain two or more kinds of the specific resins; however, it is preferable to include two or more kinds of the specific resins.

In a case where the resin composition according to the present invention contains two or more kinds of the specific resins, it is preferable to contain, for example, two or more kinds of polyimide precursors which are polyimide precursors in which the structure ($R^{115}$ in Formula (2) described above) derived from the dianhydride is different.

<Another Resin>

The resin composition according to the present invention may contain the above-described specific resin and another resin (hereinafter, also simply referred to as "the other resin") that is different from the specific resin.

Examples of the other resin include a phenol resin, polyamide, an epoxy resin, polysiloxane, a resin containing a siloxane structure, a (meth)acrylic resin, a (meth)acrylamide resin, a urethane resin, a butyral resin, a styryl resin, a polyether resin, and a polyester resin.

For example, in a case where a (meth)acrylic resin is further added, it is possible to a resin composition having excellent coatability, and it is possible to obtain a pattern (a cured substance) having excellent solvent resistance.

For example, in a case where a (meth)acrylic resin having a high polymerizable base value and having a weight-average molecular weight of 20,000 or less (for example, a molar amount of a polymerizable group contained in 1 g of a resin is $1\times10^{-3}$ mol/g or more) is added to the resin composition instead of a polymerizable compound described later or in addition to a polymerizable compound described later, it is possible to improve the coatability of the resin composition, the solvent resistance of the pattern (the cured substance).

In a case where the resin composition according to the present invention contains the other resin, the content of the other resin is preferably 0.01% by mass or more, more preferably 0.05% by mass or more, still more preferably 1% by mass or more, even still more preferably 2% by mass or more, even still more preferably 5% by mass or more, and even further still more preferably 10% by mass or more, with respect to the total solid content of the resin composition.

In addition, the content of the other resin in the resin composition according to the present invention is preferably 80% by mass or less, more preferably 75% by mass or less, still more preferably 70% by mass or less, still more preferably 60% by mass or less, and even still more preferably 50% by mass or less, with respect to the total solid content of the resin composition.

In addition, as the preferred aspect of the resin composition according to the present invention, an aspect in which the content of the other resin is a low content can be adopted. In the above aspect, the content of the other resin is preferably 20% by mass or less, more preferably 15% by mass or less, still more preferably 10% by mass or less, still more preferably 5% by mass or less, and even still more preferably 1% by mass or less, with respect to the total solid content of the resin composition. The lower limit of the content is not particularly limited, and it may be 0% by mass or more.

The resin composition according to the present invention may contain only one kind of the other resin or may contain two or more kinds thereof. In a case where two or more kinds thereof are contained, the total amount thereof is preferably within the above range.

<Polymerizable Compound>

The resin composition according to the present invention preferably contains a polymerizable compound.

Examples of the polymerizable compound include a radical crosslinking agent and another crosslinking agent.

[Radical Crosslinking Agent]

The resin composition according to the present invention preferably contains a radical crosslinking agent.

The radical crosslinking agent is a compound having a radically polymerizable group.

The radically polymerizable group is preferably a group containing an ethylenically unsaturated bond. Examples of the group containing the ethylenically unsaturated bond include groups having an ethylenically unsaturated bond, such as a vinyl group, an allyl group, a vinylphenyl group, a (meth)acryloyl group, a maleimide group, and a (meth)acrylamide group.

Among these, the group containing an ethylenically unsaturated bond is preferably a (meth)acryloyl group, a (meth)acrylamide group, or a vinylphenyl group, and more preferably a (meth)acryloyl group from the viewpoint of reactivity.

The radical crosslinking agent is preferably a compound having one or more ethylenically unsaturated bonds; however, a compound having two or more ethylenically unsaturated bonds is more preferable. The radical crosslinking agent may have three or more ethylenically unsaturated bonds.

The compound having 2 or more ethylenically unsaturated bonds is preferably a compound having 2 to 15 ethylenically unsaturated bonds, more preferably a compound having 2 to 10 ethylenically unsaturated bonds, and still more preferably a compound having 2 to 6 ethylenically unsaturated bonds.

In addition, from the viewpoint of the film hardness of the pattern (cured substance) to be obtained, the photocurable resin composition according to the present invention preferably contains a compound having two ethylenically unsaturated bonds and a compound having three or more ethylenically unsaturated bonds.

The molecular weight of the radical crosslinking agent is preferably 2,000 or less, more preferably 1,500 or less, and still more preferably 900 or less. The lower limit of the molecular weight of the radical crosslinking agent is preferably 100 or more.

Specific examples of the radical crosslinking agent include unsaturated carboxylic acids (for example, acrylic acid, methacrylic acid, itaconic acid, crotonic acid, isocrotonic acid, and maleic acid), and esters and amides thereof, and esters formed from unsaturated carboxylic acids and polyhydric alcohol compounds or amides formed from unsaturated carboxylic acids and polyvalent amine compounds are preferable. In addition, addition reaction products produced by reacting unsaturated carboxylic acid esters or amides, having a nucleophilic substituent such as a hydroxy group, an amino group, or a sulfanyl group, with monofunctional or polyfunctional isocyanates or epoxies, dehydration condensation reaction products produced by reacting the above esters or amides with a monofunctional or polyfunctional carboxylic acid, or the like are also suitably used. In addition, an addition reaction product produced by reacting unsaturated carboxylic acid esters or amides, having an electrophilic substituent such as an isocyanate group or an epoxy group, with monofunctional or polyfunctional alcohols, amines, or thiols, and further, a substitution reaction product produced by reacting unsaturated carboxylic acid esters or amides, having an eliminable substituent such as a halogen group or a tosyloxy group, with monofunctional or polyfunctional alcohols, amines, or thiols is also suitable. In addition, as other examples, it is also possible to use a group of compounds in which the unsaturated carboxylic acid described above is replaced with an unsaturated phosphonic acid, a vinylbenzene derivative such as styrene, a vinyl ether, an allyl ether, or the like. Regarding the specific examples thereof, reference can be made to the description of paragraphs 0113 to 0122 of JP2016-027357A, the content of which is incorporated in the present specification.

In addition, the radical crosslinking agent is also preferably a compound having a boiling point of 100° C. or higher under atmospheric pressure. Examples thereof include a compound obtained by adding ethylene oxide or propylene oxide to a polyfunctional alcohol such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol di(meth)acrylate, trimethylolpropane tri(acryloyloxypropyl)ether, tri(acryloyloxyethyl)isocyanurate, glycerin, and trimethylolethane, and then being subjected to (meth)acrylation, urethane (meth)acrylates respectively described in JP1973-041708B (JP-S48-041708B), JP1975-006034B (JP-S50-006034B), and JP1976-037193A (JP-S51-037193A), polyester acrylates respectively described in JP1973-064183A (JP-S48-064183A), JP1974-043191B (JP-S49-043191B), and JP1977-030490B (JP-S52-030490B), polyfunctional acrylates or methacrylates such as epoxy acrylates which are reaction products of epoxy resins and (meth)acrylic acid, and mixtures thereof. In addition, the compounds described in paragraphs 0254 to 0257 of JP2008-292970A are also suitable. Further, the polyfunctional (meth)acrylate or the like obtained by reacting a compound having a cyclic ether group with an ethylenically unsaturated bond, such as glycidyl (meth)acrylate, with polyfunctional carboxylic acid can also be mentioned.

In addition, as the preferred radical crosslinking agent other than those described above, a compound having two or more groups containing a fluorene ring and an ethylenically unsaturated bond and a cardo resin, which are described in JP2010-160418A, JP2010-129825A, and JP4364216B, can also be used.

Further, other examples thereof include the specific unsaturated compounds described in JP1971-043946B (JP-S46-043946B), JP1989-040337B (JP-H01-040337B), and JP1989-040336B (JP-H01-040336B), and the vinylphosphonic acid-based compound described in JP1990-025493A (JP-H02-025493A). In addition, the compounds containing a perfluoroalkyl group described in JP1986-022048A (JP-S61-022048A) can also be used. Furthermore, photopolymerizable monomers and oligomers which are described in Journal of the Adhesion Society of Japan, Vol. 20, No. 7, pages 300 to 308 (1984) can also be used.

In addition to the above, the compounds described in paragraphs 0048 to 0051 of JP2015-034964A and the compounds described in paragraphs 0087 to 0131 of WO2015/199219A can also be preferably used, the contents of which are incorporated in the present specification.

In addition, the compounds which are represented as Formula (1) and Formula (2) in JP1998-062986A (JP-H10-062986A), described together with the specific examples thereof, which are obtained by adding ethylene oxide or propylene oxide to a polyfunctional alcohol and then being subjected to (meth)acrylation can be used as a radical crosslinking agent.

Further, the compounds described in paragraphs 0104 to 0131 of JP2015-187211A can also be used as the radical crosslinking agent, the content of which is incorporated in the present specification.

The radical crosslinking agent is preferably dipentaerythritol triacrylate (as a commercially available product, KAYARAD D-330 (manufactured by Nippon Kayaku Co., Ltd.)), dipentaerythritol tetraacrylate (as a commercially available product, KAYARAD D-320 (manufactured by Nippon Kayaku Co., Ltd.) or A-TMMT (manufactured by Shin-Nakamura Chemical Co., Ltd.)), dipentaerythritol penta(meth)acrylate (as a commercially available product, KAYARAD D-310 (manufactured by Nippon Kayaku Co., Ltd.)), dipentaerythritol hexa(meth)acrylate (as a commercially available product, KAYARAD DPHA (manufactured by Nippon Kayaku Co., Ltd.) or A-DPH (manufactured by Shin-Nakamura Chemical Co., Ltd.)), or a structure in which a (meth)acryloyl group thereof is bonded through an ethylene glycol residue or a propylene glycol residue is preferable. Oligomer types thereof can also be used.

Examples of the commercially available product of the radical crosslinking agent include SR-494 which is a tetrafunctional acrylate having four ethyleneoxy chains, manufactured by Sartomer Company Inc., SR-209, 231, and 239 which are a difunctional methacrylate having four ethyleneoxy chains, manufactured by Sartomer Company Inc., DPCA-60 which is a hexafunctional acrylate having six pentyleneoxy chains, manufactured by Nippon Kayaku Co., Ltd., TPA-330 which is a trifunctional acrylate having three isobutylene oxy chains, a urethane oligomer UAS-10, UAB-140 (manufactured by Nippon Paper Industries Co., Ltd.), NK Ester M-40G, NK Ester 4G, NK Ester M-9300, NK Ester A-9300, UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, AI-600 (manufactured by KYOEISHA CHEMICAL Co., Ltd.), and Brenmer PME400 (manufactured by NOF Corporation).

As the radical crosslinking agent, the urethane acrylates as described in JP1973-041708B (JP-S48-041708B), JP1976-037193A (JP-S51-037193A), JP1990-032293B (JP-H02-032293B), and JP1990-016765B (JP-H02-016765B), and the urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable. Further, as the radical crosslinking agent, the compounds having an amino structure or a sulfide structure in a molecule as described in JP1988-277653A (JP-S63-277653A), JP1988-260909A (JP-S63-260909A), and JP1989-105238A (JP-H01-105238A) can also be used.

The radical crosslinking agent may be a radical crosslinking agent having an acid group such as a carboxy group or a phosphoric acid group. The radical crosslinking agent having an acid group is preferably an ester of an aliphatic polyhydroxy compound and an unsaturated carboxylic acid and more preferably a radical crosslinking agent obtained by reacting an unreacted hydroxy group of an aliphatic polyhydroxy compound with a non-aromatic carboxylic acid anhydride to have an acid group. The radical crosslinking agent is particularly preferably a compound in which an aliphatic polyhydroxy compound is pentaerythritol or dipentaerythritol in a radical crosslinking agent having an acid group obtained by reacting an unreacted hydroxy group of the aliphatic polyhydroxy compound with a non-aromatic carboxylic acid anhydride. Examples of the commercially available product thereof include M-510 and M-520 as polybasic acid-modified acrylic oligomers which are manufactured by Toagosei Co., Ltd.

The acid value of the radical crosslinking agent having an acid group is preferably 0.1 to 300 mgKOH/g, and particularly preferably 1 to 100 mgKOH/g. In a case where the acid value of the radical crosslinking agent is within the above-described range, excellent manufacturing handleability is exhibited, and furthermore, excellent developability is exhibited. In addition, good polymerization properties are exhibited. The acid value is measured according to the description of JIS K 0070: 1992.

In the resin composition, it is preferable to use difunctional methacrylate or acrylate from the viewpoint of pattern resolution and film elasticity.

As the specific compound, the following compound can be used; triethylene glycol diacrylate, triethylene glycol dimethacrylate, tetraethylene glycol dimethacrylate, tetraethylene glycol diacrylate, and polyethylene glycol (PEG) 200 diacrylate, PEG 200 dimethacrylate, PEG 600 diacrylate, PEG 600 dimethacrylate, polytetraethylene glycol diacrylate, polytetraethylene glycol dimethacrylate, neopentyl glycol diacrylate, neopentyl glycol dimethacrylate, 3-methyl-1, 5-pentanediol diacrylate, 1,6-hexanediol diacrylate, 1,6-hexanediol dimethacrylate, dimethylol-tricyclodecanediacrylate, dimethylol-tricyclodecanedimethacrylate, a diacrylate of an ethylene oxide (EO) adduct of bisphenol A, a dimethacrylate of an EO adduct of bisphenol A, a diacrylate of a propylene oxide (PO) adduct of bisphenol A, a dimethacrylate of a PO adduct of bisphenol A, 2-hydroxy-3-acryloyloxypropyl methacrylate, isocyanuric acid EO-modified diacrylate, isocyanuric acid-modified dimethacrylate, another difunctional acrylate having a urethane bond, and difunctional methacrylate having a urethane bond. As necessary, two or more of these can be mixedly used.

It is noted that, for example, the PEG 200 diacrylate refers to a polyethylene glycol diacrylate having a polyethylene glycol chain formula weight of about 200.

In the photocurable resin composition according to the present invention, a monofunctional radical crosslinking agent can be preferably used as the radical crosslinking agent from the viewpoint of suppressing warping associated with the control of the elastic modulus of the pattern (cured substance). As the monofunctional radical crosslinking agent, (meth)acrylic acid derivatives such as n-butyl (meth)acrylate, 2-ethylhexyl (meth)acrylate, 2-hydroxyethyl (meth)acrylate, butoxyethyl (meth)acrylate, carbitol (meth)acrylate, cyclohexyl (meth)acrylate, benzyl (meth)acrylate, phenoxyethyl (meth)acrylate, N-methylol (meth)acrylamide, glycidyl (meth)acrylate, polyethylene glycol mono (meth)acrylate, and polypropylene glycol mono(meth)acrylate, N-vinyl compounds such as N-vinylpyrrolidone and N-vinylcaprolactam, allyl glycidyl ethers, and the like are preferably used. As the monofunctional radical crosslinking agent, a compound having a boiling point of 100° C. or higher under atmospheric pressure is also preferable in order to suppress volatilization before exposure.

In addition, examples of the difunctional or higher functional radical crosslinking agent include allyl compounds such as diallyl phthalate and triallyl trimellitate.

In a case where a radical crosslinking agent is contained, the content thereof is preferably more than 0% by mass and 60% by mass or less with respect to the total solid content of the photocurable resin composition according to the present invention. The lower limit thereof is more preferably 5% by mass or more. An upper limit is more preferably 50% by mass or less and still more preferably 30% by mass or less.

One kind of radical crosslinking agent may be used alone, or two or more kinds thereof may be mixedly used. In a case where two or more kinds thereof are used in combination, the total amount thereof is preferably in the above range.

[Another Crosslinking Agent]

The photocurable resin composition according to the present invention also preferably contains another crosslinking agent different from the radical crosslinking agent described above.

In the present invention, the other crosslinking agent refers to a crosslinking agent other than the above-described radically crosslinking agent, where it is preferably a compound having a plurality of groups, in the molecule, which accelerates a reaction of forming a covalent bond between other compounds in the composition or reaction products thereof, by the photosensitization of the above-described photoacid generator photobase generator, and it is preferably a compound having a plurality of groups, in the molecule, which accelerates a reaction of forming a covalent bond between other compounds in the composition or reaction products thereof, by the action of the acid or the base.

The acid or base is preferably an acid or base generated from a photoacid generator photobase generator in the exposure step.

The other crosslinking agent is preferably a compound having at least one group selected from the group consisting of an acyloxymethyl group, a methylol group, and an alkoxymethyl group, and more preferably a compound having a structure in which at least one group selected from the group consisting of an acyloxymethyl group, a methylol group, and an alkoxymethyl group is directly bonded to a nitrogen atom.

Examples of the other crosslinking agent include a compound having a structure in which formaldehyde, or formaldehyde and alcohol are reacted with an amino group-containing compound such as melamine, glycoluril, urea, an alkylene urea, or benzoguanamine to substitute a hydrogen atom of the amino group with an acyl group, a methylol group, or an alkoxymethyl group. The production method for these compounds is not particularly limited, and any compound having the same structure as the compound produced by the above method may be used. In addition, oligomers formed by the self-fusion of the methylol groups of these compounds may be used.

As the above amino group-containing compound, the crosslinking agent in which melamine is used is referred to as a melamine-based crosslinking agent, the crosslinking agent in which glycoluril, urea, or an alkylene urea is used is referred to a urea-based crosslinking agent, the crosslinking agent in which an alkylene urea is used is referred to as an alkylene urea-based crosslinking agent, and the crosslinking agent in which benzoguanamine is used is referred to as a benzoguanamine-based crosslinking agent.

Among these, the photocurable resin composition according to the present invention preferably contains at least one compound selected from the group consisting of a urea-based crosslinking agent and a melamine-based crosslinking agent and more preferably contains at least one compound selected from the group consisting of a glycoluril-based crosslinking agent described later and a melamine-based crosslinking agent.

Examples of the compound containing at least one of the alkoxymethyl group or the acyloxymethyl group in the present invention include, as a structural example, a compound in which an alkoxymethyl group or an acyloxymethyl group is directly substituted on an aromatic group or the nitrogen atom of the following urea structure, or on triazine.

The alkoxymethyl group or acyloxymethyl group contained in the above compound preferably has 2 to 5 carbon atoms, preferably 2 or 3 carbon atoms, and more preferably 2 carbon atoms.

The total number of alkoxymethyl groups and acyloxymethyl groups contained in the above compound is preferably 1 to 10, more preferably 2 to 8, and particularly preferably 3 to 6.

The molecular weight of the above compound is preferably 1,500 or less and preferably 180 to 1,200.

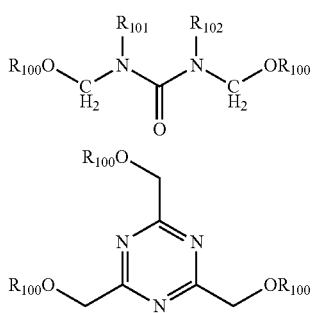

$R_{100}$ represents an alkyl group or an acyl group.

$R_{101}$ and $R_{102}$ each independently represent a monovalent organic group, and they may be bonded to each other to form a ring.

Examples of the compound in which an alkoxymethyl group or an acyloxymethyl group is directly substituted on an aromatic group include compounds such as those represented by the following general formulae.

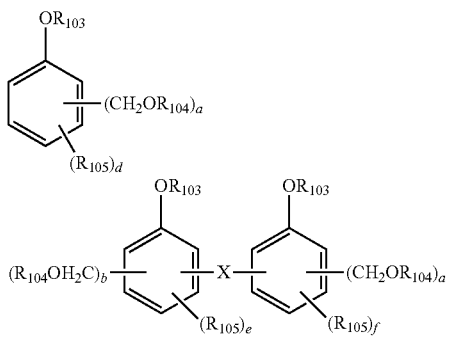

In the formula, X represents a single-bonded or divalent organic group, each $R_{104}$ independently represents an alkyl or acyl group, and $R_{103}$ represents a hydrogen atom, an alkyl group, an alkenyl group, an aryl group, an aralkyl group, or a group that decomposes under the action of acid and generates an alkali-soluble group (for example, a group that is eliminated by under the action of acid, a group represented by —$C(R^4)_2COOR^5$ (each $R^4$ independently represents a hydrogen atom or an alkyl group having 1 to 4 carbon atoms, and $R^5$ represents a group eliminated under the action of acid)).

Each $R_{105}$ independently represents an alkyl group or an alkenyl group, a, b, and c are each independently 1 to 3, d is 0 to 4, e is 0 to 3, and f is 0 to 3, where a+d is 5 or less, b+e is 4 or less, and c+f is 4 or less.

Examples of $R^5$ in the group that decomposes under the action of an acid to generate an alkali-soluble group, a group that is eliminated under the action of acid, and a group represented by —$C(R^4)_2COOR^5$, include —$C(R_{36})(R_{37})(R_{38})$, —$C(R_{36})(R_{37})(OR_{39})$, and —$C(R_{01})(R_{02})(OR_{39})$.

In the formulae, $R_{36}$ to $R_{39}$ each independently an alkyl group, a cycloalkyl group, an aryl group, an aralkyl group, or an alkenyl group. $R_{36}$ and $R_{37}$ may be bonded to each other to form a ring.

The alkyl group is preferably an alkyl group having 1 to 10 carbon atoms and more preferably an alkyl group having 1 to 5 carbon atoms.

The alkyl group may be either linear or branched.

The cycloalkyl group is preferably a cycloalkyl group having 3 to 12 carbon atoms and more preferably a cycloalkyl group having 3 to 8 carbon atoms.

The cycloalkyl group may have a monocyclic structure or a polycyclic structure such as a fused ring.

The aryl group is preferably an aromatic hydrocarbon group having 6 to 30 carbon atoms and more preferably a phenyl group.

As the aralkyl group, an aralkyl group having 7 to 20 carbon atoms is preferable, and an aralkyl group having 7 to 16 carbon atoms is more preferable.

The above-described aralkyl group is intended to be an aryl group substituted with an alkyl group, and preferred aspects of these alkyl group and aryl group are respectively the same as the above-described preferred aspects of the alkyl group and the aryl group.

The alkenyl group is preferably an alkenyl group having 3 to 20 carbon atoms and more preferably an alkenyl group having 3 to 16 carbon atoms.

Further, these groups may further have a known substituent within the scope in which the effect of the present invention is obtained.

$R_{O1}$ and $R_{O2}$ each independently represent a hydrogen atom, an alkyl group, a cycloalkyl group, an aryl group, an aralkyl group, or an alkenyl group.

The group that decomposes under the action of an acid to generate an alkali-soluble group or the group that is eliminated under the action of an acid is preferably a tertiary alkyl ester group, an acetal group, a cumyl ester group, an enol ester group, or the like. It is more preferably a tertiary alkyl ester group or an acetal group.

Specific examples of the compound having an alkoxymethyl group include the following structures. Examples of the compound having an acyloxymethyl group include compounds in which the alkoxymethyl group of the following compounds is changed to an acyloxymethyl group. Examples of the compound having an alkoxymethyl group or an acyloxymethyl group in the molecule include, but are not limited to, the following compounds.

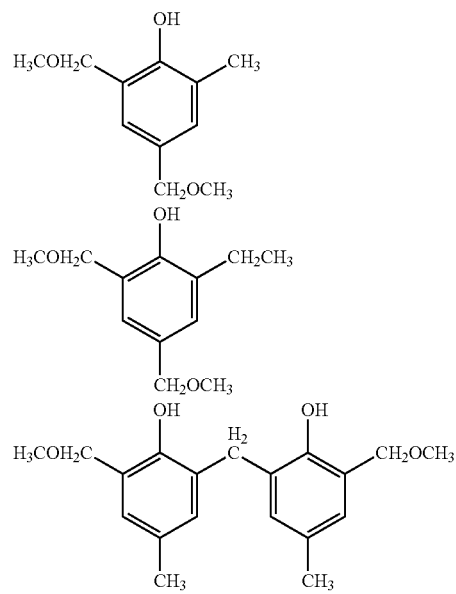

-continued
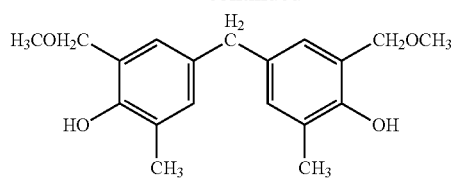
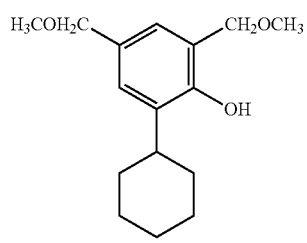
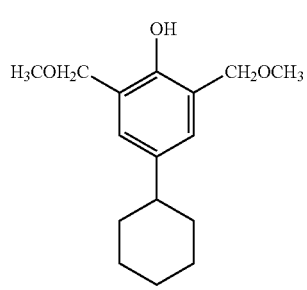
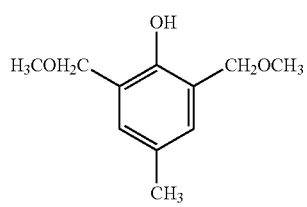
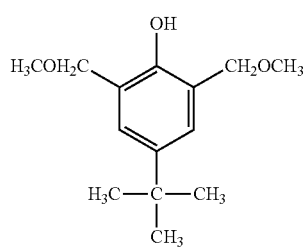
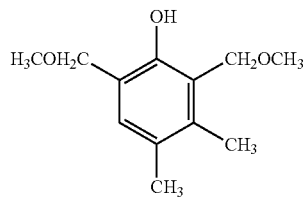
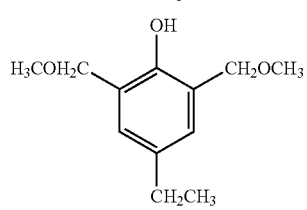
-continued
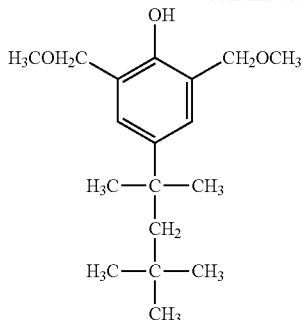
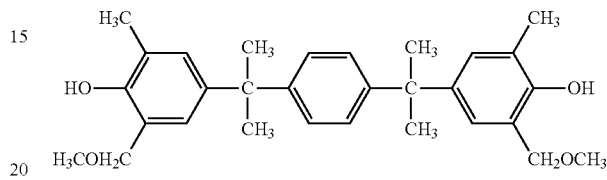
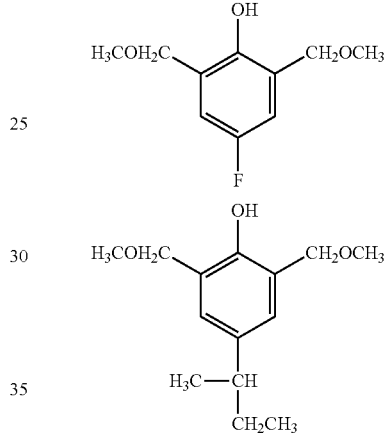
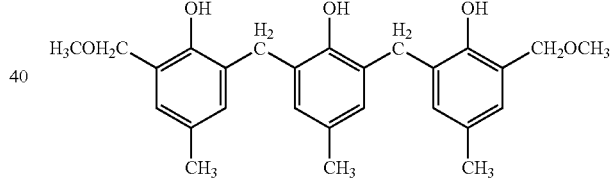
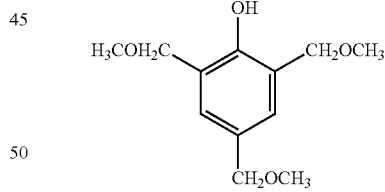
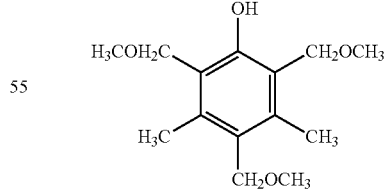
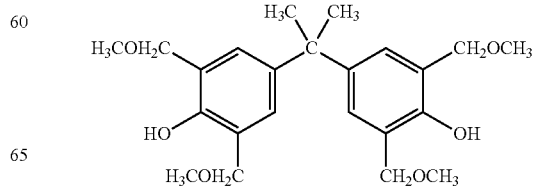

63
-continued
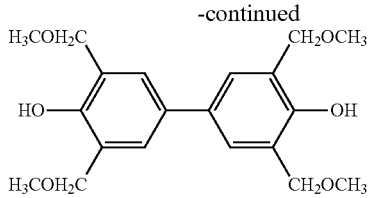
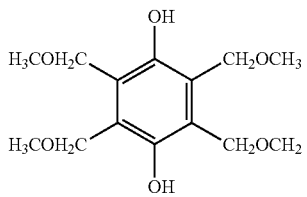
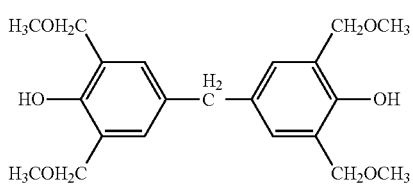
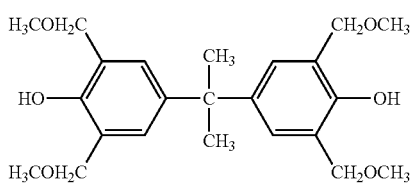
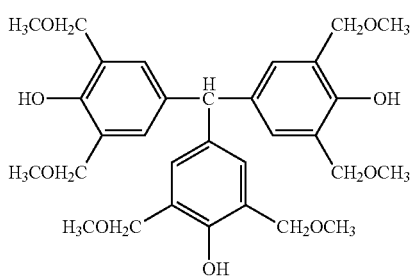
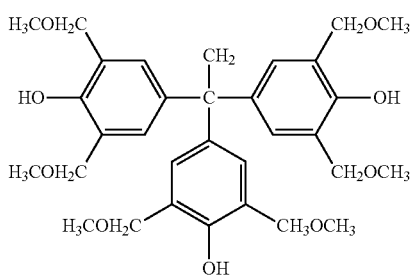
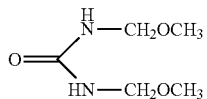
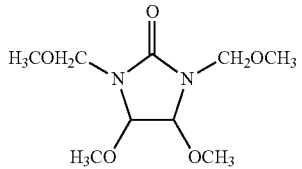
64
-continued
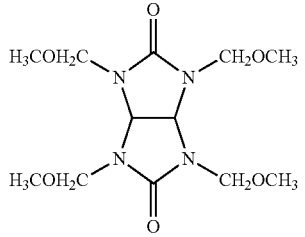
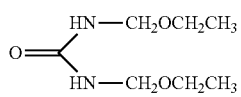
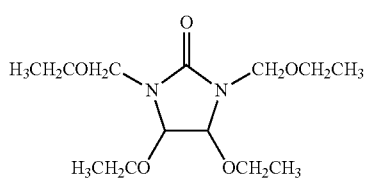
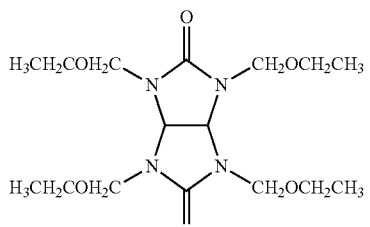
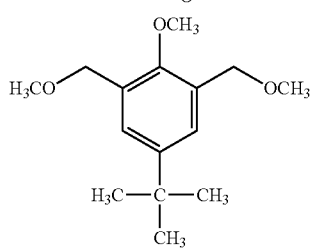
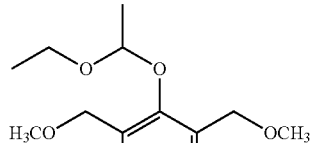
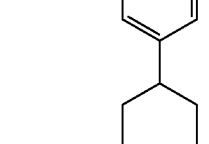
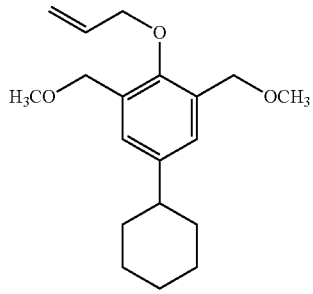

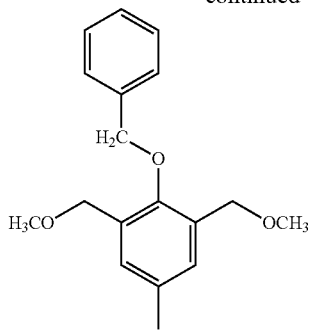

As the compound containing at least one of an alkoxymethyl group and an acyloxymethyl group, a commercially available compound may be used, or a compound synthesized by a known method may be used.

From the viewpoint of heat resistance, a compound in which an alkoxymethyl group or an acyloxymethyl group is directly substituted on an aromatic ring or a triazine ring is preferable.

Specific examples of the melamine-based crosslinking agent include hexamethoxymethylmelamine, hexaethoxymethylmelamine, hexapropoxymethylmelamine, and hexabutoxybutylmelamine.

Specific examples of the urea-based crosslinking agent include glycoluril-based crosslinking agents such as monohydroxymethylated glycoluril, dihydroxymethylated glycoluril, trihydroxymethylated glycoluril, tetrahydroxymethylated glycoluril, monoethoxymethylated glycoluril, diethoxymethylated glycoluril, triethoxymethylated glycoluril, tetramethoxymethylated glycoluril, monomethoxymethylated glycoluril, dimethoxymethylated glycoluril, trimethoxymethylated glycoluril, tetraethoxymethylated glycoluril, monopropoxymethylated glycoluril, dipropoxymethylated glycoluril, tripropoxymethylated glycoluril, tetrapropoxymethylated glycoluril, monobutoxymethylated glycoluril, dibutoxymethylated glycoluril, tributoxymethylated glycoluril, and tetrabutoxymethylated glycoluril, urea-based crosslinking agents such as bismethoxymethylurea, bisethoxymethylurea, bispropoxymethylurea, and bisbutoxymethylurea, ethyleneurea-based crosslinking agents such as monohydroxymethylated ethylene urea or dihydroxymethylated ethylene urea, monomethoxymethylated ethylene urea, dimethoxymethylated ethylene urea, monoethoxymethylated ethylene urea, diethoxymethylated ethylene urea, monopropoxymethylated ethylene urea, dipropoxymethylated ethylene urea, monobutoxymethylated ethylene urea, and dibutoxymethylated ethylene urea, propylene urea-based crosslinking agents such as monohydroxymethylated propylene urea, dihydroxymethylated propylene urea, monomethoxymethylated propylene urea, dimethoxymethylated propylene urea, monoethoxymethylated propylene urea, diethoxymethylated propylene urea, monopropoxymethylated propylene urea, dipropoxymethylated propylene urea, monobutoxymethylated propylene urea, and dibutoxymethylated propylene urea, and 1,3-di(methoxymethyl)-4,5-dihydroxy-2-imidazolidinone, and 1,3-di(methoxymethyl)-4,5-dimethoxy-2-imidazolidinone.

Specific examples of the benzoguanamine-based crosslinking agent include monohydroxymethylated benzoguanamine, dihydroxymethylated benzoguanamine, trihydroxymethylated benzoguanamine, tetrahydroxymethylated benzoguanamine, monoethoxymethylated benzoguanamine, diethoxymethylated benzoguanamine, triethoxymethylated benzoguanamine, tetramethoxymethylated benzoguanamine, monoethoxymethylated benzoguanamine, diethoxymethylated benzoguanamine, triethoxymethylated benzoguanamine, tetraethoxymethylated benzoguanamine, monopropoxymethylated benzoguanamine, dipropoxymethylated benzoguanamine, tripropoxymethylated benzoguanamine, tetrapropoxymethylated benzoguanamine, monobutoxymethylated benzoguanamine, dibutoxymethylated benzoguanamine, tributoxymethylated benzoguanamine, and tetrabutoxymethylated benzoguanamine.

In addition, as the compound having at least one group selected from the group consisting of a methylol group and an alkoxymethyl group, a compound in which at least one group selected from the group consisting of a methylol group and an alkoxymethyl group is directly bonded to an aromatic ring (preferably a benzene ring) can also be suitably used.

Specific examples of such compounds include benzenedimethanol, bis(hydroxymethyl)cresol, bis(hydroxymethyl)dimethoxybenzene, bis(hydroxymethyl)diphenyl ether, bis(hydroxymethyl)benzophenone, hydroxymethylphenyl hydroxymethylbenzoate, bis(hydroxymethyl)biphenyl, dimethylbis(hydroxymethyl)biphenyl, bis(methoxymethyl)benzene, bis(methoxymethyl)cresol, bis(methoxymethyl)dimethoxybenzene, bis(methoxymethyl)diphenyl ether, bis(methoxymethyl)benzophenone, methoxymethylphenyl methoxymethylbenzoate, bis(methoxymethyl)biphenyl, dimethylbis(methoxymethyl)biphenyl, 4,4', 4"-ethylidenetris[2,6-bis(methoxymethyl)phenol], 5, 5'-[2,2,2-trifluoro-1-(trifluoromethyl)ethylidene]bis[2-hydroxy-1,3-benzenedimethanol], and 3,3', 5,5'-tetrakis(methoxymethyl)-1, 1'-biphenyl-4,4'-diol.

As the other crosslinking agent, a commercially available product may be used, and examples of the suitable commercially available product include 46DMOC and 46DMOEP (all of which are manufactured by ASAHI YUKIZAI Corporation), DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DMLBisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (all of which are manufactured by Honshu Chemical Industry Co., Ltd.), and NIKALAC (registered trade name, the same applies hereinafter) MX-290, NIKALAC MX-280, NIKALAC MX-270, NIKALAC MX-279, NIKALAC MW-100LM, and NIKALAC MX-750LM (all of which are manufactured by Sanwa Chemical Co., Ltd.).

In addition, the resin composition according to the present invention preferably contains, as the other crosslinking agent, at least one compound selected from the group consisting of an epoxy compound, an oxetane compound, and a benzoxazine compound.

—Epoxy Compound (Compound Having Epoxy Group)—

The epoxy compound is preferably a compound having two or more epoxy groups in one molecule. Since the epoxy group undergoes a crosslinking reaction at 200° C. or lower and a dehydration reaction derived from crosslinking does not occur, film shrinkage hardly occurs. Therefore, containing an epoxy compound is effective for the low-temperature curing of the resin composition according to the present invention and the suppression of warping.

The epoxy compound preferably contains a polyethylene oxide group. As a result, it is possible to further decrease the elastic modulus and suppress the warping. The polyethylene oxide group means a group in which the number of repeating units of ethylene oxide is 2 or higher, and the number of repeating units is preferably 2 to 15.

Examples of the epoxy compound include a bisphenol A type epoxy resin; a bisphenol F type epoxy resin; an alkylene glycol type epoxy resin or a polyhydric alcohol hydrocarbon type epoxy resin, such as propylene glycol diglycidyl ether, neopentyl glycol diglycidyl ether, ethylene glycol diglycidyl ether, butylene glycol diglycidyl ether, hexamethylene glycol diglycidyl ether, or trimethylolpropane triglycidyl ether; a polyalkylene glycol type epoxy resin such as polypropylene glycol diglycidyl ether; and an epoxy group-containing silicone such as polymethyl (glycidyloxypropyl)siloxane; however, the epoxy compound is not limited thereto. Specific examples thereof include EPICLON (registered trade name) 850-S, EPICLON (registered trade name) HP-4032, EPICLON (registered trade name) HP-7200, EPICLON (registered trade name) HP-820, EPICLON (registered trade name) HP-4700, EPICLON (registered trade name) HP-4770, EPICLON (registered trade name) EXA-830LVP, EPICLON (registered trade name) EXA-8183, EPICLON (registered trade name) EXA-8169, EPICLON (registered trade name)N-660, EPICLON (registered trade name)N-665-EXP-S, EPICLON (registered trade name)N-740 (all, product names, manufactured by DIC Corporation); RIKARESIN (registered trade name) BEO-20E, RIKARESIN (registered trade name) BEO-60E, RIKARESIN (registered trade name) HBE-100, RIKARESIN (registered trade name) DME-100, and RIKARESIN (registered trade name) L-200 (registered trade name, manufactured by New Japan Chemical Co., Ltd.); EP-4003S, EP-4000S, EP-4088S, EP-3950S (all, product names, manufactured by ADEKA Corporation); CELLOXIDE (registered trade name) 2021P, CELLOXIDE (registered trade name) 2081, CELLOXIDE (registered trade name) 2000, EHPE3150, EPOLEAD (registered trade name) GT401, EPOLEAD (registered trade name) PB4700, EPOLEAD (registered trade name) PB3600 (all product names, manufactured by Daicel Corporation); and NC-3000, NC-3000-L, NC-3000-H, NC-3000-FH-75M, NC-3100, CER-3000-L, NC-2000-L, XD-1000, NC-7000L, NC-7300L, EPPN-501H, EPPN-501HY, EPPN-502H, EOCN-1020, EOCN-102S, EOCN-103S, EOCN-104S, CER-1020, EPPN-201, BREN-S, and BREN-10S (all product names, manufactured by Nippon Kayaku Co., Ltd.). In addition, the following compounds are also preferably used.

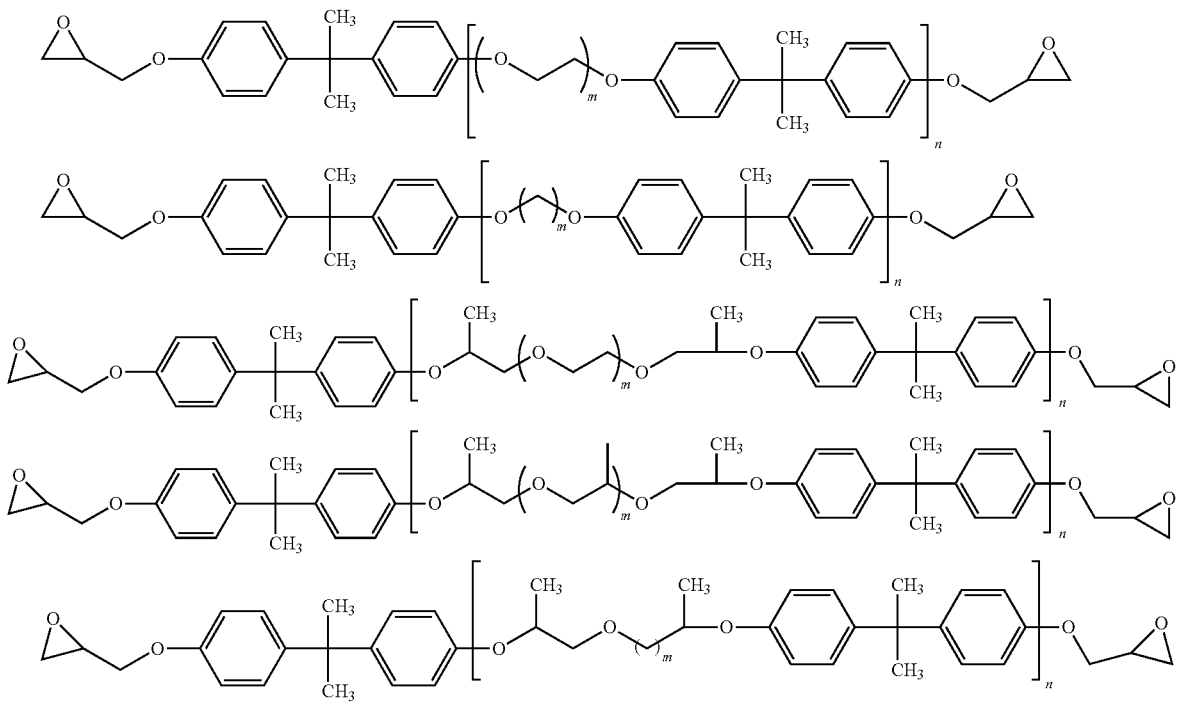

In the formulae, n is an integer of 1 to 5, and m is an integer of 1 to 20.

Among the above structures, n is preferably 1 to 2, and m is preferably 3 to 7 from the viewpoint of achieving both heat resistance and improvement in elongation.

—Oxetane Compound (Compound Having Oxetanyl Group)—

Examples of the oxetane compound include a compound having two or more oxetane rings in one molecule, 3-ethyl-3-hydroxymethyloxetane, 1,4-bis{[(3-ethyl-3-oxetanyl)methoxy]methyl}benzene, 3-ethyl-3-(2-ethylhexylmethyl)oxetane, and 1,4-benzenedicarboxylic acid-bis[(3-ethyl-3-oxetanyl)methyl]ester. As specific examples thereof, ARON OXETANE series (for example, OXT-121 and OXT-221) manufactured by Toagosei Co., Ltd., can be suitably used, and these can be used alone or two or more thereof may be mixedly used.

—Benzoxazine Compound (Compound Having Benzoxazolyl Group)—

Due to a crosslinking reaction derived from a ring-opening addition reaction, the benzoxazine compound does not result in degassing during curing and results in decreased thermal shrinkage, and thus the occurrence of warping is suppressed, which is preferable.

Preferred examples of the benzoxazine compound include P-d type benzoxazine, F-a type benzoxazine (product names, all of which are manufactured by Shikoku Chemicals Corporation), a benzoxazine adduct of polyhydroxystyrene resin, and a phenol novolak type dihydrobenzoxazine compound. These may be used alone, or two or more thereof may be mixed and used.

The content of the other crosslinking agent is preferably 0.1% to 30% by mass, more preferably 0.1% to 20% by mass, still more preferably 0.5% to 15% by mass, and particularly preferably 1.0% to 10% by mass, with respect to the total solid content of the resin composition according to the present invention. One kind of the other crosslinking agent may be contained, or two or more kinds thereof may be contained. In a case where two or more kinds of the other crosslinking agents are contained, the total thereof is preferably within the above-described range.

[Polymerization Initiator]

The resin composition according to the present invention preferably contains a polymerization initiator that is capable of initiating polymerization by light and/or heat. In particular, it is preferable to contains a photopolymerization initiator.

The photopolymerization initiator is preferably a photoradical polymerization initiator. The photoradical polymerization initiator is not particularly limited and can be appropriately selected from known photoradical polymerization initiators. For example, a photoradical polymerization initiator having photosensitivity to rays ranging from an ultraviolet ray range to a visible light range is preferable. In addition, the photoradical polymerization initiator may be an activator that produces an active radical by any action with a photo-excited sensitizing agent.

The photoradical polymerization initiator preferably contains at least one compound having a molar absorption coefficient of at least about 50 L·mol$^{-1}$·cm$^{-1}$ within a range of a wavelength of about 240 to 800 nm (preferably 330 to 500 nm). The molar absorption coefficient of a compound can be measured using a well-known method. For example, it is preferable to carry out a measurement at a concentration of 0.01 g/L using an ethyl acetate solvent with an ultraviolet-visible spectrophotometer (Cary-5 spectrophotometer manufactured by Varian Medical Systems, Inc.).

As a photoradical polymerization initiator, well-known compounds can be optionally used. Examples thereof include a halogenated hydrocarbon derivative (for example, a compound having a triazine skeleton, a compound having an oxadiazole skeleton, or a compound having a trihalomethyl group), an acylphosphine compound such as an acylphosphine oxide, hexaarylbiimidazole, an oxime compound such as an oxime derivative, an organic peroxide, a thio compound, a ketone compound, an aromatic onium salt, a keto oxime ether, an α-amino ketone compound such as aminoacetophenone, an α-hydroxy ketone compound such as hydroxyacetophenone, an azo-based compound, an azide compound, a metallocene compound, an organic boron compound, and an iron arene complex. With regard to details thereof, reference can be made to the description of paragraphs 0165 to 0182 of JP2016-027357A and paragraphs 0138 to 0151 of WO2015/199219A, the contents of which are incorporated in the present specification. In addition, examples thereof include the compounds described in paragraphs 0065 to 0111 of JP2014-130173A and JP6301489B, the peroxide-based photopolymerization initiator described in MATERIAL STAGE 37 to 60 p, vol. 19, No. 3, 2019, the photopolymerization initiator described in WO2018/221177A, the photopolymerization initiator described in WO2018/110179A, the photopolymerization initiator described in JP2019-043864A, the photopolymerization initiator described in JP2019-044030A, and the peroxide-based initiator described in JP2019-167313AA, the contents of which are also incorporated in the present specification.

Examples of the ketone compound include compounds described in paragraph 0087 of JP2015-087611A, the content of which is incorporated in the present specification. As a commercially available product thereof, KAYACURE DETX-S (manufactured by Nippon Kayaku Co., Ltd.) is also suitably used.

In one embodiment of the present invention, a hydroxyacetophenone compound, an aminoacetophenone compound, and an acylphosphine compound can be suitably used as the photoradical polymerization initiator. More specifically, for example, the aminoacetophenone-based initiator described in JP1998-291969A (JP-H10-291969A) and the acylphosphine oxide-based initiator described in JP4225898B can be used, the contents of which are incorporated in the present specification.

As the α-hydroxy ketone-based initiator, Omnirad 184, Omnirad 1173, Omnirad 2959, Omnirad 127 (all of which manufactured by IGM Resins B.V.), IRGACURE 184 (IRGACURE is a registered trade name), DAROCUR 1173, IRGACURE 500, and IRGACURE-2959, and IRGACURE 127 (product names: all of which manufactured by BASF) can be used.

As the α-amino ketone-based initiator, Omnirad 907, Omnirad 369, Omnirad 369E, Omnirad 379EG (all of which are manufactured by IGM Resins B.V.), IRGACURE 907, IRGACURE 369, and IRGACURE 379 (product names: all of which are manufactured by BASF SE) can be used.

As the aminoacetophenone-based initiator, the compound described in JP2009-191179A, a maximum absorption wavelength of which is matched to a light source having a wavelength such as 365 nm or 405 nm, can also be used, the content of which is incorporated in the present specification.

Examples of the acylphosphine oxide-based initiator include 2,4,6-trimethylbenzoyl-diphenyl-phosphine oxide. In addition, Omnirad 819 and Omnirad TPO (all of which are manufactured by IGM Resins B.V.), IRGACURE-819, and IRGACURE-TPO (product names: all of which are manufactured by BASF SE) can be used.

Examples of the metallocene compound include IRGACURE-784 and IRGACURE-784EG (all of which are manufactured by BASF), and Keycure VIS 813 (manufactured by King Brother Chem Co., Ltd.).

Examples of the more preferred photoradical polymerization initiator include an oxime compound. In a case where an oxime compound is used, exposure latitude can be more effectively improved. The oxime compound is particularly preferable since the oxime compound has a wide exposure latitude (a wide exposure margin) and also works as a photocuring accelerator.

Specific examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2004-534797A, the compounds described in JP2017-019766A, the compounds described in JP6065596B, the compounds described in WO2015/152153A, the compounds described in WO2017/051680A, the compounds described in JP2017-198865A, the compounds described in paragraph Nos. 0025 to 0038 of WO2017/164127A, and the compounds described in WO2013/167515A, the content of which is incorporated in the present specification.

Examples of the preferred oxime compound include compounds having the following structures, 3-(benzoyloxy (imino))butan-2-one, 3-(acetoxy(imino))butan-2-one, 3-(propionyloxy(imino))butan-2-one, 2-(acetoxy(imino)) pentan-3-one, 2-(acetoxy(imino))-1-phenylpropan-1-one, 2-(benzoyloxy(imino))-1-phenylpropan-1-one, 3-((4-toluenesulfonyloxy)imino)butan-2-one, and 2-(ethoxycarbonyloxy(imino))-1-phenylpropan-1-one. In the resin composition, it is particularly preferable to use an oxime compound (an oxime-based photoradical polymerization initiator) as the photoradical polymerization initiator. The oxime-based photoradical polymerization initiator has a linking group of >C=N—O—C(=O)— in the molecule.

OXE 01

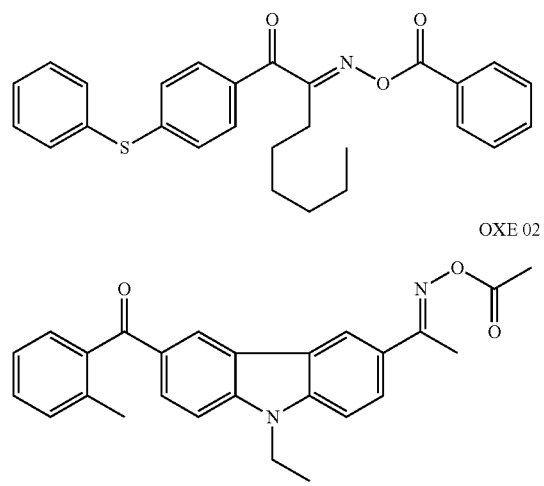

OXE 02

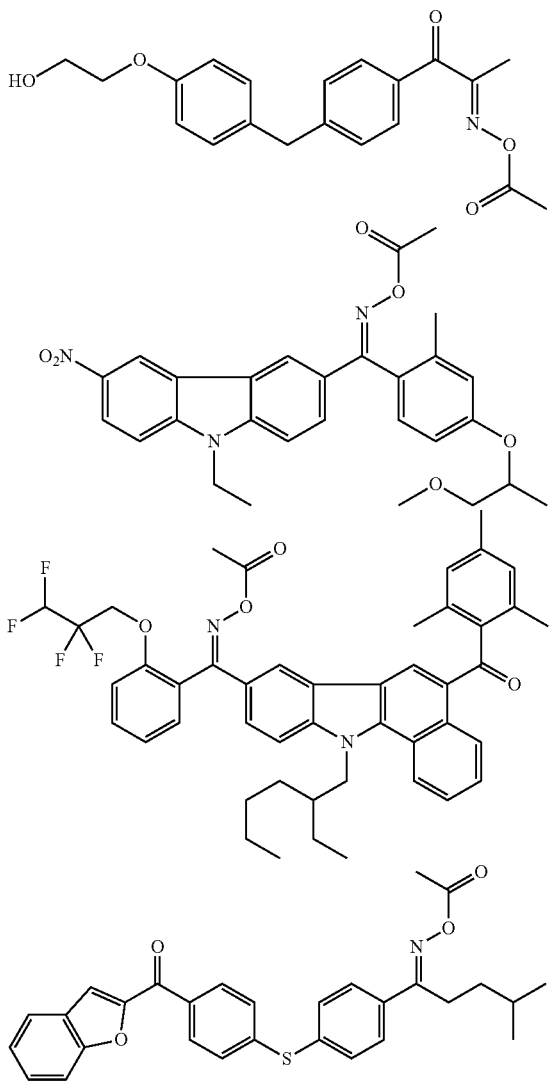

As commercially available products, IRGACURE OXE 01, IRGACURE OXE 02, IRGACURE OXE 03, IRGACURE OXE 04 (all of which are manufactured by BASF SE), ADEKA OPTOMERN-1919 (manufactured by ADEKA Corporation, the photoradical polymerization initiator 2 described in JP2012-014052A) are also suitably used. In addition, TR-PBG-304 and TR-PBG-305 (manufactured by Changzhou Tronly New Electronic Materials Co., Ltd.), ADEKA ARKLS NCI-730, NCI-831, and ADEKA ARKLS NCI-930 (manufactured by ADEKA Corporation) can also be used. In addition, DFI-091 (manufactured by DAITO CHEMIX Co., Ltd.) and SpeedCure PDO (manufactured by SARTOMER ARKEMA) can be used. In addition, oxime compounds having the following structures can also be used.

As the photoradical polymerization initiator, an oxime compound having a fluorene ring can also be used. Specific examples of the oxime compound having a fluorene ring include the compound disclosed in JP2014-137466A and the compound disclosed in JP06636081B, the content of which is incornorated in the present specification.

As the photoradical polymerization initiator, an oxime compound having a skeleton in which at least one benzene ring of the carbazole ring is a naphthalene ring can also be used. Specific examples of such an oxime compound include the compound described in WO2013/083505A, the content of which is incorporated in the present specification.

It is also possible to use an oxime compound having a fluorine atom. Specific examples of such oxime compounds include the compounds described in JP2010-262028A, compounds 24, and 36 to 40 described in paragraph 0345 of JP2014-500852A, and a compound (C-3) described in paragraph 0101 of JP2013-164471A, the contents of which are incorporated in the present specification.

An oxime compound having a nitro group can be used as the photopolymerization initiator. It is also preferable that the oxime compound having a nitro group is a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, the contents of which are incorporated in the present specification. In addition, examples of the oxime compound having a nitro group include ADEKA ARKLS NCI-831 (manufactured by ADEKA Corporation).

As the photoradical polymerization initiator, an oxime compound having a benzofuran skeleton can also be used. Specific examples thereof include OE-01 to OE-75 described in WO2015/036910A.

As the photoradical polymerization initiator, an oxime compound in which a substituent having a hydroxy group is bonded to a carbazole skeleton can also be used. Examples of such a photopolymerization initiator include the compound described in WO2019/088055A, the content of which is incorporated in the present specification.

As the photopolymerization initiator, an oxime compound having an aromatic ring group $Ar^{OX1}$ in which an electron withdrawing group is introduced into an aromatic ring (hereinafter, also referred to as an oxime compound OX) can also be used. Examples of the electron withdrawing group contained in the aromatic ring group $Ar^{OX1}$ include an acyl group, a nitro group, a trifluoromethyl group, an alkylsulfinyl group, an arylsulfinyl group, an alkylsulfonyl group, an arylsulfonyl group, and a cyano group. Here, an acyl group or a nitro group is preferable, and due to the reason that a film having excellent light resistance is easily formed, an acyl group is more preferable, and a benzoyl group is still more preferable. The benzoyl group may have a substituent. The substituent is preferably a halogen atom, a cyano group, a nitro group, a hydroxy group, an alkyl group, an alkoxy group, an aryl group, an aryloxy group, a heterocyclic group, a heterocyclic oxy group, an alkenyl group, an alkylsulfanyl group, an arylsulfanyl group, an acyl group, or an amino group, more preferably an alkyl group, an alkoxy group, an aryl group, an aryloxy group, a heterocyclic oxy group, an alkylsulfanyl group, an arylsulfanyl group, or an amino group, and still more preferably an alkoxy group, an alkylsulfanyl group, or an amino group.

The oxime compound OX is preferably at least one selected from a compound represented by Formula (OX1) or a compound represented by Formula (OX2), and more preferably a compound represented by Formula (OX2).

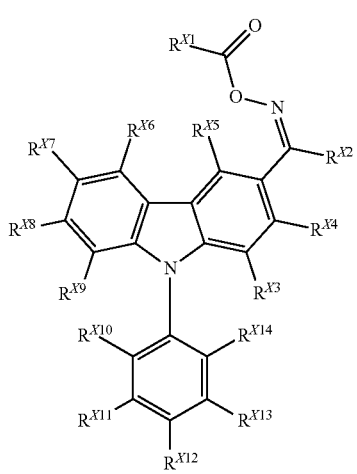

(OX1)

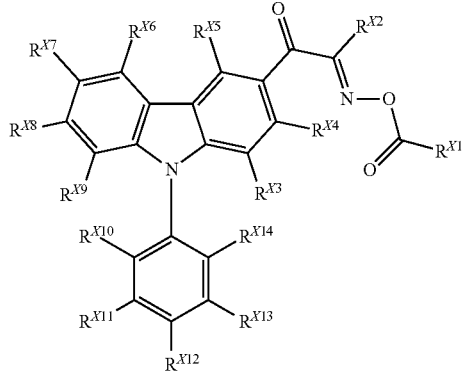

(OX2)

In the formulae, $R^{X1}$ represents an alkyl group, an alkenyl group, an alkoxy group, an aryl group, an aryloxy group, a heterocyclic group, a heterocyclic oxy group, an alkylsulfanyl group, an arylsulfanyl group, an alkylsulfinyl group, an arylsulfinyl group, an alkylsulfonyl group, an arylsulfonyl group, an acyl group, an acyloxy group, an amino group, a phosphinoyl group, a carbamoyl group, or a sulfamoyl group, $R^{X2}$ represents an alkyl group, an alkenyl group, an alkoxy group, an aryl group, an aryloxy group, a heterocyclic group, or a heterocyclic oxy group, an alkylsulfanyl group, an arylsulfanyl group, an alkylsulfinyl group, an arylsulfinyl group, an alkylsulfonyl group, an arylsulfonyl group, an acyloxy group, or an amino group, and $R^{X3}$ to $R^{X14}$ each independently represent a hydrogen atom or a substituent.

However, at least one of $R^{X10}$, ..., or $R^{X14}$ is an electron withdrawing group.

In the above formulae, it is preferable that $R^{X12}$ is an electron withdrawing group, and $R^{X10}$, $R^{X11}$, $R^{X13}$, and $R^{X14}$ are a hydrogen atom.

Specific examples of the oxime compound OX include the compounds described in paragraph Nos. 0083 to 0105 of JP4600600B, the content of which is incorporated in the present specification.

Examples of the most preferred oxime compound include the oxime compound having a specific substituent described in JP2007-269779A and the oxime compound having a thioaryl group described in JP2009-191061A, the contents of which are incorporated in the present specification.

From the viewpoint of exposure sensitivity, the photoradical polymerization initiator is preferably a compound selected from the group consisting of a trihalomethyltriazine compound, a benzyl dimethyl ketal compound, an α-hydroxy ketone compound, an α-amino ketone compound, an acylphosphine compound, a phosphine oxide compound, a metallocene compound, an oxime compound, a triaryl imidazole dimer, an onium salt compound, a benzothiazole compound, a benzophenone compound, an acetophenone compound and a derivative thereof, a cyclopentadiene-benzene-iron complex and a salt thereof, a halomethyl oxadiazole compound, and a 3-aryl substituted coumarin compound.

The photoradical polymerization initiator is more preferably a trihalomethyltriazine compound, an α-amino ketone compound, an acylphosphine compound, a phosphine oxide compound, a metallocene compound, an oxime compound, a triaryl imidazole dimer, an onium salt compound, a benzophenone compound, or an acetophenone compound, still more preferably at least one compound selected from the group consisting of a trihalomethyltriazine compound, an α-amino ketone compound, a metallocene compound, an oxime compound, a triaryl imidazole dimer, and a benzophenone compound. A metallocene compound or an oxime compound is still more preferably used.

In addition, as the photoradical polymerization initiator, it is possible to use benzophenone, an N,N'-tetraalkyl-4,4'-diaminobenzophenone such as N,N'-tetramethyl-4,4'-diaminobenzophenone (Michler's ketone), an aromatic ketone such as 2-benzyl-2-dimethylamino-1-(4-morpholinophenyl)-butanone-1,2-methyl-1-[4-(methylthio)phenyl]-2-morpholino-propanone-1, quinones fused with an aromatic ring such as an alkylanthraquinone, a benzoin ether compound such as a benzoin alkyl ether, a benzoin compound such as benzoin or an alkyl benzoin, a benzyl derivative such as benzyl dimethyl ketal, or the like. In addition, a compound represented by Formula (I) may also be used.

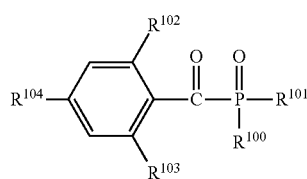

(I)

In Formula (I), $R^{I00}$ represents an alkyl group having 1 to 20 carbon atoms, an alkyl group having 2 to 20 carbon atoms, which is interrupted by one or more oxygen atoms, an alkoxy group having 1 to 12 carbon atoms, a phenyl group, or a phenyl group substituted with at least one of an alkyl group having 1 to 20 carbon atoms, an alkoxy group having 1 to 12 carbon atoms, a halogen atom, a cyclopentyl group, a cyclohexyl group, an alkenyl group having 2 to 12 carbon atoms, an alkyl group having 2 to 18 carbon atoms, which is interrupted by one or more oxygen atoms, or an alkyl group having 1 to 4 carbon atoms, or a biphenyl group, $R^{I01}$ is a group represented by Formula (II) or a group which is the same as $R^{I00}$, and $R^{I02}$ to $R^{I04}$ each independently represent an alkyl group having 1 to 12 carbon atoms, an alkoxy group having 1 to 12 carbon atoms, or a halogen atom.

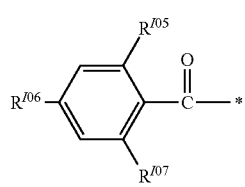

(II)

In the formula, $R^{I05}$ to $R^{I07}$ are respectively the same as $R^{I02}$ to $R^{I04}$ in Formula (I).

In addition, as the photoradical polymerization initiator, the compounds described in paragraphs 0048 to 0055 of WO2015/125469A can also be used, the content of which is incorporated in the present specification.

As the photoradical polymerization initiator, a photoradical polymerization initiator which is difunctional or trifunctional or higher functional may be used. In a case where such a photoradical polymerization initiator is used, two or more radicals are generated from one molecule of the photoradical polymerization initiator, and thus good sensitivity is obtained. Further, in a case where a compound having an asymmetric structure is used, the crystallinity is reduced, the solubility in a solvent or the like is improved, and the compound is hardly precipitated over time, and the temporal stability of the resin composition can be improved. Specific examples of the photoradical polymerization initiator which is difunctional or trifunctional or higher functional include dimers of the oxime compounds described in JP2010-527339A, JP2011-524436A, WO2015/004565A, paragraph Nos. 0407 to 0412 of JP2016-532675A, and paragraph Nos. 0039 to 0055 of WO2017/033680A, the compound (E) and compound (G) described in JP2013-522445A, Cmpd 1 to 7 described in WO2016/034963A; the oxime ester photoinitiators described in paragraph No. 0007 of JP2017-523465A, the photoinitiators described in paragraph Nos. 0020 to 0033 of JP2017-167399A, the photopolymerization initiator (A) described in paragraph Nos. 0017 to 0026 of JP2017-151342A, the oxime ester photoinitiator described in JP6469669B, the contents of which are incorporated in the present specification.

In a case where the photopolymerization initiator is contained, the content thereof is preferably 0.1% to 30% by mass, more preferably 0.1% to 20% by mass, still more preferably 0.5% to 15% by mass, and still more preferably 1.0% to 10% by mass, with respect to the total solid content of the resin composition according to the present invention. Only one kind of photopolymerization initiator may be contained, or two or more kinds thereof may be contained. In a case where two or more kinds of photopolymerization initiators are contained, the total amount thereof is preferably within the above-described range.

Since the photopolymerization initiator may also function as a thermal polymerization initiator, crosslinking with the photopolymerization initiator may be further promoted by heating an oven, a hot plate, or the like.

[Thermal Polymerization Initiator]

It is also preferable that the resin composition according to the present invention contains a thermal polymerization initiator.

The thermal polymerization initiator can be selected depending on the kind of the polymerizable compound; however, it is preferably a thermal radical polymerization initiator. The thermal radical polymerization initiator is a compound that generates a radical by heat energy and initiates or accelerates a polymerization reaction of a compound having polymerization properties.

In addition, there is a case where the above-described photopolymerization initiator also has a function of initiating polymerization by heat, and thus there is a case where it can be added as a thermal polymerization initiator.

Examples of the thermal polymerization initiator include a known azo-based compound and a known peroxide-based compound. Examples of the azo compound include an azobis-based compound. The azo-based compound may be a compound having a cyano group or may be a compound having no cyano group. Examples of the peroxide-based compound include a ketone peroxide, a peroxyketal, a hydroperoxide, a dialkyl peroxide, a diacyl peroxide, a peroxydicarbonate, and a peroxyester.

A commercially available product can also be used as the thermal polymerization initiator, and examples thereof include V-40, V-601, and VF-096, manufactured by Fujifilm Wako Pure Chemical Corporation, and PERHEXYL O, PERHEXYL D, PERHEXYL I, PERHEXA 25O, PERHEXA 25Z, PERCUMYL D, PERCUMYL D-40, PER- CUMYL D-40 MB, PERCUMYL H, PERCUMYL P, and PERCUMYL ND, manufactured by NOF Corporation.

In addition, specific examples of thermal radical polymerization initiator include compounds described in paragraphs 0074 to 0118 of JP2008-063554A, the content of which is incorporated in the present specification.

The content of the thermal polymerization initiator in the resin composition is preferably 0.05% by mass or more and 10% by mass or less, more preferably 0.1% by mass or more and 10% by mass or less, still more preferably 0.1% by mass or more and 5% by mass or less, and particularly preferably 0.5% by mass or more and 3% by mass or less, with respect to the total solid content of the composition.

The resin composition may contain one kind of thermal polymerization initiator alone or may contain two or more kinds thereof. In a case where two or more kinds thereof are contained, the total amount thereof is preferably within the above range.

[Sensitizing Agent]

The resin composition may contain a sensitizing agent. The sensitizing agent absorbs a specific radioactive ray to be in an electronically excited state. The sensitizing agent in the electronically excited state is brought into contact with a thermal radical polymerization initiator, a photoradical polymerization initiator, or the like, to cause actions such as electron migration, energy transfer, and heat generation. As a result, the thermal radical polymerization initiator the photoradical polymerization initiator undergoes a chemical change and decomposes to generate a radical, an acid, or a base.

In addition, as a usable sensitizing agent, a benzophenone-based, a Michler's ketone-based, a coumarin-based, a pyrazole azo-based, an anilino azo-based, a triphenylmethane-based, an anthraquinone-based, an anthracene-based, an anthrapylidene-based, a benzylidene-based, an oxonol-based, a pyrazolotriazole azo-based, a pyridone azo-based, a cyanine-based, a phenothiazine-based, a pyrrolopyrazole azomethine-based, a xanthene-based, a phthalocyanine-based, a benzopyran-based, and an indigo-based compound can be used.

Examples of the sensitizing agent include, Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino)chalcone, p-dimethylaminocinnamylidene indanone, p-dimethylamino benzylidene indanone, 2-(p-dimethylaminophenylbiphenylene)-benzothiazole, 2-(p-dimethylaminophenylvinylene)benzothiazole, 2-(p-dimethylaminophenylvinylene)isonaphthothiazole, 1,3-bis(4'-dimethylaminobenzal)acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin (ethyl 7-(diethylamino)coumarin-3-carboxylate), N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzothiazole, 2-(p-dimethylaminostyryl)naphtho (1,2-d) thiazole, 2-(p-dimethylaminobenzoyl)styrene, diphenylacetamide, benzanilide, N-methylacetanilide, and 3', 4'-dimethylacetanilide.

In addition, other sensitizing dyes may be used.

For details of the sensitizing dye, reference can be made to the description in paragraphs 0161 to 0163 of JP2016-027357A, the content of which is incorporated in the present specification.

In a case where the resin composition contains a sensitizing agent, the content of the sensitizing agent is preferably 0.01% to 20% by mass, more preferably 0.1% to 15% by mass, and still more preferably 0.5% to 10% by mass, with respect to the total solid content of the resin composition. One kind of sensitizing agent may be used alone, or two or more kinds thereof may be used in combination.

[Chain Transfer Agent]

The resin composition according to the present invention may contain a chain transfer agent. The chain transfer agent is defined, for example, in Polymer Dictionary, 3rd Edition, pp. 683 to 684 (edited by The Society of Polymer Science, 2005). As the chain transfer agent, for example, the following compound is used; a group of compounds having —S—S—, —SO$_2$—S—, —N—O—, SH, PH, SiH, or GeH in the molecule, or a dithiobenzoate compound, a trithiocarbonate compound, dithiocarbamate, or a xanthate compound, which has a thiocarbonylthio group that is used for the reversible addition fragmentation chain transfer (RAFT) polymerization. These can donate hydrogen to a low active radical to generate a radical or can be oxidized and then deprotonated to generate a radical. In particular, a thiol compound can be preferably used.

In addition, as the chain transfer agent, the compounds described in paragraphs 0152 and 0153 of WO2015/199219A can also be used, the content of which is incorporated in the present specification.

In a case where the resin composition according to the present invention has a chain transfer agent, the content of the chain transfer agent is preferably 0.01 to 20 parts by mass, more preferably 0.1 to 10 parts by mass, and still more preferably 0.5 to 5 parts by mass, with respect to 100 parts by mass of the total solid content of the resin composition according to the present invention. One kind of chain transfer agent may be used, or two or more kinds thereof may be used. In a case where two or more kinds of chain transfer agents are used, the total thereof is preferably within the above-described range.

[Photoacid Generator]

The resin composition according to the present invention preferably contains a photoacid generator.

The photoacid generator indicates a compound that generates at least one of a Brønsted acid or a Lewis acid upon irradiation with light of 200 nm to 900 nm. The light to be irradiated is preferably light having a wavelength of 300 nm to 450 nm and more preferably light having a wavelength of 330 nm to 420 nm. The photoacid generator is preferably a photoacid generator that is capable of generating an acid by being photosensitized by using a photoacid generator alone or by using a photoacid generator and a sensitizing agent in combination.

Preferred examples of the acid to be generated include a hydrogen halide, a carboxylic acid, sulfonic acid, a sulfinic acid, thiosulfinic acid, phosphoric acid, a phosphoric acid monoester, a phosphoric acid diester, a boron derivative, a phosphorus derivative, an antimony derivative, a halogen peroxide, and a sulfone amide.

Examples of the photoacid generator that is used in the resin composition according to the embodiment of the present invention include a quinone diazide compound, an oxime sulfonate compound, an organic halogenated compound, an organic borate compound, a disulfone compound, and an onium salt compound.

From the viewpoint of sensitivity and storage stability, an organic halogen compound, an oxime sulfonate compound, or an onium salt compound is preferable, and from mechanical properties of a film to be formed, an oxime ester is preferable.

Examples of the quinone diazide compound include a compound in which sulfonic acid of quinone diazide is bonded to a monovalent or polyvalent hydroxy compound through an ester bond, a compound in which sulfonic acid of quinone diazide is bonded to a monovalent or polyvalent compound through a sulfonamide bond, and a compound in which sulfonic acid of quinone diazide is bonded to a polyhydroxypolyamino compound through an ester bond and/or a sulfonamide bond. Examples of the quinone diazide include 1,2-naphthoquinone-(2)-diazo-5-sulfonic acid. All functional groups of these polyhydroxy compounds, polyamino compounds, and polyhydroxypolyamino compounds may not be substituted with quinone diazide; however, it is preferable that, on average, 40% by mole or more of all the functional groups are substituted with quinone diazide. In a case of containing such a quinone diazide compound, it is possible to obtain a resin composition that is sensitized to the i-line (wavelength: 365 nm), the h-line (wavelength: 405 nm), and the g-line (wavelength: 436 nm) of a mercury lamp, which are general ultraviolet rays.

Specific examples of the hydroxy compound include phenol, trihydroxybenzophenone, 4-methoxyphenol, isopropanol, octanol, t-Bu alcohol, cyclohexanol, naphthol, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, Methylene tris-FR-CR, BisRS-26X, DML-MBPC, DML-MBOC, DML-OCHP, DML-PCHP, DML-PC, DML-PTBP, DML-34X, DML-EP, DML-POP, Dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (all, product names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (all, product names, manufactured by ASAHI YUKIZAI Corporation), 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylene bisphenol, BisP-AP (product name, manufactured by Honshu Chemical Industry Co., Ltd.), a novolak resin, and 2,2', 3,3'-tetrahydro-3,3,3', 3'-tetramethyl-1,1'-spirobi(1H-indene)-5,5', 6,6', 7,7'-hexanol, which are not limited thereto.

Specific examples of the amino compound include aniline, methylaniline, diethylamine, butylamine, 1,4-phenylenediamine, 1,3-phenylenediamine, 4,4'-diaminodiphenyl ether, 4,4'-diaminodiphenylmethane, 4,4'-diaminodiphenylsulfone, and 4,4'-diaminodiphenylsulfide, which are not limited thereto.

In addition, specific examples of the polyhydroxypolyamino compound include 2,2-bis(3-amino-4-hydroxyphenyl)hexafluoropropane and 3,3'-dihydroxybenzidine, which are not limited thereto.

Among these, the quinone diazide compound preferably includes an ester of a phenol compound and a 4-naphthoquinone diazidosulfonyl group. This makes it possible to obtain higher sensitivity to the i-line exposure and higher resolution.

The content of the quinone diazide compound that is used in the resin composition according to the embodiment of the present invention is preferably 1 to 50 parts by mass and more preferably 10 to 40 parts by mass with respect to 100 parts by mass of the resin. It is preferable that the content of the quinone diazide compound is set in this range since the contrast between the exposed portion and the non-exposed portion can be obtained, whereby the sensitivity can be increased. Further, a sensitizing agent or the like may be added as necessary.

The photoacid generator is preferably a compound containing an oxime sulfonate group (hereinafter, also simply referred to as an "oxime sulfonate compound").

The oxime sulfonate compound is not particularly limited as long as it has an oxime sulfonate group; however, examples thereof include the compounds described in paragraphs 0118 to 0124 of WO2020/195995A. The content thereof is incorporated in the present specification.

In addition, preferred examples thereof also include compounds represented by the following structural formulae.

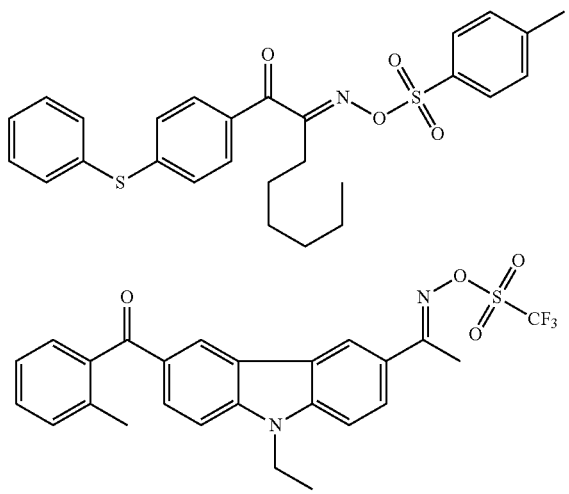

Examples of the organic halogenated compound include the compounds described in paragraphs 0042 to 0043 of JP2015-087409A. The content thereof is incorporated in the present specification.

Examples of the organic borate compound include the compounds described in paragraph 0055 of JP2015-087409A. The content thereof is incorporated in the present specification.

Examples of the disulfone compound include the compounds disclosed in JP1986-166544A (JP-S61-166544A), JP2002-328465, and the like, and a diazodisulfone compound.

Examples of the onium salt compound include the onium salts such as the diazonium salt disclosed in S. I. Schlesinger, Photogr. Sci. Eng., 18,387 (1974), T. S. Bal et al., Polymer, 21, 423 (1980), the ammonium salts disclosed in U.S. Pat. No. 4,069,055A, JP1992-365049A (JP-H4-365049A), and the like, the phosphonium salts disclosed in U.S. Pat. Nos. 4,069,055A and 4,069,056A; the iodonium salts disclosed in EP104143B, US339049A, US410201A, JP1990-150848A (JP-H2-150848A), and JP1990-296514A (JP-H2-296514A), EP370693B, EP390214B, EP233567B, EP297443B, EP297442B, U.S. Pat. No. 4,933,377A, US161811A, US410201A, US339049A, U.S. Pat. Nos. 4,760,013A, 4,734,444A, 2,833,827A, GP2904626B, GP3604580B, and GP3604581B, the selenonium salt disclosed in J. V. Crivello et al., Macromolecules, 10 (6), 1307 (1977), J. V. Crivello et al., J. Polymer Sci., Polymer Chem. Ed., 17, 1047 (1979), and the arsonium salt and the pyridinium salt disclosed in C. S. Wen et al., Teh, Proc. Conf. Rad. Curing ASIA, p478 Tokyo, October (1988), the contents of which are incorporated in the present specification.

Regarding the amount of the photoacid generator with respect to the total solid content of the resin composition, 0.1% to 20% by mass is preferably used, 0.5% to 18% by mass is more preferably used, 0.5% to 10% by mass is still more preferably used, 0.5% to 3% by mass is even still more preferably used, and 0.5 to 1.2% by mass is even further still more preferably used.

One kind of photoacid generator may be used alone, or a plurality of kinds thereof may be used in combination. In the case of the combination of a plurality of kinds, it is preferable that the total amount thereof is within the above range.

In addition, in order to impart photosensitivity to a desired light source, it is also preferable to use a sensitizing agent in combination.

<Base Generator>

The resin composition according to the present invention may contain a base generator. Here, the base generator is a compound that is capable of generating a base under a physical or chemical action. Examples of the preferred base generator for the resin composition according to the embodiment of the present invention include a thermal-base generator and a photobase generator.

In particular, in a case where the resin composition contains a precursor of a cyclization resin, it is preferable that the resin composition contains a base generator. In a case where the resin composition contains a thermal-base generator, it is possible to, for example, accelerate the cyclization reaction of the precursor by heating, whereby the mechanical properties and chemical resistance of the cured substance are improved and for example, the performance as an interlayer insulating film for a re-distribution layer, included in a semiconductor package, is improved.

The base generator may be an ionic base generator a nonionic base generator. Examples of the base that is generated from the base generator include a secondary amine and a tertiary amine.

The base generator according to the embodiment of the present invention is not particularly limited, and a known base generator can be used. It is possible to use a known base generator, for example, a carbamoyloxime compound, a carbamoylhydroxylamine compound, a carbamic acid compound, a formamide compound, an acetamide compound, a carbamate compound, a benzylcarbamate compound, a nitrobenzylcarbamate compound, a sulfonamide compound, an imidazole derivative compound, an aminimide compound, a pyridine derivative compound, an α-aminoacetophenone derivative compound, a quaternary ammonium salt derivative compound, a pyridinium salt, an α-lactone ring derivative compound, a phthalimide derivative compound, or an acyloxyimino compound.

Specific examples of the compound of the nonionic base generator include compounds represented by Formula (B1), Formula (B2), or Formula (B3).

$$Rb^1\diagdown N-\overset{\overset{O}{\|}}{C}-Rb^3$$
$$Rb^2\diagup$$

(B1)

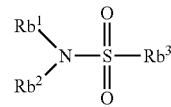

(B2)

In Formulae (B1) and (B2), $Rb^1$, $Rb^2$, and $Rb^3$ are each independently an organic group that does not have a tertiary amine structure, a halogen atom, or a hydrogen atom. However, $Rb^1$ and $Rb^2$ are not hydrogen atoms at the same time. Further, none of $Rb^1$, $Rb^2$, and $Rb^3$ have a carboxy group. In the present specification, the tertiary amine structure refers to a structure in which all three bonding sites of a trivalent nitrogen atom are covalently bonded to hydrocarbon-based carbon atoms. For this reason, this is not applied in a case where the carbon atom to which the bonding site bonded is a carbon atom forming a carbonyl group, that is, in a case where an amide group is formed by bonding together with a nitrogen atom.

In Formulae (B1) and (B2), a cyclic structure is preferably contained in at least one of $Rb^1$, $Rb^2$, or $Rb^3$ and is more preferably contained in at least two thereof. The cyclic structure may be any one of a monocyclic ring or a fused ring and is preferably a monocyclic ring or a fused ring in which two monocyclic rings are fused. The monocyclic ring is preferably a 5-membered ring or a 6-membered ring, and more preferably a 6-membered ring. The monocyclic ring is preferably a cyclohexane ring or a benzene ring, and more preferably a cyclohexane ring.

More specifically, $Rb^1$ and $Rb^2$ are preferably a hydrogen atom, an alkyl group (preferably having 1 to 24 carbon atoms, more preferably having 2 to 18 carbon atoms, and still more preferably having 3 to 12 carbon atoms), an alkenyl group (preferably having 2 to 24 carbon atoms, more preferably having 2 to 18 carbon atoms, and still more preferably having 3 to 12 carbon atoms), an aryl group (preferably having 6 to 22 carbon atoms, more preferably having 6 to 18 carbon atoms, and still more preferably having 6 to 10 carbon atoms), or an arylalkyl group (preferably having 7 to 25 carbon atoms, more preferably having 7 to 19 carbon atoms, and still more preferably having 7 to 12 carbon atoms). These groups may have substituents as long as the effect of the present invention is exhibited. $Rb^1$ and $Rb^2$ may be bonded to each other to form a ring. The ring to be formed is preferably a 4- to 7-membered nitrogen-containing heterocycle. Particularly, $Rb^1$ and $Rb^2$ are preferably a linear, branched, or cyclic alkyl groups (preferably having 1 to 24 carbon atoms, more preferably 2 to 18 carbon atoms, and still more preferably having 3 to 12 carbon atoms) which may have a substituent, more preferably a cycloalkyl group (preferably having 3 to 24 carbon atoms, more preferably having 3 to 18 carbon atoms, and still more preferably having 3 to 12 carbon atoms) which may have a substituent, and still more preferably a cyclohexyl group which may have a substituent.

In addition, an aspect in which at least one of $Rb^1$ or $Rb^2$ has an amide group is also one of the preferred aspects of the present invention.

Specifically, examples thereof include an aspect in which at least one of $Rb^1$ or $Rb^2$ is a group represented by Formula (R-1).

(R-1)

In Formula (R-1), $R^{R1}$ represents a divalent organic group, $R^{R2}$ represents a monovalent organic group, X represents an amide group, and * represents a bonding site to another structure.

In Formula (R-1), $R^{R1}$ is preferably a hydrocarbon group or a group represented by a bond between a hydrocarbon group and at least one structure selected from the group consisting of —O—, —C(=O)—, —S—, —SO$_2$—, and —NR—. The above R represents a hydrogen atom or a monovalent organic group, and it is preferably a hydrogen atom or a hydrocarbon group, more preferably a hydrogen atom or an alkyl group, and still more preferably a hydrogen atom. However, it is preferable that each of the bonding sites at which $L^1$ is bonded to two nitrogen atoms is a hydrocarbon group.

The hydrocarbon group in $R^{R1}$ may be an aromatic hydrocarbon group or an aliphatic hydrocarbon group; however, it is preferably an aliphatic hydrocarbon group, and more preferably a saturated aliphatic hydrocarbon group. In addition, the hydrocarbon group may further have a known substituent within the scope in which the effect of the present invention is obtained.

In Formula (R-1), the direction of the amide group in X is not particularly limited, and the amide group in X may be bonded to $R^{R1}$ on the carbon atom side or may be bonded on the nitrogen atom side.

In Formula (R-1), $R^{R2}$ is preferably a hydrocarbon group or a group represented by a bond between a hydrocarbon group and at least one structure selected from the group consisting of —O—, —C(=O)—, —S—, —SO$_2$—, and —NR—. The above R is the same as R in the above $R^{R1}$, and the same applies to the preferred aspect thereof.

The hydrocarbon group in $R^{R2}$ may be an aromatic hydrocarbon group or an aliphatic hydrocarbon group; however, it is preferably an aliphatic hydrocarbon group. In addition, the hydrocarbon group may further have a known substituent within the scope in which the effect of the present invention is obtained.

(R-1)

In addition, it is also preferable that the group represented by Formula (R-1) is a group represented by Formula (R-2).

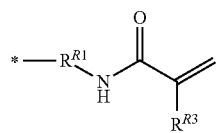

(R-2)

In Formula (R-2), $R^{R1}$ represents a divalent organic group, $R^{R3}$ represents a hydrogen atom or a methyl group, and * represents a bonding site to another structure.

In Formula (R-2), a preferred aspect of $R^{R1}$ is the same as the preferred aspect of $R^{R1}$ in Formula (R-1).

Examples of $Rb^3$ include an alkyl group (preferably having 1 to 24 carbon atoms, more preferably having 2 to 18 carbon atoms, and still more preferably having 3 to 12 carbon atoms), an aryl group (preferably having 6 to 22 carbon atoms, more preferably having 6 to 18 carbon atoms, and still more preferably having 6 to 10 carbon atoms), an alkenyl group (preferably having 2 to 24 carbon atoms, more preferably having 2 to 12 carbon atoms, and still more preferably having 2 to 6 carbon atoms), an arylalkyl group (preferably having 7 to 23 carbon atoms, more preferably having 7 to 19 carbon atoms, and still more preferably having 7 to 12 carbon atoms), an arylalkenyl group (preferably having 8 to 24 carbon atoms, more preferably having 8 to 20 carbon atoms, and still more preferably having 8 to 16 carbon atoms), an alkoxy group (preferably having 1 to 24 carbon atoms, more preferably having 2 to 18 carbon atoms, and still more preferably having 3 to 12 carbon atoms), an aryloxy group (preferably having 6 to 22 carbon atoms, more preferably having 6 to 18 carbon atoms, and still more preferably having 6 to 12 carbon atoms), and an arylalkyloxy group (preferably having 7 to 23 carbon atoms, more preferably having 7 to 19 carbon atoms, and still more preferably having 7 to 12 carbon atoms). Among the above, a cycloalkyl group (preferably having 3 to 24 carbon atoms, more preferably 3 to 18 carbon atoms, and still more preferably 3 to 12 carbon atoms), an arylalkenyl group, or an arylalkyloxy group is preferable. $Rb^3$ may further have a substituent as long as the effect of the present invention is exhibited.

The compound represented by Formula (B1) is preferably a compound represented by Formula (B1-1) or Formula (B1-2).

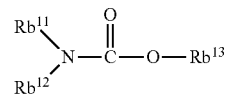

(B1-1)

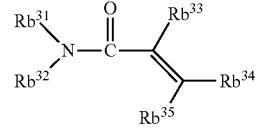

(B1-2)

In the formula, $Rb^{11}$ and $Rb^{12}$, and $Rb^{31}$ and $Rb^{32}$ are each the same as $Rb^1$ and $Rb^2$ in Formula (B1).

$Rb^{13}$ is an alkyl group (preferably having 1 to 24 carbon atoms, more preferably having 2 to 18 carbon atoms, and still more preferably having 3 to 12 carbon atoms), an alkenyl group (preferably having 2 to 24 carbon atoms, more preferably having 2 to 18 carbon atoms, and still more preferably having 3 to 12 carbon atoms), an aryl group (preferably having 6 to 22 carbon atoms, more preferably having 6 to 18 carbon atoms, and still more preferably having 6 to 12 carbon atoms), or an arylalkyl group (preferably having 7 to 23 carbon atoms, more preferably having 7 to 19 carbon atoms, and still more preferably having 7 to 12 carbon atoms), and may have a substituent as long as the effect of the present invention is exhibited. Among the above, $Rb^{13}$ is preferably an arylalkyl group.

$Rb^{33}$ and $Rb^{14}$ are each independently a hydrogen atom, an alkyl group (preferably having 1 to 12 carbon atoms, more preferably having 1 to 8 carbon atoms, and still more preferably having 1 to 3 carbon atoms), an alkenyl group (preferably having 2 to 12 carbon atoms, more preferably having 2 to 8 carbon atoms, and still more preferably having 2 or 3 carbon atoms), an aryl group (preferably having 6 to 22 carbon atoms, more preferably having 6 to 18 carbon atoms, and still more preferably having 6 to 10 carbon atoms), or an arylalkyl group (preferably having 7 to 23 carbon atoms, more preferably having 7 to 19 carbon atoms, and still more preferably having 7 to 11 carbon atoms), and preferably a hydrogen atom.

$Rb^{35}$ is an alkyl group (preferably having 1 to 24 carbon atoms, more preferably having 1 to 12 carbon atoms, and still more preferably having 3 to 8 carbon atoms), an alkenyl group (preferably having 2 to 12 carbon atoms, more preferably having 2 to 10 carbon atoms, and still more preferably having 3 to 8 carbon atoms), an aryl group (preferably having 6 to 22 carbon atoms, more preferably having 6 to 18 carbon atoms, and still more preferably having 6 to 12 carbon atoms), or an arylalkyl group (preferably having 7 to 23 carbon atoms, more preferably having 7 to 19 carbon atoms, and still more preferably having 7 to 12 carbon atoms), and is preferably an aryl group.

The compound represented by Formula (B1-1) is preferably a compound represented by Formula (B1-1a) as well.

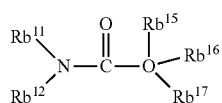

(B1-1a)

$Rb^{11}$ and $Rb^{12}$ respectively have the same meanings as $Rb^{11}$ and $Rb^{12}$ in Formula (B1-1).

$Rb^{15}$ and $Rb^{16}$ are a hydrogen atom, an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, more preferably having 2 to 6 carbon atoms, and still more preferably having 2 or 3 carbon atoms), an aryl group (preferably having 6 to 22 carbon atoms, more preferably having 6 to 18 carbon atoms, and still more preferably having 6 to 10 carbon atoms), or an arylalkyl group (preferably having 7 to 23 carbon atoms, more preferably having 7 to 19 carbon atoms, and still more preferably having 7 to 11 carbon atoms), and preferably a hydrogen atom or a methyl group.

$Rb^{17}$ is an alkyl group (preferably having 1 to 24 carbon atoms, more preferably having 1 to 12 carbon atoms, and still more preferably having 3 to 8 carbon atoms), an alkenyl group (preferably having 2 to 12 carbon atoms, more preferably having 2 to 10 carbon atoms, and still more preferably having 3 to 8 carbon atoms), an aryl group (preferably having 6 to 22 carbon atoms, more preferably having 6 to 18 carbon atoms, and still more preferably having 6 to 12 carbon atoms), or an arylalkyl group (preferably having 7 to 23 carbon atoms, more preferably having 7 to 19 carbon atoms, and still more preferably having 7 to 12 carbon atoms), and among the above, is preferably an aryl group.

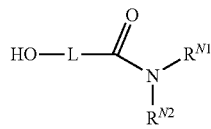

(B3)

In Formula (B3), L represents a hydrocarbon group which is a divalent hydrocarbon group having a saturated hydrocarbon group on a path of a linking chain that links adjacent oxygen atom and carbon atom and in which the number of the atoms on the path of the linking chain is 3 or more. Further, $R^{N1}$ and $R^{N2}$ each independently represent a monovalent organic group.

In the present specification, the "linking chain" refers to an atomic chain which interconnects linking targets shortest (with the minimum number of atoms) among the atomic chains on the path, which interconnects two atoms or a group of atoms to be linked. For example, in the compound represented by the following formula, L is composed of a phenylene ethylene group, has an ethylene group as a saturated hydrocarbon group, and the linking chain is composed of four carbon atoms, and the number of atoms (that is, the number of atoms constituting the linking chain, and hereinafter, also referred to as the "linking chain length" or the "length of linking chain") on the path of the linking chain is 4.

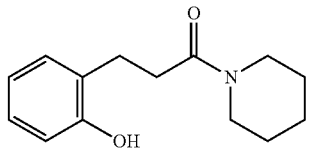 [SMILES: O=C(CCc1ccccc1O)N1CCCCC1]

The number of carbon atoms in L in Formula (B3) (including carbon atoms other than the carbon atoms in the linking chain) is preferably 3 to 24. The upper limit thereof is more preferably 12 or less, still more preferably 10 or less, and particularly preferably 8 or less. The lower limit thereof is more preferably 4 or more. From the viewpoint of rapidly advancing the intramolecular cyclization reaction, the upper limit of the linking chain length of L is preferably 12 or less, more preferably 8 or less, still more preferably 6 or less, and particularly preferably 5 or less. In particular, the linking chain length of L is preferably 4 or 5 and most preferably 4. Specific preferred compounds of the base generator include the compounds described in paragraphs 0102 to 0168 of WO2020/066416A and the compounds described in paragraphs 0143 to 0177 of WO2018/038002A.

In addition, it is also preferable that the base generator includes a compound represented by Formula (N1).

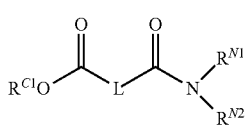

(N1)

In Formula (N1), $R^{N1}$ and $R^{N2}$ each independently represent a monovalent organic group, RC1 represents a hydrogen atom or a protective group, and L represents a divalent linking group.

L is a divalent linking group, and it is preferably a divalent organic group. The linking chain length of the linking group is preferably 1 or more and more preferably 2 or more. The upper limit thereof is preferably 12 or less, more preferably 8 or less, and still more preferably 5 or less. The linking chain length is the number of atoms present in the atom sequence that is the shortest route between the two carbonyl groups in the formula.

$R^{N1}$ and $R^{N2}$ in Formula (N1) each independently represent a monovalent organic group (preferably having 1 to 24 carbon atoms, more preferably 2 to 18 carbon atoms, and still more preferably 3 to 12 carbon atoms), more preferably a hydrocarbon group (preferably having 1 to 24 carbon atoms, more preferably 1 to 12 carbon atoms, and still more preferably 1 to 10 carbon atoms), and specific examples thereof include an aliphatic hydrocarbon group (preferably having 1 to 24 carbon atoms, more preferably 1 to 12 carbon atoms, and still more preferably 1 to 10 carbon atoms) and an aromatic hydrocarbon group (preferably having 6 to 22 carbon atoms, more preferably 6 to 18 carbon atoms, and still more preferably 6 to 10 carbon atoms), and an aliphatic hydrocarbon group is preferable. As $R^{N1}$ and $R^{N2}$, an aliphatic hydrocarbon group is preferably used since the basicity of the base to be generated is high. It is noted that the aliphatic hydrocarbon group and the aromatic hydrocarbon group may have a substituent, and the aliphatic hydrocarbon group and the aromatic hydrocarbon group may have an oxygen atom in an aliphatic hydrocarbon chain, in an aromatic ring, or in a substituent. In particular, an aspect in which the aliphatic hydrocarbon group has an oxygen atom in a hydrocarbon chain is exemplified.

Examples of the aliphatic hydrocarbon group constituting $R^{N1}$ and $R^{N2}$ include a linear or branched chain-like alkyl group, a cyclic alkyl group, a group involved in the combination of a chain-like alkyl group and a cyclic alkyl group, and an alkyl group having an oxygen atom are contained in the chain. The linear or branched chain-like alkyl group preferably has 1 to 24 carbon atoms, more preferably 2 to 18, and still more preferably 3 to 12 carbon atoms. Examples of the linear or branched chain-like alkyl group include a methyl group, an ethyl group, a propyl group, a butyl group, a pentyl group, a hexyl group, a heptyl group, an octyl group, a nonyl group, a decyl group, an undecyl group, a dodecyl group, an isopropyl group, an isobutyl group, a secondary butyl group, a tertiary butyl group, an isopentyl group, a neopentyl group, a tertiary pentyl group, and an isohexyl group.

The cyclic alkyl group preferably has 3 to 12 carbon atoms and more preferably 3 to 6 carbon atoms. Examples of the cyclic alkyl group include a cyclopropyl group, a cyclobutyl group, a cyclopentyl group, a cyclohexyl group, and a cyclooctyl group.

The group involved in the combination of the chain-like alkyl group and the cyclic alkyl group is preferably a group having 4 to 24 carbon atoms, more preferably 4 to 18 carbon atoms, and still more preferably 4 to 12 carbon atoms. Examples of the group involved in the combination of the chain-like alkyl group and the cyclic alkyl group include a cyclohexylmethyl group, a cyclohexylethyl group, a cyclohexylpropyl group, a methylcyclohexylmethyl group, and an ethylcyclohexylethyl group.

The alkyl group having an oxygen atom in the chain preferably has 2 to 12 carbon atoms, more preferably 2 to 6 carbon atoms, and still more preferably 2 to 4 carbon atoms. The alkyl group having an oxygen atom in the chain may be chain-like or cyclic or may be linear or branched.

Among the above, from the viewpoint of increasing the boiling point of the decomposition-generated base described later, $R^{N1}$ and $R^{N2}$ are preferably an alkyl group having 5 to 12 carbon atoms. However, in a prescription in which adhesiveness in a case of carrying out lamination with a metal (for example, copper) layer is important, a group having a cyclic alkyl group or an alkyl group having 1 to 8 carbon atoms is preferable.

$R^{N1}$ and $R^{N2}$ may be linked to each other to form a cyclic structure. In forming the cyclic structure, an oxygen atom or the like may be contained in the chain. The cyclic structure formed by $R^{N1}$ and $R^{N2}$ can be a monocyclic ring or may be a fused ring, but is preferably a monocyclic ring. The cyclic structure to be formed is preferably a 5-membered ring or a 6-membered ring containing a nitrogen atom in Formula (N1), examples thereof include a pyrrole ring, an imidazole ring, a pyrazole ring, a pyrroline ring, a pyrrolidine ring, an imidazolidine ring, a pyrazolidine ring, a piperidine ring, a piperazine ring, and a morpholine ring, and preferred examples thereof include a pyrroline ring, a pyrrolidine ring, a piperidine ring, a piperazine ring, and a morpholine ring.

In addition, at least one of $R^{N1}$ or $R^{N2}$ is preferably the group represented by Formula (R-1) described above, and more preferably the group represented by Formula (R-2) described above.

$R^{C1}$ represents a hydrogen atom or a protective group, and it is preferably a hydrogen atom.

The protective group is preferably a protective group that decomposes under the action of an acid or a base, and examples thereof include a protective group that decomposes by an acid.

Specific examples of the protective group include a chain-like or cyclic alkyl group and a chain-like or cyclic alkyl group having an oxygen atom in the chain. Examples of the chain-like or cyclic alkyl group include a methyl group, an ethyl group, an isopropyl group, a tert-butyl group, and a cyclohexyl group. Specific examples of the chain-like alkyl group having an oxygen atom in the chain include an alkyloxyalkyl group, and more specific examples thereof include a methyloxymethyl (MOM) group and an ethyloxyethyl (EE) group. Examples of the cyclic alkyl group having an oxygen atom in the chain include an epoxy group, a glycidyl group, an oxetanyl group, a tetrahydrofuranyl group, and a tetrahydropyranyl (THP) group.

The divalent linking group constituting L is not particularly determined; however, it is preferably a hydrocarbon group and more preferably an aliphatic hydrocarbon group. The hydrocarbon group may have a substituent or may have an atom of a kind other than the carbon atom in the hydrocarbon chain. More specifically, it is preferably a divalent hydrocarbon linking group which may have an oxygen atom in the chain, more preferably a divalent aliphatic hydrocarbon group which may have an oxygen atom in the chain, a divalent aromatic hydrocarbon group, or a group involved in the combination of the divalent aliphatic hydrocarbon group which may have an oxygen atom in the chain and the divalent aromatic hydrocarbon group, and still more preferably a divalent aliphatic hydrocarbon group which may have an oxygen atom in the chain. It is preferable that these groups do not have an oxygen atom.

The divalent hydrocarbon linking group preferably has 1 to 24 carbon atoms, more preferably 2 to 12 carbon atoms, and still more preferably 2 to 6 carbon atoms. The divalent aliphatic hydrocarbon group preferably has 1 to 12 carbon atoms, more preferably 2 to 6 carbon atoms, and still more preferably 2 to 4 carbon atoms. The divalent aromatic hydrocarbon group preferably has 6 to 22 carbon atoms, more preferably 6 to 18 carbon atoms, and still more preferably 6 to 10 carbon atoms. The group (for example, the arylene alkyl group) involved in the combination of the divalent aliphatic hydrocarbon group and the divalent aromatic hydrocarbon group preferably has 7 to 22 carbon atoms, more preferably 7 to 18, and still more preferably 7 to 10 carbon atoms.

Specifically, the linking group L is preferably a linear or branched chain-like alkylene group, a cyclic alkylene group, a group involved in the combination of a chain-like alkylene group and a cyclic alkylene group, an alkylene group having an oxygen atom in the chain, a linear or branched chain-like alkenylene group, a cyclic alkenylene group, an arylene group, or an arylene alkylene group.

The linear or branched chain-like alkylene group preferably has 1 to 12 carbon atoms, more preferably 2 to 6 carbon atoms, and still more preferably 2 to 4 carbon atoms.

The cyclic alkylene group preferably has 3 to 12 carbon atoms and more preferably 3 to 6 carbon atoms.

The group involved in the combination of the chain-like alkylene group and the cyclic alkylene group is preferably a group having 4 to 24 carbon atoms, more preferably 4 to 12 carbon atoms, and still more preferably 4 to 6 carbon atoms.

The alkylene group having an oxygen atom in the chain may be chain-like or cyclic or may be linear or branched. The alkylene group having an oxygen atom in the chain preferably has 1 to 12 carbon atoms, more preferably 1 to 6 carbon atoms, and still more preferably 1 to 3 carbon atoms.

The linear or branched chain-like alkenylene group preferably has 2 to 12 carbon atoms, more preferably 2 to 6 carbon atoms, and still more preferably 2 to 3 carbon atoms. The number of C=C bonds in the linear or branched chain-like alkenylene group is preferably 1 to 10, more preferably 1 to 6, and still more preferably 1 to 3.

The cyclic alkenylene group preferably has 3 to 12 carbon atoms and more preferably 3 to 6 carbon atoms. In the cyclic alkenylene group, the number of C=C bonds is preferably 1 to 6, more preferably 1 to 4, and still more preferably 1 to 2.

The arylene group preferably has 6 to 22 carbon atoms, more preferably 6 to 18 carbon atoms, and still more preferably 6 to 10 carbon atoms.

The arylene alkylene group preferably has 7 to 23 carbon atoms, more preferably 7 to 19, and still more preferably 7 to 11 carbon atoms.

Among the above, a preferred one is a chain-like alkylene group, a cyclic alkylene group, an alkylene group having an oxygen atom in the chain, a chain-like alkenylene group, an arylene group, or an arylene alkylene group, and more preferred one is a 1,2-ethylene group, a propanediyl group (particularly a 1,3-propanediyl group), a cyclohexanediyl group (particularly a 1,2-cyclohexanediyl group), a vinylene group (particularly a cisvinylene group), a phenylene group (a 1,2-phenylene group), a phenylene methylene group (particularly a 1,2-phenylene methylene group) or an ethyleneoxyethylene group (particularly a 1,2-ethyleneoxy-1,2-ethylene group).

Examples of the thermal base generator include the following examples, but the present invention is not construed as being limited thereto.

-continued

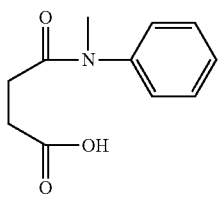
(B-10)

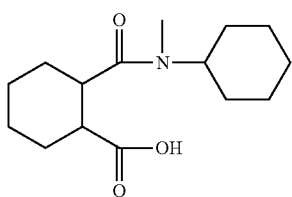
(B-11)

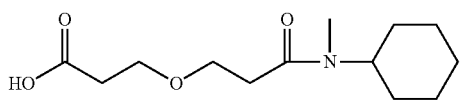
(B-12)

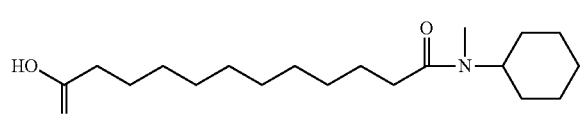
(B-13)

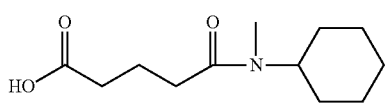
(B-14)

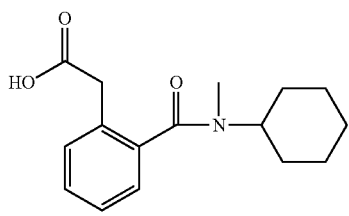
(B-15)

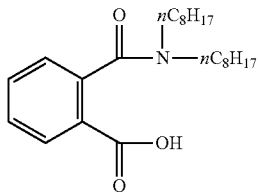
(B-16)

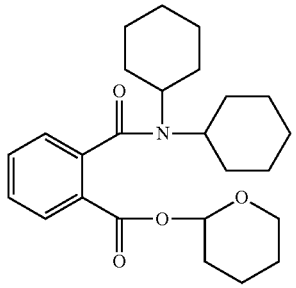
(B-17)

-continued

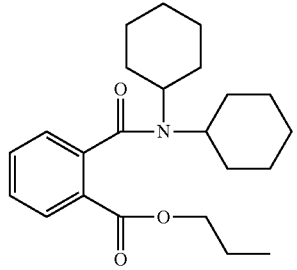
(B-18)

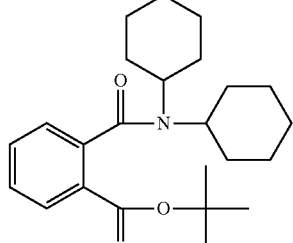
(B-19)

The molecular weight of the nonionic base generator is preferably 800 or less, more preferably 600 or less, and still more preferably 500 or less. The lower limit thereof is preferably 100 or more, more preferably 200 or more, and still more preferably 300 or more.

Examples of the specific preferred compound of the ionic base generator include the compounds described in paragraphs 0148 to 0163 of WO2018/038002A.

Specific examples of the ammonium salt include compounds shown below; however, the present invention is not limited thereto.

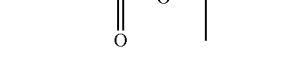

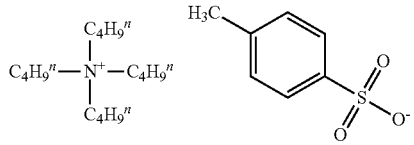

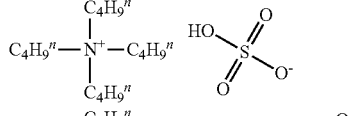

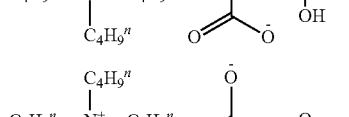

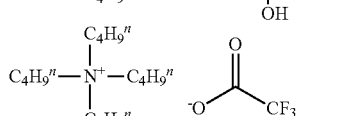

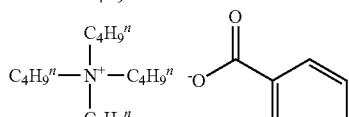

-continued

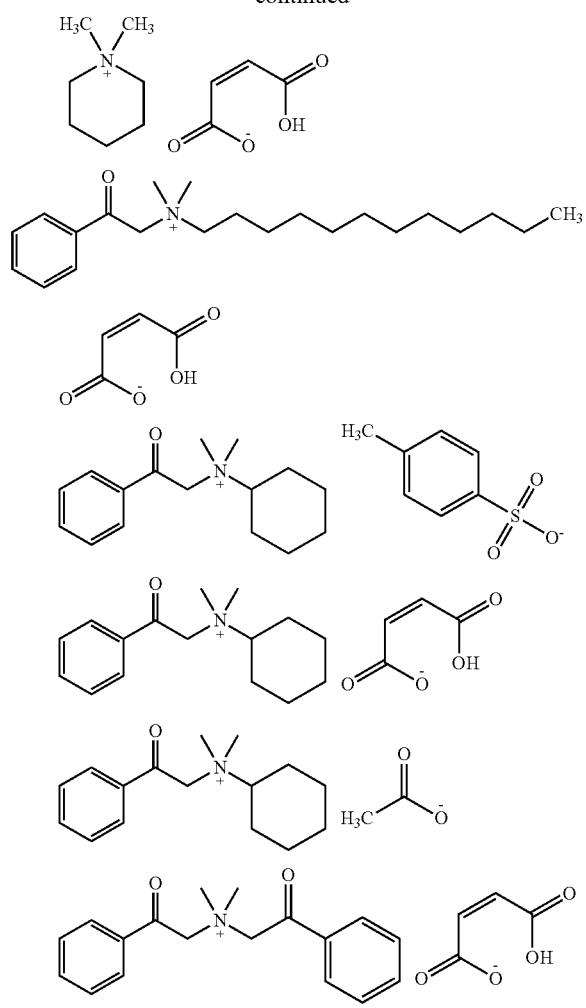

Specific examples of the iminium salt include compounds shown below; however, the present invention is not limited thereto.

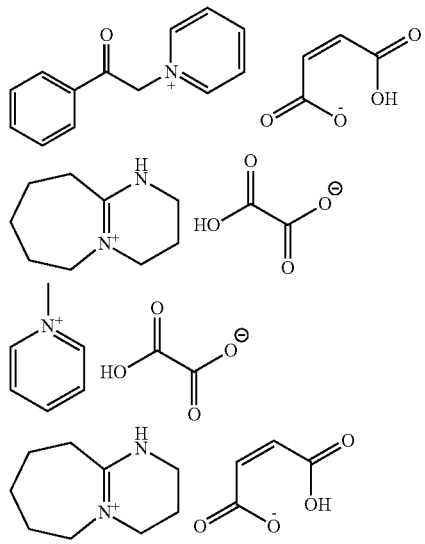

-continued

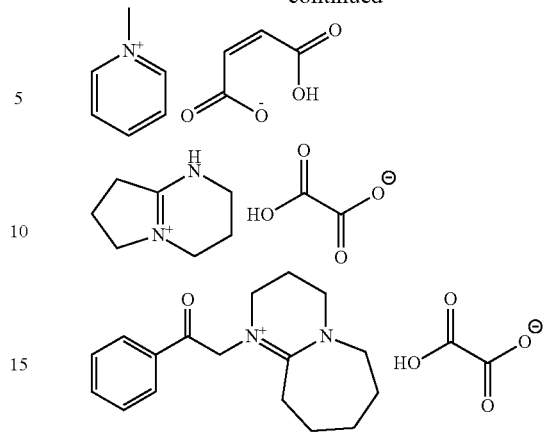

In a case where the resin composition according to the present invention contains a base generator, the content of the base generator is preferably 0.1 to 50 parts by mass with respect to 100 parts by mass of the resin in the resin composition according to the present invention. The lower limit thereof is preferably 0.3 parts by mass or more and more preferably 0.5 parts by mass or more. The upper limit thereof is more preferably 30 parts by mass or less, still more preferably 20 parts by mass or less, and even still more preferably 10 parts by mass or less, and it may be 5 parts by mass or less or may be 4 parts by mass or less.

One kind or two or more kinds of base generators can be used. In a case where two or more kinds thereof are used, the total amount is preferably within the above-described range.

<Solvent>

The resin composition according to the present invention preferably contains a solvent.

As the solvent, any known solvent can be used. The solvent is preferably an organic solvent. Examples of the organic solvent include compounds such as esters, ethers, ketones, cyclic hydrocarbons, sulfoxides, amides, ureas, and alcohols.

Suitable examples of the esters include ethyl acetate, n-butyl acetate, isobutyl acetate, hexyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl alkyloxyacetate (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (for example, methyl 3-alkyloxypropionate, and ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, ethyl 2-oxobutanoate, ethyl hexanoate, ethyl heptanoate, dimethyl malonate, and diethyl malonate.

Suitable examples of ethers include ethylene glycol dimethyl ether, diethylene glycol dimethyl ether, diethylene glycol diethyl ether, diethylene glycol ethyl methyl ether, diethylene glycol butyl methyl ether, triethylene glycol dimethyl ether, tetraethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol dimethyl ether, propylene glycol monomethyl ether acetate, propylene glycol monoethyl ether acetate, ethylene glycol monobutyl ether, ethylene glycol monobutyl ether acetate, diethylene glycol ethyl methyl ether, propylene glycol monopropyl ether acetate, and dipropylene glycol dimethyl ether.

Suitable examples of the ketones include methyl ethyl ketone, cyclohexanone, cyclopentanone, 2-heptanone, 3-heptanone, 3-methylcyclohexanone, levoglucosenone, and dihydrolevoglucosenone.

Suitable examples of the cyclic hydrocarbon include aromatic hydrocarbons such as toluene, xylene, and anisole, and cyclic terpenes such as limonene.

Suitable examples of the sulfoxides include dimethyl sulfoxide.

Suitable examples of the amide include N-methyl-2-pyrrolidone, N-ethyl-2-pyrrolidone, N-cyclohexyl-2-pyrrolidone, N,N-dimethylacetamide, N,N-dimethylformamide, N,N-dimethylisobutylamide, 3-methoxy-N,N-dimethylpropionamide, 3-butoxy-N,N-dimethylpropionamide, N-formylmorpholine, and N-acetylmorpholine.

Suitable examples of the urea include N,N,N',N'-tetramethylurea and 1,3-dimethyl-2-imidazolidinone.

Examples of the alcohols include methanol, ethanol, 1-propanol, 2-propanol, 1-butanol, 1-pentanol, 1-hexanol, benzyl alcohol, ethylene glycol monomethyl ether, 1-methoxy-2-propanol, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methylphenyl carbinol, n-amyl alcohol, methylamyl alcohol, and diacetone alcohol.

From the viewpoint of improving the properties of a coated surface or the like, it is also preferable to mix two or more kinds of solvents.

In the present invention, the solvent is preferably one solvent selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, N-methyl-2-pyrrolidone, propylene glycol methyl ether, and propylene glycol methyl ether acetate, levoglucosenone, or dihydrolevoglucosenone, or a mixed solvent composed of two or more solvents selected therefrom. It is particularly preferable to use dimethyl sulfoxide and γ-butyrolactone in combination, or N-methyl-2-pyrrolidone and ethyl lactate in combination.

From the viewpoint of coatability, the content of the solvent is such an amount that the concentration of the total solid contents of the resin composition according to the present invention is preferably 5% to 80% by mass, more preferably 5% to 75% by mass, still more preferably 10% to 70% by mass, and even still more preferably 20% to 70% by mass. The content of the solvent may be adjusted depending on the desired thickness of the coating film and the coating method.

The resin composition according to the present invention may contain only one kind of solvent or two or more kinds thereof. In a case where two or more kinds of solvents are contained, the total thereof is preferably within the above-described range.

<Metal Adhesiveness Improving Agent>

The resin composition according to the present invention preferably contains a metal adhesiveness improving agent for improving adhesiveness to a metal material used for an electrode or a wiring line. Examples of the metal adhesiveness improving agent include a silane coupling agent having an alkoxysilyl group, an aluminum-based auxiliary adhesive agent, a titanium-based auxiliary adhesive agent, a compound having a sulfonamide structure and a compound having a thiourea structure, a phosphoric acid derivative compound, a p-ketoester compound, and an amino compound.

[Silane Coupling Agent]

Examples of the silane coupling agent include the compounds described in paragraph 0167 of WO2015/199219A, the compounds described in paragraphs 0062 to 0073 of JP2014-191002A, the compounds described in paragraphs 0063 to 0071 of WO2011/080992A, the compounds described in paragraphs 0060 and 0061 of JP2014-191252A, the compounds described in paragraphs 0045 to 0052 of JP2014-041264A, the compounds described in paragraph 0055 of WO2014/097594A, and the compounds described in paragraphs 0067 to 0078 of JP2018-173573A, the contents of which are incorporated in the present specification. In addition, it is also preferable to use two or more kinds of different silane coupling agents as described in paragraphs 0050 to 0058 of JP2011-128358A. In addition, as the silane coupling agent, the following compounds are also preferably used. In the following formulae, Me represents a methyl group, and Et represents an ethyl group.

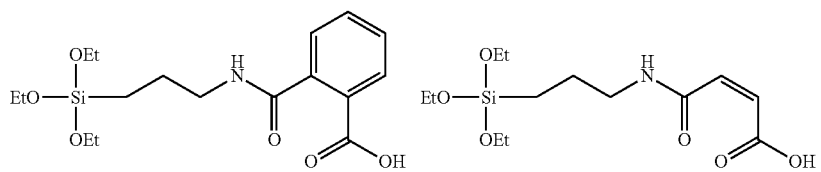

-continued

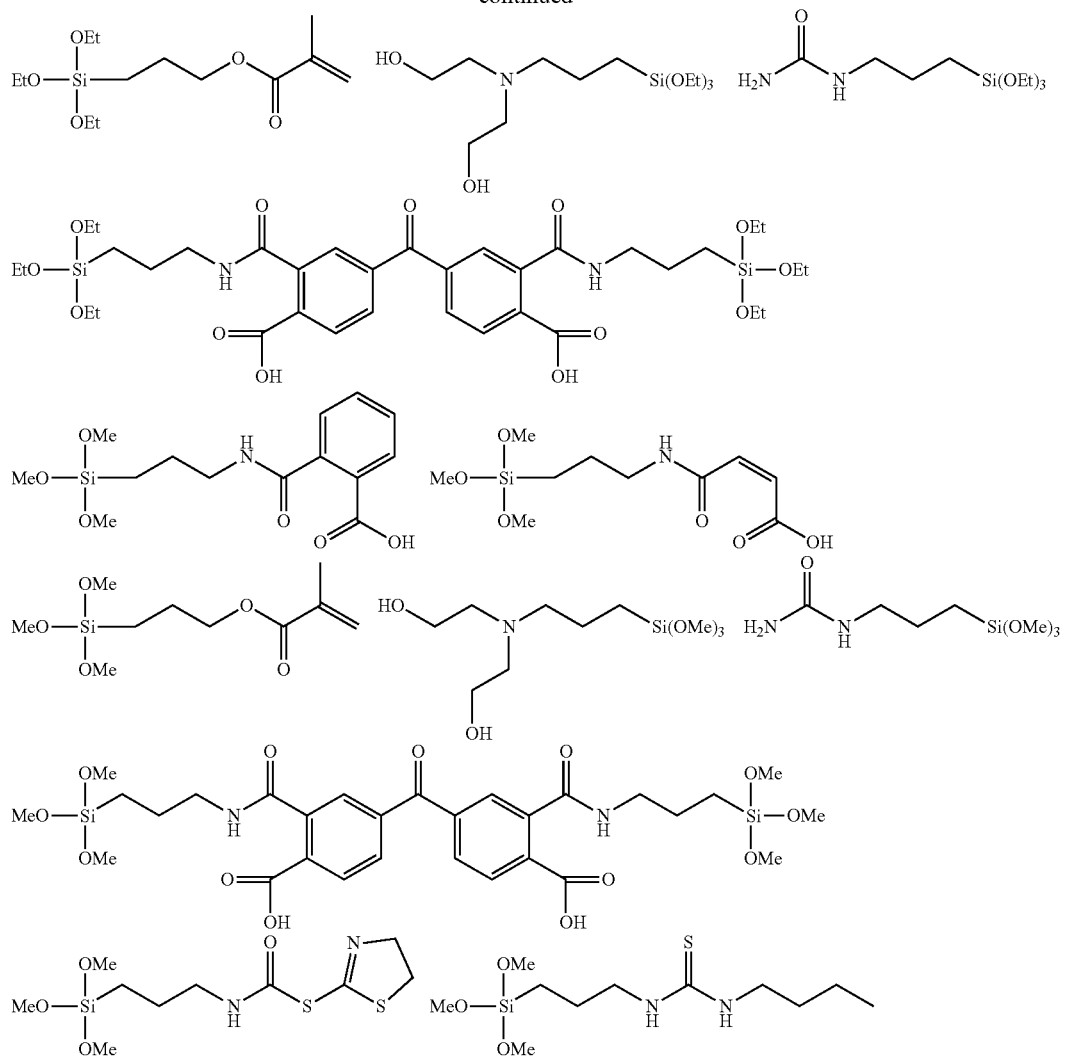

Examples of the other silane coupling agent include vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, tris-(trimethoxysilylpropyl)isocyanurate, a 3-ureidopropyltrialkoxysilane, 3-mercaptopropylmethyldimethoxysilane, 3-mercaptopropyltrimethoxysilane, 3-isocyanatepropyltriethoxysilane, and a 3-trimethoxysilylpropylsuccinic acid anhydride. These can be used alone or in a combination of two or more thereof.

[Aluminum-Based Auxiliary Adhesive Agent]

Examples of the aluminum-based auxiliary adhesive agent include aluminum tris(ethyl acetoacetate), aluminum tris(acetyl acetate), and ethyl acetoacetate aluminum diisopropylate.

In addition, as another metal adhesiveness improving agent, the compounds described in paragraphs 0046 to 0049 of JP2014-186186A, and the sulfide-based compounds described in paragraphs 0032 to 0043 of JP2013-072935A can also be used, the contents of which are incorporated in the present specification.

The content of the metal adhesiveness improving agent is preferably 0.01 to 30 parts by mass, more preferably in a range of 0.1 to 10 parts by mass, and still more preferably in a range of 0.5 to 5 parts by mass, with respect to 100 parts by mass of the specific resin. In a case where the content is set to be equal to or higher than the above lower limit value, good adhesiveness between a pattern and a metal layer is exhibited, and in a case where the content is set to be equal to or lower than the above upper limit value, good heat resistance of the pattern and good mechanical properties are exhibited. One kind of metal adhesiveness improving agent may be used, or two or more kinds thereof may be used. In a case where two or more kinds thereof are used, the total content thereof is preferably within the above-described range.

<Migration Suppressing Agent>

The resin composition according to the present invention preferably further contains a migration suppressing agent.

The incorporation of the migration suppressing agent makes it possible to effectively inhibit the movement of metal ions derived from a metal layer (a metal wire) into a film.

The migration suppressing agent is not particularly limited; however, examples thereof include a compound having a heterocycle (a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimidine ring, a pyrazine ring, a piperidine ring, a piperazine ring, a morpholine ring, a 2H-pyran ring and a 6H-pyran ring, or a triazine ring), a compound having thioureas and a sulfanyl group, a hindered phenol-based compound, a salicylic acid derivative-based compound, and a hydrazide derivative-based compound. In particular, it is possible to preferably use a triazole-based compound such as 1,2,4-triazole, benzotriazole, 3-amino-1,2,4-triazole, or 3,5-diamino-1,2,4-triazole, or a tetrazole-based compound such as 1H-tetrazole, 5-phenyltetrazole or 5-amino-1H-tetrazole.

Alternatively, an ion trapping agent that captures an anion such as a halogen ion can also be used.

As other migration suppressing agents, the rust inhibitors described in paragraph 0094 of JP2013-015701A, the compounds described in paragraphs 0073 to 0076 of JP2009-283711A, the compounds described in paragraph 0052 of JP2011-059656A, the compounds described in paragraphs 0114, 0116, and 0118 of JP2012-194520A, the compounds described in paragraph 0166 of WO2015/199219A, or the like can be used, the contents of which are incorporated in the present specification.

The following compounds can be mentioned as specific examples of the migration suppressing agent.

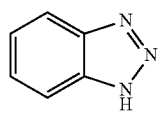
M-1

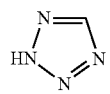
M-2

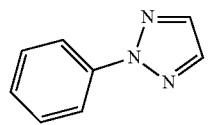
M-3

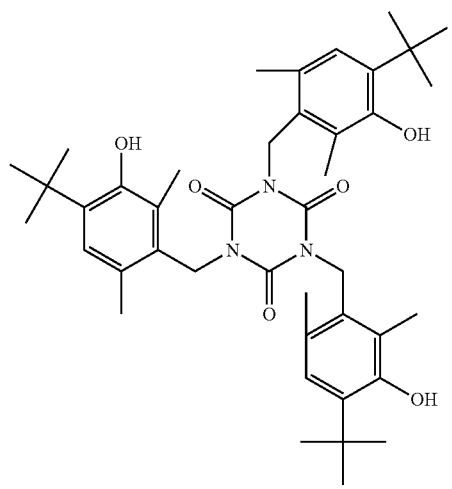
M-4

In a case where the resin composition according to the present invention contains the migration suppressing agent, the content of the migration suppressing agent is preferably 0.01% to 5.0% by mass, more preferably 0.05% to 2.0% by mass, and still more preferably 0.1% to 1.0% by mass, with respect to the total solid content of the resin composition according to the present invention.

One kind of migration suppressing agent may be used alone, or two or more kinds thereof may be used. In a case where two or more kinds of migration suppressing agents are used, the total thereof is preferably within the above-described range.

<Polymerization Inhibitor>

The resin composition according to the present invention preferably contains a polymerization inhibitor. Examples of the polymerization inhibitor include a phenol-based compound, a quinone-based compound, an amino-based compound, an N-oxyl-free radical-based compound, a nitro-based compound, a nitroso-based compound, a heteroaromatic ring-based compound, and a metal compound.

Examples of the specific polymerization inhibitor include the same compound as the above-described specific compound of the polymerization inhibitor contained in the treatment liquid.

For example, those having a small molecular weight and easily volatilizing are preferable. Specifically, the molecular weight thereof is preferably 300 or less, and more preferably 200 or less.

In a case where the resin composition according to the present invention has a polymerization inhibitor, the content of the polymerization inhibitor is preferably 0.01% to 20% by mass, more preferably 0.02% to 15% by mass, and still more preferably 0.05% to 10% by mass, with respect to the total solid content of the resin composition according to the present invention.

One kind of polymerization inhibitor may be used, or two or more kinds thereof may be used. In a case where two or more kinds of polymerization inhibitors are used, the total thereof is preferably within the above-described range.

<Other Additives>

The resin composition according to the present invention can be blended with various additives as necessary, for example, a surfactant, a higher fatty acid derivative, inorganic particles, an ultraviolet absorbing agent, an organic titanium compound, an antioxidant, an aggregation preventing agent, a phenol-based compound, another polymer compound, a plasticizer, and other auxiliary adhesive agents (for example, an antifoaming agent, and a flame retardant) within the scope in which the effect of the present invention is obtained. By appropriately containing these components, properties such as film properties can be adjusted. The details of the components can be found in, for example, paragraphs "0183" and later of JP2012-003225A (corresponding to paragraph "0237" of US2013/0034812A) and paragraphs "0101" to "0104" and "0107" to "0109" of JP2008-250074A, the contents of which are incorporated in the present specification. In a case where these additives are blended, the total blending amount thereof is preferably set to 3% by mass or less of the solid content of the resin composition according to the present invention.

[Surfactant]

As the surfactant, various surfactants such as a fluorine-based surfactant, a silicone-based surfactant, and a hydrocarbon-based surfactant can be used. The surfactant may be a nonionic surfactant, a cationic surfactant, or an anionic surfactant.

In a case where a surfactant is contained in the resin composition according to the embodiment of the present invention, the liquid characteristics (particularly, the fluidity) in a case of being prepared as a coating liquid are further improved, and thus the uniformity of the coating thickness and the liquid saving property can be further improved. That is, in a case where a film is formed using a coating liquid to which a composition containing a surfactant is applied, the interfacial tension between a surface to be coated and a coating liquid is reduced, the wettability to the surface to be coated is improved, and thus the coatability to the surface to be coated is improved. Therefore, a film having a uniform thickness with reduced unevenness in thickness can be formed more suitably.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, RS-72-K (all of which manufactured by DIC Corporation); Florard FC430, Florard FC431, Florard FC171, Novec FC4430, and Novec FC4432 (all of which manufactured by 3M Japan Limited); Surflon S-382, Surflon SC-101, Surflon SC-103, Surflon SC-104, Surflon SC-105, Surflon SC-1068, Surflon SC-381, Surflon SC-383, Surflon S-393, and Surflon KH-40 (all of which manufactured by AGC Inc.); and PF636, PF656, PF6320, PF6520, and PF7002 (manufactured by OMNOVA Solutions Inc.). As the fluorine-based surfactant, the compounds described in paragraphs 0015 to 0158 of JP2015-117327A and the compounds described in paragraphs 0117 to 0132 of JP2011-132503A can also be used, the contents of which are incorporated in the present specification. A block polymer can also be used as the fluorine-based surfactant, and specific examples thereof include the compound described in JP2011-89090A, the content of which is incorporated in the present specification.

As the fluorine-based surfactant, a fluorine-containing polymer compound containing a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used, and examples of the fluorine-based surfactant that is used in the present invention include the following compounds as well.

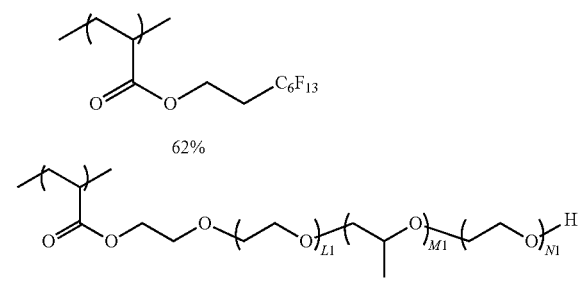

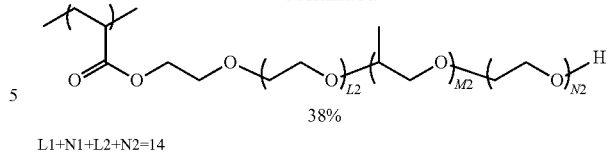

L1+N1+L2+N2=14
M1+M2=17

The weight-average molecular weight of the compounds is preferably 3,000 to 50,000 and more preferably 5.000 to 30,000.

Regarding the fluorine-based surfactant, a fluorine-containing polymer having an ethylenically unsaturated group in the side chain can also be used as the fluorine-based surfactant. Specification examples thereof include the compounds described in paragraphs "0050" to "0090" and "0289" to "0295" of JP2010-164965A, the content of which is incorporated in the present specification. Further, examples of the commercially available product thereof include MEGAFACE RS-101, RS-102, and RS-718-K, all manufactured by DIC Corporation.

The fluorine content in the fluorine-based surfactant is preferably 3 to 40% by mass, more preferably 5 to 30% by mass, and particularly preferably 7 to 25% by mass. The fluorine-based surfactant in which the fluorine content is in the above-described range is effective from the viewpoints of the uniformity in the thickness of the coating film and liquid saving properties, and the solubility thereof in the composition is also excellent.

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, TORAY SILICONE SH8400 (all, manufactured by DuPont Toray Specialty Materials K.K.), TSF-4440, TSF-4300, TSF-4445, TSF-4460, TSF-4452 (all of which manufactured by Momentive Performance Materials Inc.), KP-341, KF6001, KF6002 (all of which manufactured by Shin-Etsu Silicone Co., Ltd.), and BYK307, BYK323, and BYK330 (all of which manufactured by BYK Additives & Instruments).

Examples of the hydrocarbon-based surfactant include Pionin A-76, Newkalgen FS-3PG, Pionin B-709, Pionin B-811-N, Pionin D-1004, Pionin D-3104, Pionin D-3605, Pionin, D-6112, Pionin D-2104-D, Pionin D-212, Pionin D-931, Pionin D-941, Pionin D-951, Pionin E-5310, Pionin P-1050-B, Pionin P-1028-P, Pionin P-4050-T (all of which are manufactured by TAKEMOTO OIL & FAT Co., Ltd.) or the like.

Examples of the nonionic surfactant include glycerol, trimethylolpropane, and trimethylolethane, and an ethoxylate and propoxylate thereof (for example, glycerol propoxylate, glycerol ethoxylate, or the like), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester. Examples of the commercially available product include Pluronic (registered trade name) L10, L31, L61, L62, 10R5, 17R2, and 25R2 (manufactured by BASF SE), Tetronic 304, 701, 704, 901, 904, and 150R1 (manufactured by BASF SE), Solsperse 20000 (Lubrizol Japan Limited), NCW-101, NCW-1001, and NCW-1002 (manufactured by FUJIFILM Wako Pure Chemical Corporation), Pionin D-6112, D-6112-W, and D-6315 (manufactured by TAKEMOTO OIL & FAT Co., Ltd.), and OLFINE E1010, SURFYNOL 104, 400, and 440 (manufactured by Nissin Chemical Co., Ltd.).

Specific examples of the cationic surfactant include an organosiloxane polymer KP-341 (manufactured by Shin-Etsu Chemical Co., Ltd.), a (meth)acrylic acid-based (co) polymer POLYFLOW No. 75, No. 77, No. 90, or No. 95 (manufactured by Kyoeisha Chemical Co., Ltd.), WO01 (manufactured by Yusho Co., Ltd.).

Specific examples of the anionic surfactant include WO04, WO05, WO17 (manufactured by Yusho Co., Ltd.), and SANDET BL (manufactured by Sanyo Chemical Industries, Ltd.).

Only one kind of surfactant may be used, or two or more kinds thereof may be used in combination.

The content of the surfactant is preferably 0.001% to 2.0% by mass and more preferably 0.005% to 1.0% by mass with respect to the total solid content of the composition.

[Higher Fatty Acid Derivative]

In the resin composition according to the present invention, in order to prevent polymerization inhibition due to oxygen, a higher fatty acid derivative such as behenic acid or behenic acid amide may be added and be caused to be localized on the surface of the resin composition according to the present invention in the process of drying after coating.

In addition, as the higher fatty acid derivative, the compounds described in paragraph 0155 of WO2015/199219A can also be used, the content of which is incorporated in the present specification.

In a case where the resin composition according to the present invention has a higher fatty acid derivative, the content of the higher fatty acid derivative is preferably 0.1% to 10% by mass with respect to the total solid content of the resin composition according to the present invention. One kind of higher fatty acid derivative may be used, or two or more kinds thereof may be used. In a case where two or more kinds of higher fatty acid derivatives are used, the total thereof is preferably within the above-described range.

[Thermal Polymerization Initiator]

The resin composition according to the present invention may contain a thermal polymerization initiator and particularly may contain a thermal radical polymerization initiator. The thermal radical polymerization initiator is a compound that generates a radical by heat energy and initiates or accelerates a polymerization reaction of a compound having polymerization properties. In a case where a thermal radical polymerization initiator is added, the polymerization reaction of the resin and the polymerizable compound can be allowed to proceed, and thus the solvent resistance can be further improved. In addition, there is a case where the above-described photopolymerization initiator also has a function of initiating polymerization by heat, and thus there is a case where it can be added as a thermal polymerization initiator.

Specific examples of thermal radical polymerization initiator include compounds described in paragraphs 0074 to 0118 of JP2008-063554A, the content of which is incorporated in the present specification.

In a case where thermal polymerization initiator is contained, the content thereof is preferably 0.1% to 30% by mass, with respect to the total solid content of the resin composition according to the present invention, more preferably 0.1% to 20% by mass, and still more preferably 0.5% to 15% by mass. Only one kind of thermal polymerization initiator may be contained, or two or more kinds thereof may be contained. In a case where two or more kinds of thermal polymerization initiators are contained, the total amount thereof is preferably within the above-described range.

[Inorganic Particle]

The resin composition according to the present invention may contain inorganic particles. Specific examples of the inorganic particle include calcium carbonate, calcium phosphate, silica, kaolin, talc, titanium dioxide, alumina, barium sulfate, calcium fluoride, lithium fluoride, zeolite, molybdenum sulfide, glass, and boron nitride.

The average particle diameter of the inorganic particles is preferably 0.01 to 2.0 µm, more preferably 0.02 to 1.5 µm, still more preferably 0.03 to 1.0 µm, and particularly preferably 0.04 to 0.5 µm.

The average particle diameter of the inorganic particles is the primary particle diameter and the volume average particle diameter. The volume average particle diameter can be measured by a dynamic light scattering method with Nanotrac WAVE II EX-150 (manufactured by Nikkiso Co., Ltd.). In a case where the above measurement is difficult, the measurement can also be carried out by a centrifugal sedimentation light transmission method, an X-ray transmission method, or a laser diffraction/light scattering method.

[Ultraviolet Absorbing Agent]

The resin composition according to the present invention may contain an ultraviolet absorbing agent. As the ultraviolet absorbing agent, an ultraviolet absorbing agent such as a salicylate-based, a benzophenone-based, a benzotriazole-based, a substituted acrylonitrile-based, or a triazine-based ultraviolet absorbing agent can be used.

Examples of the salicylate-based ultraviolet absorbing agent include phenyl salicylate, p-octylphenyl salicylate, and p-t-butylphenyl salicylate, and examples of the benzophenone-based ultraviolet absorbing agent include 2,2'-dihydroxy-4-methoxybenzophenone, 2,2'-dihydroxy-4,4'-dimethoxybenzophenone, 2,2', 4,4'-tetrahydroxybenzophenone, 2-hydroxy-4-methoxybenzophenone, 2,4-dihydroxybenzophenone, and 2-hydroxy-4-octoxybenzophenone. Examples of the benzotriazole-based ultraviolet absorbing agents include 2-(2'-hydroxy-3', 5'-di-tert-butylphenyl)-5-chlorobenzotriazole, 2-(2'-hydroxy-3'-tert-butyl-5'-methylphenyl)-5-chlorobenzotriazole, 2-(2'-hydroxy-3'-tert-amyl-5'-isobutylphenyl)-5-chlorobenzotriazole, 2-(2'-hydroxy-3'-isobutyl-5'-methylphenyl)-5-chlorobenzotriazole, 2-(2'-hydroxy-3'-isobutyl-5'-propylphenyl)-5-chlorobenzotriazole, 2-(2'-hydroxy-3', 5'-di-tert-butylphenyl)benzotriazole, 2-(2'-hydroxy-5'-methylphenyl)benzotriazole, and 2-[2'-hydroxy-5'-(1,1,3,3-tetramethyl)phenyl]benzotriazole.

Examples of the substituted acrylonitrile-based ultraviolet absorbing agent include ethyl 2-cyano-3,3-diphenylacrylate and 2-ethylhexyl 2-cyano-3,3-diphenylacrylate. Further, examples of the triazine-based ultraviolet absorbing agent include mono(hydroxyphenyl)triazine compounds such as 2-[4-[(2-hydroxy-3-dodecyloxypropyl)oxy]-2-hydroxyphenyl]-4,6-bis(2,4-dimethylphenyl)-1, 3,5-triazine, 2-[4-[(2-hydroxy-3-tridecyloxypropyl)oxy]-2-hydroxyphenyl]-4,6-bis(2,4-dimethylphenyl)-1, 3,5-triazine, and 2-(2,4-dihydroxyphenyl)-4,6-bis(2,4-dimethylphenyl)-1,3,5-triazine; bis(hydroxyphenyl)triazine compounds such as 2,4-bis(2-hydroxy-4-propyloxyphenyl)-6-(2,4-dimethylphenyl)-1,3,5-triazine, 2,4-bis(2-hydroxy-3-methyl)-4-propyloxyphenyl)-6-(4-methylphenyl)-1,3,5-triazine, and 2,4-bis(2-hydroxy-3-methyl-4-hexyloxyphenyl)-6-(2,4-dimethylphenyl)-1,3,5-triazine; and tris(hydroxyphenyl)triazine compounds such as 2,4-bis(2-hydroxy-4-butoxyphenyl)-6-(2,4-dibutoxyphenyl))-1,3,5-triazine, 2,4, 6-tris(2-hydroxy-4-octyloxyphenyl)-1,3,5-triazine, and 2,4,6-tris[2-hydroxy-4-(3-butoxy-2-hydroxypropyloxy)phenyl]-1,3,5-triazine.

In the resin composition according to the present invention, the above-described various ultraviolet absorbing agents may be used alone, or two or more thereof may be used in combination. The resin composition according to the present invention may contain or may not contain an ultraviolet absorbing agent. However, in a case of being contained, the content of the ultraviolet absorbing agent is preferably 0.001% by mass or more and 1% by mass or less, and more preferably 0.01% by mass or more and 0.1% by mass or less, with respect to the total solid content mass of the resin composition according to the present invention.

[Organic Titanium Compound]

The resin composition according to the present invention may contain an organic titanium compound. In a case where the resin composition contains an organic titanium compound, it is possible to form a resin layer having excellent chemical resistance even in a case where curing is carried out at a low temperature.

Examples of the usable organic titanium compound include those in which an organic group is bonded to a titanium atom through a covalent bond or an ionic bond.

Specific examples of the organic titanium compound are described in I) to VII) below.

I) Titanium chelate compounds: among them, a titanium chelate compound having two or more alkoxy groups is more preferable since the resin composition has good storage stability and a good curing pattern can be obtained. Specific examples thereof include titanium bis(triethanolamine)diisopropoxide, titanium di(n-butoxide) bis(2,4-pentanedionate), titanium diisopropoxide bis(2,4-pentanedionate), titanium diisopropoxide bis(tetramethylheptandionate), and titanium diisopropoxide bis(ethyl acetoacetate).

II) Tetraalkoxy titanium compounds: examples thereof include titanium tetra(n-butoxide), titanium tetraethoxide, titanium tetra(2-ethylhexoxide), titanium tetraisobutoxide, titanium tetraisopropoxide, titanium tetramethoxide, titanium tetramethoxypropoxide, titanium tetramethylphenoxide, titanium tetra(n-nonyloxide), titanium tetra(n-propoxide), and titanium tetrastearyloxide, titanium tetrakis[bis{2,2-(aryloxymethyl)butoxide}].

III) Titanocene compounds: examples thereof include pentamethylcyclopentadienyl titanium trimethoxide, bis(η5-2,4-cyclopentadiene-1-yl) bis(2,6-difluorophenyl)titanium, and bis(f5-2,4-cyclopentadiene-1-yl) bis(2,6-difluoro-3-(1H-pyrrole-1-yl)phenyl)titanium.

IV) Monoalkoxytitanium compounds: examples thereof include titanium tris(dioctyl phosphate)isopropoxide, and titanium tris(dodecylbenzene sulfonate)isopropoxide.

V) Titanium oxide compounds: examples thereof include titanium oxide bis(pentanedionate), titanium oxide bis(tetramethylheptandionate), and phthalocyanine titanium oxide.

VI) Titanium tetraacetylacetonate compounds: examples thereof include titanium tetraacetylacetoneate.

VII) Titanate coupling agents: examples thereof include isopropyltridodecylbenzenesulfonyl titanate.

Among them, it is preferable that the organic titanium compound is at least one compound selected from the group consisting of the above-described I) titanium chelate compound, II) tetraalkoxytitanium compound, and III) titanocene compound, from the viewpoint that better chemical resistance is exhibited. In particular, titanium diisopropoxide bis(ethyl acetoacetate), titanium tetra(n-butoxide), or bis (η5-2,4-cyclopentadiene-1-yl) bis(2,6-difluoro-3-(1H-pyrrole-1-yl)phenyl)titanium is preferable.

In a case where an organic titanium compound is blended, the blending amount thereof is preferably 0.05 to 10 parts by mass and more preferably 0.1 to 2 parts by mass with respect to 100 parts by mass of the specific resin. In a case where the blending amount is 0.05 parts by mass or more, good heat resistance and good chemical resistance are more effectively exhibited in the curing pattern to be obtained. On the other hand, in a case where it is 10 parts by mass or less, the storage stability of the composition is more excellent.

[Antioxidant]

The resin composition according to the present invention may contain an antioxidant. In a case where an antioxidant is contained as an additive, it is possible to improve the elongation characteristics of the cured film after curing and the adhesiveness to the metal material. Examples of the antioxidant include a phenol compound, a phosphorous acid ester compound, and a thioether compound. As the phenol compound, any phenol compound known as the phenolic antioxidant can be used. Examples of the preferred phenolic compound include a hindered phenolic compound. A compound having a substituent at a site (ortho position) adjacent to a phenolic hydroxy group is preferable. As the substituent described above, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus-based antioxidant can also be preferably used. Examples of the phosphorus-based antioxidant include tris[2-[[2,4,8,10-tetrakis(1,1-dimethylethyl)dibenzo[d, f][1,3,2]dioxaphosphepin-6-yl]oxy]ethyl]amine, tris[2-[(4,6,9,11-tetra-tert-butyldibenzo[d, f][1,3,2]dioxaphosphepin-2-yl)oxy]ethyl]amine, and ethyl phosphite bis(2,4-di-tert-butyl-6-methylphenyl). Examples of the commercially available product of the antioxidant include ADK STAB AO-20, ADK STAB AO-30, ADK STAB AO-40, ADK STAB AO-50, ADK STAB AO-50F, ADK STAB AO-60, ADK STAB AO-60G, ADK STAB AO-80, and ADK STAB AO-330 (all of which are manufactured by ADEKA Corporation). In addition, as the antioxidant, the compounds described in paragraph Nos. 0023 to 0048 of JP6268967B can also be used, the content of which is incorporated in the present specification. Further, the resin composition according to the present invention may contain a potential antioxidant, as necessary. Examples of the potential antioxidant include a compound in which a portion that functions as the antioxidant is protected by a protective group and the protective group is desorbed by heating the compound at 100° C. to 250° C. or by heating the compound at 80° C. to 200° C. in the presence of an acid/a base catalyst. Examples of the latent antioxidant include the compounds disclosed in WO2014/021023A, WO2017/030005A, and JP2017-008219A, the contents of which are incorporated in the present specification. Examples of the commercially available product of the potential antioxidant include ADEKA ARKLS GPA-5001 (manufactured by ADEKA Corporation).

Examples of the preferred antioxidant include 2,2-thiobis (4-methyl-6-t-butylphenol), 2,6-di-t-butylphenol, and a compound represented by Formula (3).

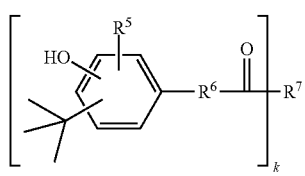
(3)

In General Formula (3), $R^5$ represents a hydrogen atom or an alkyl group having 2 or more carbon atoms (preferably 2 to 10 carbon atoms), and $R^6$ represents an alkylene group having 2 or more carbon atoms (preferably 2 to 10 carbon atoms). $R^7$ represents a monovalent to tetravalent organic group containing at least any one of an alkylene group having 2 or more carbon atoms (preferably having 2 to 10 carbon atoms), an oxygen atom, or a nitrogen atom. k represents an integer of 1 to 4.

The compound represented by Formula (3) suppresses the oxidative deterioration of the aliphatic group or the phenolic hydroxyl group, contained in the resin. In addition, metal oxidation can be suppressed by the rust prevention action on the metal material.

Since the above compound can act on the resin and the metal material at the same time, k is more preferably an integer of 2 to 4. Examples of $R^7$ include an alkyl group, a cycloalkyl group, an alkoxy group, an alkyl ether group, an alkylsilyl group, an alkoxysilyl group, an aryl group, an aryl ether group, a carboxyl group, a carbonyl group, an allyl group, a vinyl group, a heterocyclic group, —O—, —NH—, —NHNH—, and combinations thereof, and $R^7$ may further have a substituent. Among these, an alkyl ether group or —NH— is preferably contained from the viewpoints of solubility in a developer and metal adhesiveness, and —NH— is more preferably contained from the viewpoints of the metal adhesiveness due to interaction with a resin and the metal complex formation.

Examples of the compound represented by General Formula (3) include the following compounds; however, the structure thereof is not limited to the following structure.

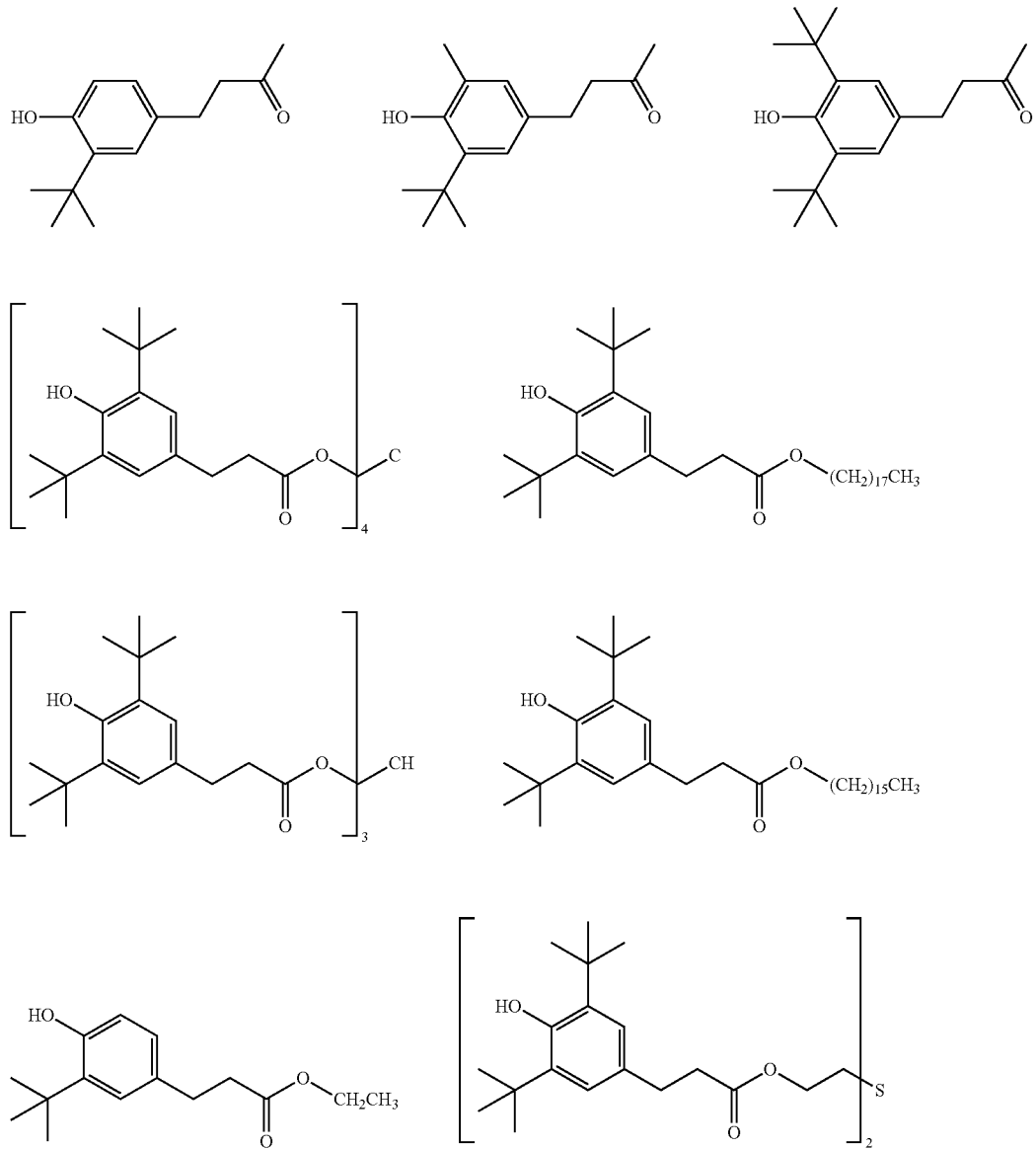

-continued
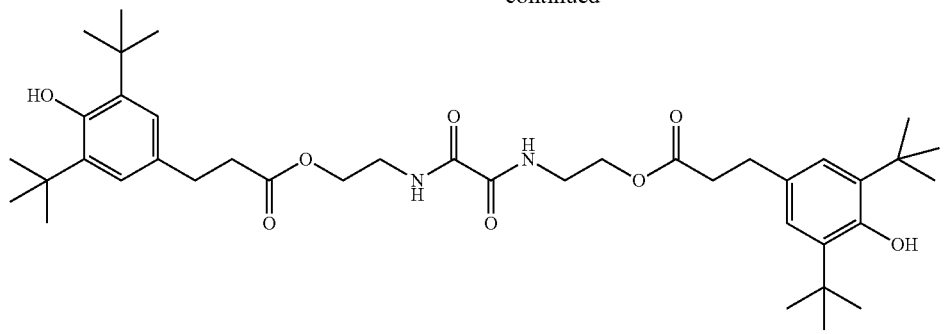
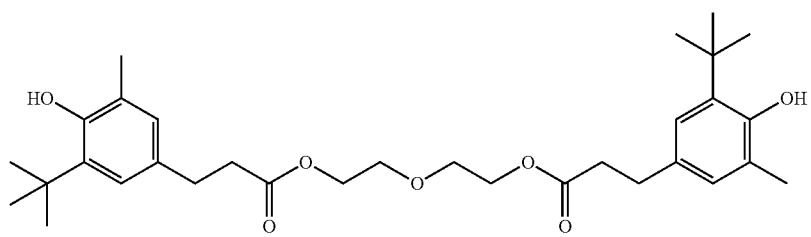
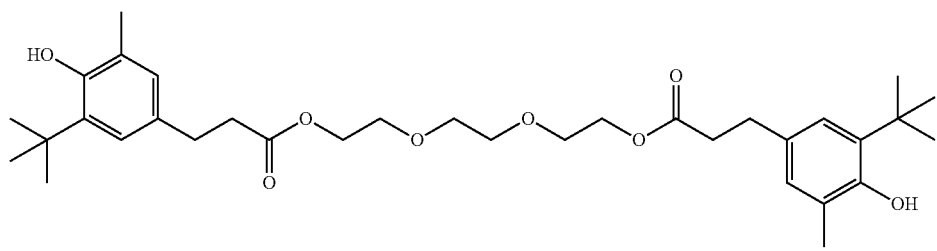
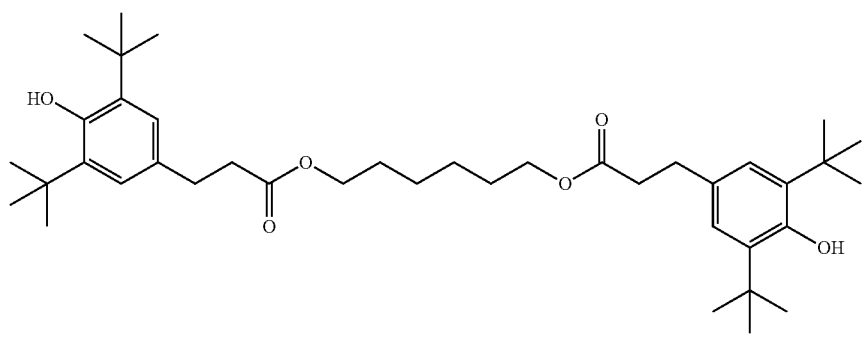
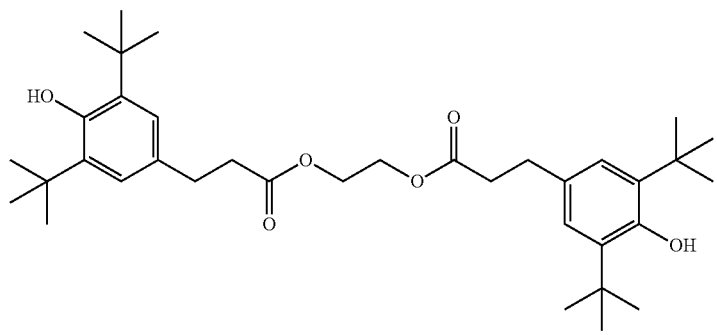

-continued
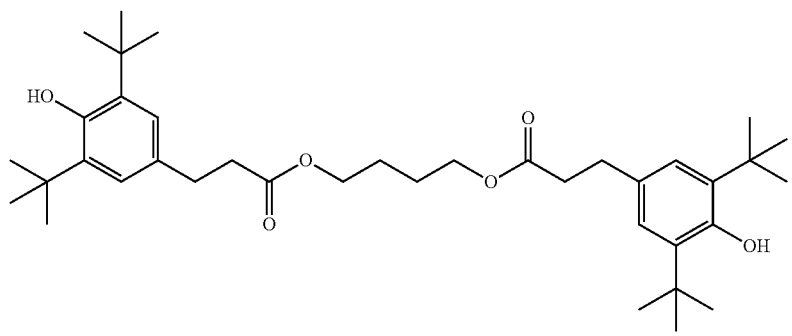
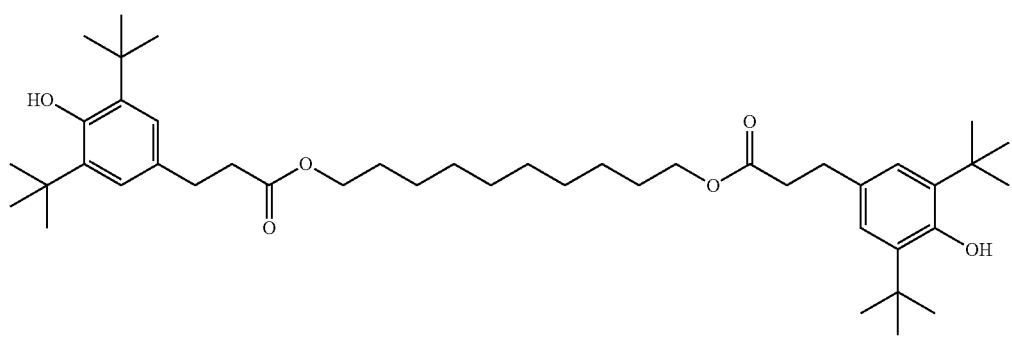
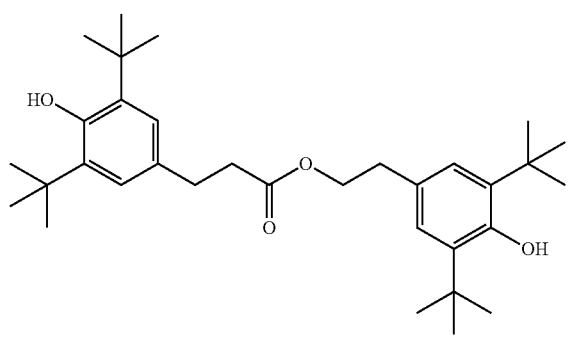
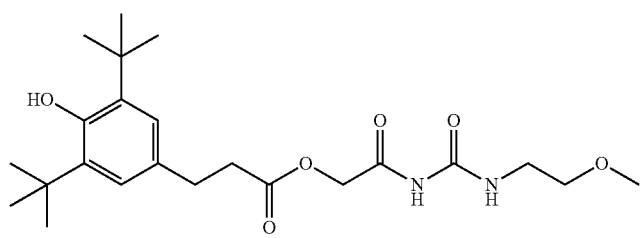
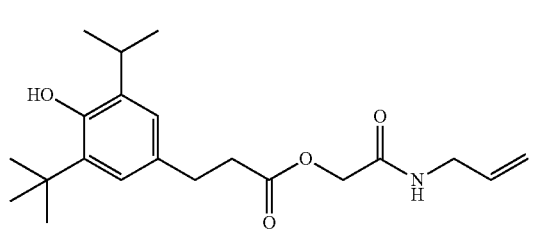
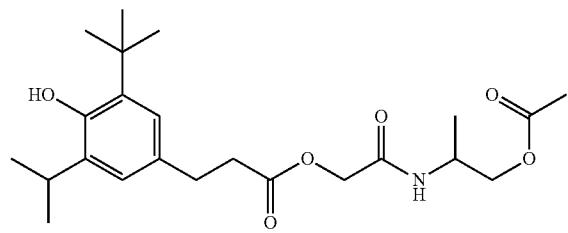
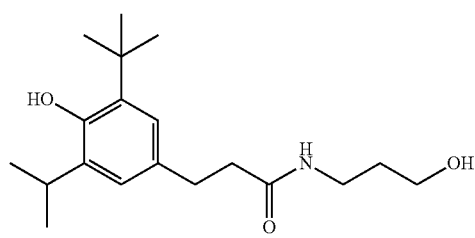

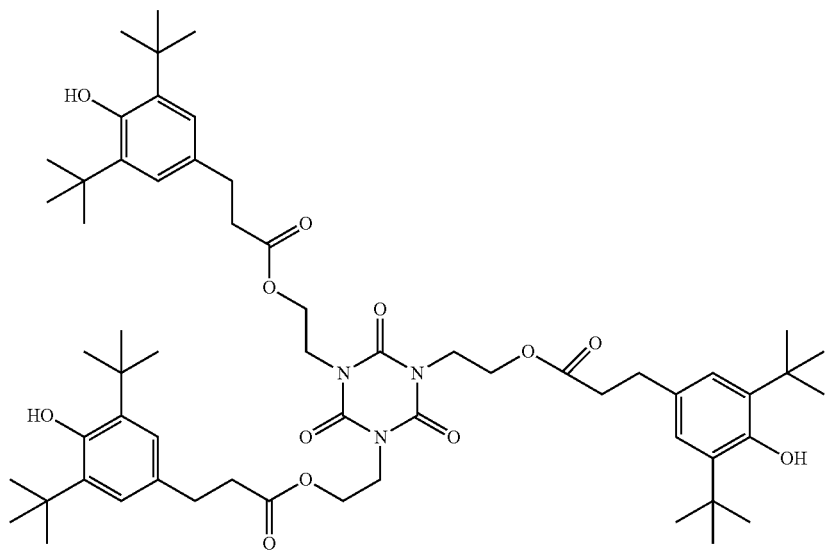
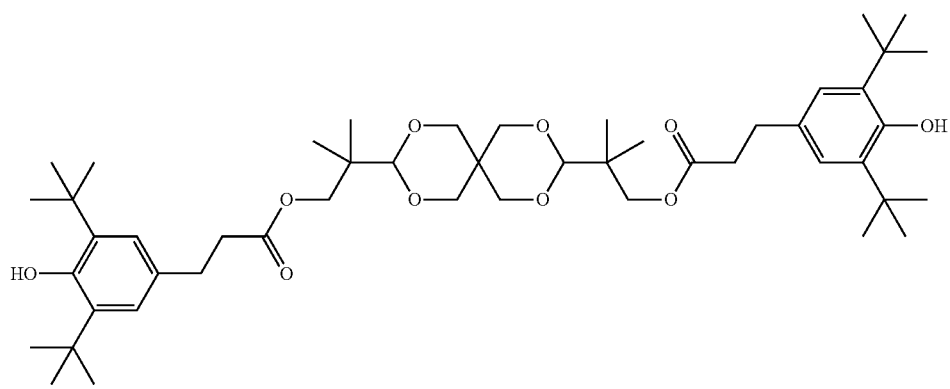
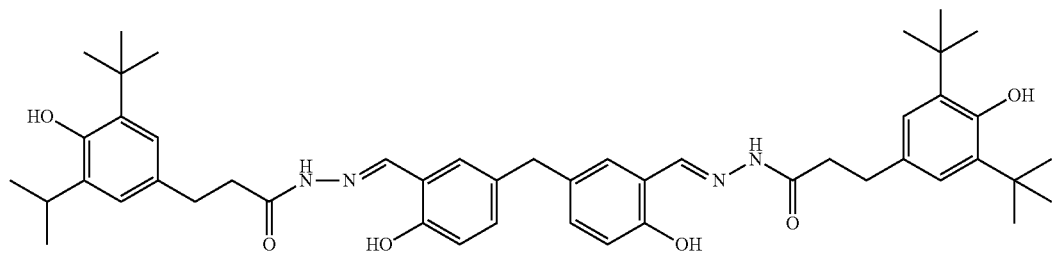
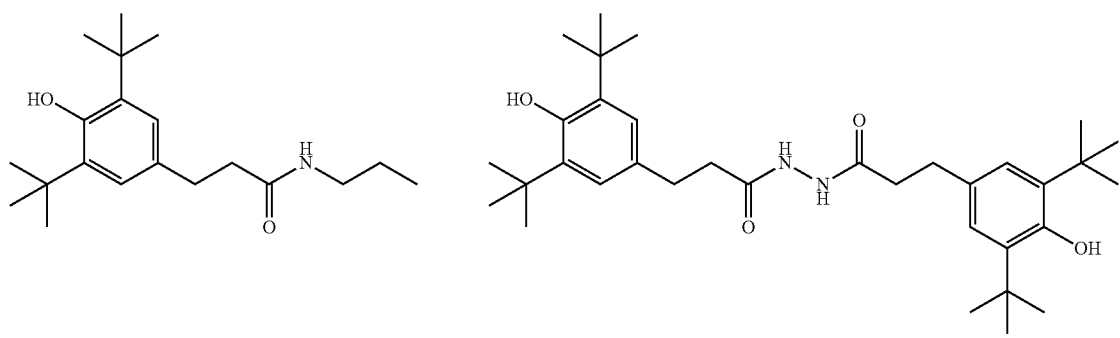

-continued
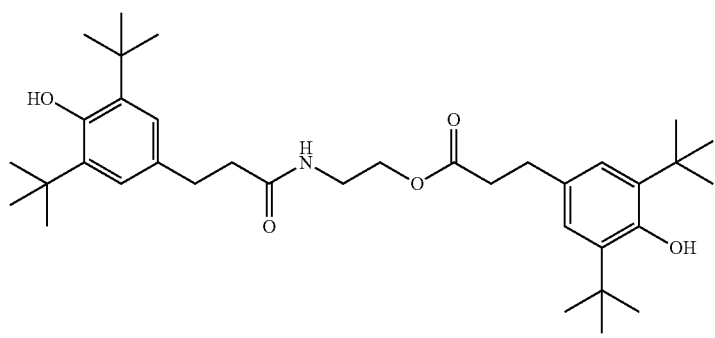
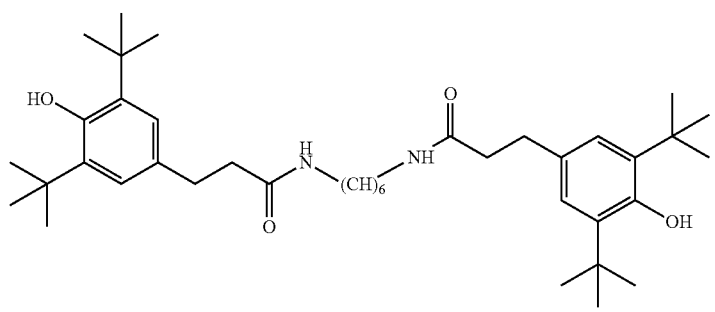
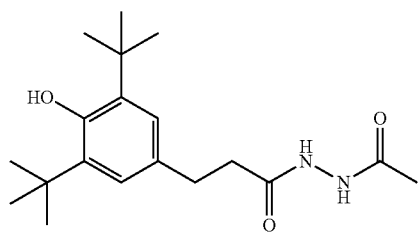
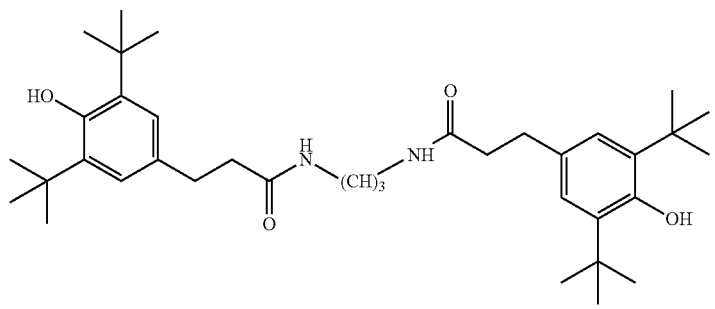
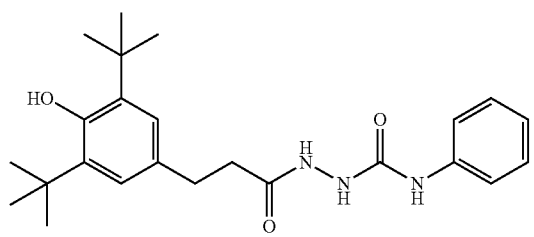

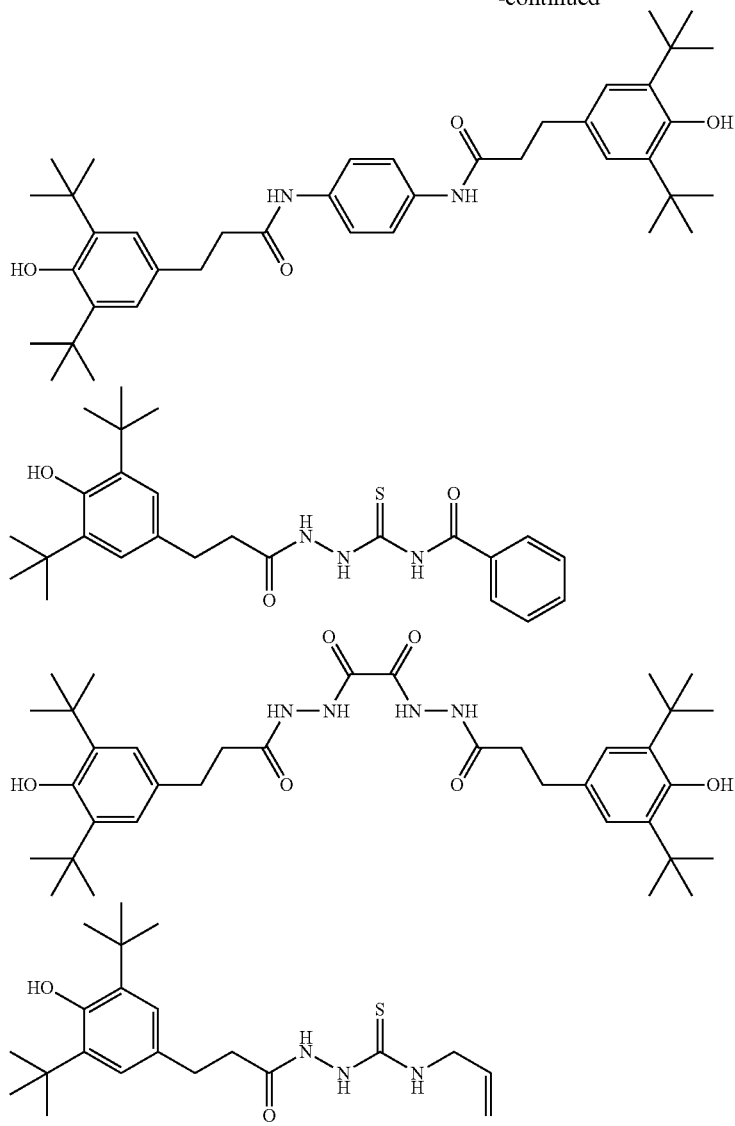

The adding amount of the antioxidant is preferably 0.1 to 10 parts by mass and more preferably 0.5 to 5 parts by mass with respect to the resin. In a case where the adding amount is set to 0.1 parts by mass or more, the effect of improving the elongation characteristics and the adhesiveness to the metal material can be easily obtained even in a high temperature and high humidity environment, and in a case where the adding amount is set to 10 parts by mass or less, the sensitivity of the resin composition is improved, for example, by the interaction with the photosensitizing agent. In the present invention, the antioxidant may be used singly or in a combination of two or more kinds thereof. In a case where two or more kinds thereof are used, the total amount thereof is preferably within the above-described range.

[Aggregation Preventing Agent]

The resin composition according to the present invention may contain an aggregation preventing agent, as necessary. Examples of the aggregation preventing agent include sodium polyacrylate.

In the present invention, one kind of aggregation preventing agent may be used alone, or two or more thereof may be used in combination.

The resin composition according to the present invention may contain or may not contain an aggregation preventing agent. However, in a case of being contained, the content of the aggregation preventing agent is preferably 0.01% by mass or more and 10% by mass or less, and more preferably 0.02% by mass or more and 5% by mass or less, with respect to the total solid content mass of the resin composition according to the present invention.

[Phenol-Based Compound]

The resin composition of the present embodiment may contain a phenol-based compound, as necessary. Examples of the phenol-based compound include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, Methylene tris-FR-CR, BisRS-26X (all, product names, manufactured by Honshu Chemical Industry Co., Ltd.), BIP-PC, BIR-PC, BIR-PTBP, and BIR-BIPC-F (all, product names, manufactured by ASAHI YUKIZAI Corporation).

In the present invention, one kind of phenol-based compound may be used alone, or two or more thereof may be used in combination.

The resin composition according to the present invention may contain or may not contain a phenol-based compound. However, in a case of being contained, the content of the phenol-based compound is preferably 0.01% by mass or more and 30% by mass or less, and more preferably 0.02% by mass or more and 20% by mass or less, with respect to the total solid content mass of the resin composition according to the present invention.

[Polymer Compound A]

Examples of the other polymer compound include a siloxane resin, a (meth)acrylic polymer obtained by copolymerizing (meth)acrylic acid, a novolak resin, a resol resin, a polyhydroxystyrene resin, and a copolymer thereof. The other polymer compound may be a modified polymer into which a crosslinking group such as a methylol group, an alkoxymethyl group, or an epoxy group has been introduced.

In the present invention, one kind of the other polymer compound may be used alone, or two or more thereof may be used in combination.

The resin composition according to the present invention may contain or may not contain another polymer compound. However, in a case of being contained, the content of the other polymer compound is preferably 0.01% by mass or more and 30% by mass or less, and more preferably 0.02% by mass or more and 20% by mass or less, with respect to the total solid content mass of the resin composition according to the present invention.

<Characteristics of Resin Composition>

The viscosity of the resin composition according to the present invention can be adjusted by adjusting the concentration of solid contents of the resin composition. From the viewpoint of the coating film thickness, it is preferably 1,000 mm$^2$/s to 12,000 mm$^2$/s, more preferably 2,000 mm$^2$/s to 10,000 mm$^2$/s, and still more preferably 2,500 mm$^2$/s to 8,000 mm$^2$/s. Within the above range, it is easy to obtain a coating film having high uniformity. In a case of being 1,000 mm$^2$/s or more, it is easy to carry out coating at a film thickness to be required as, for example, an insulating film for re-distribution of a wiring line, and in a case of being 12,000 mm$^2$/s or less, a coating film having an excellent coating surface shape is obtained.

<Restrictions on Substances Contained in Resin Composition>

The moisture content of the resin composition according to the present invention is preferably less than 2.0% by mass, more preferably less than 1.5% by mass, and still more preferably less than 1.0% by mass. In a case of being less than 2.0%, the storage stability of the resin composition is improved.

Examples of the method of maintaining the water content include adjusting the humidity under storage conditions and reducing the void volume of the storage container during storage.

From the viewpoint of insulating properties, the metal content of the resin composition according to the present invention is preferably less than 5 parts per million (ppm) by mass, more preferably less than 1 ppm by mass, and still more preferably less than 0.5 ppm by mass. Examples of the metal include sodium, potassium, magnesium, calcium, iron, copper chromium, and nickel, however, a metal contained as a complex of an organic compound and a metal is excluded. In a case where a plurality of metals are contained, the total of these metals is preferably within the above-described range.

In addition, as a method of reducing metal impurities which are unintentionally contained in the resin composition according to the present invention, a method of selecting a raw material containing a low metal content as the raw material that constitutes the resin composition according to the present invention, a method of filtering a raw material constituting the resin composition according to the present invention, a method of distilling under the conditions in which the inside of the device is lined with polytetrafluoroethylene or the like to suppress the contamination as little as possible, and the like can be mentioned.

In the resin composition according to the present invention, in a case of considering the use application as a semiconductor material, the content of halogen atoms is preferably less than 500 ppm by mass, more preferably less than 300 ppm by mass, and still more preferably less than 200 ppm by mass, from the viewpoint of wiring line corrosiveness. Among these, in a case of being present in a halogen ion state, the content is preferably less than 5 ppm by mass, more preferably less than 1 ppm by mass, and still more preferably less than 0.5 ppm by mass. Examples of the halogen atom include a chlorine atom and a bromine atom. It is preferable that the total content of the chlorine atom and the bromine atom, or the total content of the chlorine ion and the bromine ion is within the above-described range.

Preferred examples of the method of adjusting the content of halogen atoms include ion exchange treatment.

A conventionally known storage container can be used as a storage container for the resin composition according to the present invention. In addition, as the storage container, for the intended purpose of suppressing the incorporation of impurities into the raw materials and the resin composition according to the present invention, a multilayer bottle in which an inner wall of a container is composed of six kinds of six layers of resin, and a bottle with six kinds of resin being made as a seven-layer structure are preferably used. Examples of such a container include the container described in JP2015-123351A.

<Cured Substance of Resin Composition>

In a case of curing the resin composition according to the present invention, it is possible to obtain a cured substance of this resin composition.

The cured substance according to the embodiment of the present invention is a cured substance formed by curing the resin composition according to the present invention.

The curing of the resin composition is preferably by heating, more preferably by heating at a heating temperature within a range of 120° C. to 400° C., still more preferably by heating at a heating temperature within a range of 140° C. to 380° C., and particularly preferably by heating at a heating temperature within a range of 170° C. to 350° C. The form of the cured substance of the resin composition is not particularly limited and can be selected depending on the use application, where the form includes a film shape, a rod shape, a spherical shape, a pellet shape, and the like. In the present invention, the cured substance preferably has a film shape. In addition, the shape of this cured substance can also be selected depending on the use application by the pattern processing of the resin composition, where the use application includes formation of a protective film on a wall surface, formation of via holes for conduction, adjustment of impedance, capacitance, or internal stress, and impartment of heat radiation function. The film thickness of the cured substance (the film consisting of the cured substance) is preferably 0.5 µm or more and 150 µm or less.

The shrinkage ratio of the resin composition according to the present invention after curing is preferably 50% or less, more preferably 45% or less, and still more preferably 40% or less. Here, the shrinkage ratio refers to a percentage of a change in the volume of the resin composition before and after curing, and it can be calculated according to the following expression.

Shrinkage ratio [%]=100−(volume after curing/volume before curing)×100

<Characteristics of Cured Substance of Resin Composition>

The imidization reaction rate of the cured substance of the resin composition according to the present invention is preferably 70% or more, more preferably 80% or more, and still more preferably 90% or more. In a case of 70% or more, a cured substance having excellent mechanical properties may be obtained.

The breaking elongation of the cured substance of the resin composition according to the present invention is preferably 30% or more, more preferably 40% or more, and still more preferably 50% or more.

The glass transition temperature (Tg) of the cured substance of the resin composition according to the present invention is preferably 180° C. or higher, more preferably 210° C. or higher, and still more preferably 230° C. or higher.

<Preparation of Resin Composition>

The resin composition can be prepared by mixing the above-described components. The mixing method is not particularly limited, and mixing can be carried out by methods conventionally known in the related art.

For mixing, it is possible to employ mixing with a stirring blade, mixing with a ball mill, mixing by rotating the tank itself, or the like.

The temperature during the mixing is preferably 10° C. to 30° C., and more preferably 15° C. to 25° C.

In addition, for the intended purpose of removing foreign substances such as dust and fine particles in the resin composition, it is preferable to carry out filtration using a filter. Examples of the pore diameter of the filter include an aspect of 5 μm or less, and the pore diameter thereof is preferably 1 μm or less, more preferably 0.5 μm or less, and still more preferably 0.1 μm or less. The material of the filter is preferably polytetrafluoroethylene, polyethylene, or nylon. In a case where the material of the filter is polyethylene, it is more preferable to use high density polyethylene (HDPE). As the filter, a filter which has been cleaned with an organic solvent in advance may be used. In the filtration step using the filter, a plurality of kinds of filters may be connected in series or in parallel and used. In a case where a plurality of kinds of filters are used, filters having different pore diameters or different materials may be used in combination. Examples of the connection aspect include an aspect in which an HDPE filter having a pore diameter of 1 μm is connected in series as the first stage and an HDPE filter having a pore diameter of 0.2 μm is connected in series as the second stage. In addition, various materials may be filtered a plurality of times. In a case of being filtered a plurality of times, circulation filtration may be used. In addition, filtration may be carried out under pressure. In a case where filtration is carried out under pressure, an aspect in which the pressure to be applied is, for example, 0.01 MPa or more and 1.0 MPa or less is mentioned, and the pressure is preferably 0.03 MPa or more and 0.9 MPa or less, more preferably 0.05 MPa or more and 0.7 MPa or less, and still more preferably 0.05 MPa or more and 0.5 MPa or less. In addition to filtration using a filter, impurity removal treatment using an adsorbing material may be carried out. The filtration using a filter and the impurity removal treatment using an adsorbing material may be combined. As the adsorbing material, a conventionally known adsorbing material can be used. Examples thereof include an inorganic adsorbing material such as silica gel and zeolite and an organic adsorbing material such as activated carbon.

Furthermore, after filtration using a filter, a step of placing a bottle filled with the resin composition under reduced pressure to carry out degassing may be provided.

(Treatment Liquid)

The treatment liquid according to the embodiment of the present invention is a treatment liquid used in a manufacturing method for a cured substance, the manufacturing method including a film forming step of applying a resin composition containing a precursor of a cyclization resin onto a base material to form a film, a treatment step of bringing a treatment liquid into contact with the film, and a heating step of heating the film after the treatment step, where the treatment liquid contains at least one compound selected from the group consisting of a basic compound having an amide group and a base generator having an amide group.

The details of the components contained in the treatment liquid are the same as the details of the components contained in the treatment liquid that is used in the treatment step in the above-described manufacturing method for a cured substance according to the embodiment of the present invention, and the same applies to the preferred aspects thereof.

The details of the manufacturing method for the above-described cured substance and the details of each step included in this manufacturing method are the same as the details of the above-described manufacturing method for a cured substance according to the embodiment of the present invention, and the same applies to the preferred aspects thereof.

In addition, it is preferable that the manufacturing method for the cured substance in the treatment liquid according to the embodiment of the present invention includes the film forming step, an exposure step of selectively exposing the film formed by the film forming step, and a development step of developing the exposed film with a developer to form a patterned film, where the treatment step is a rinsing step of cleaning the patterned film with the treatment liquid.

The details of the film forming step, the exposure step, the development step, the treatment step, and the heating step are the same as the details of the film forming step, the exposure step, the development step, the treatment step, and the heating step in the above-described manufacturing method for a cured substance according to the embodiment of the present invention, and the same applies to the preferred aspects thereof.

The details of the rinsing step are the same as the details of the case where the treatment step is the rinsing step in the above-described manufacturing method for a cured substance according to the embodiment of the present invention, and the same applies to the preferred aspects thereof.

EXAMPLES

Hereinafter, the present invention will be described in detail using examples. Materials, using amounts, proportions, treatment details, treatment procedures, and the like shown in the following examples can be appropriately changed without departing from the gist of the present invention. Accordingly, the scope of the present invention is not limited to the following specific examples. Unless otherwise specified, "parts" and "%" are based on mass.

Synthesis Example 1; Synthesis of Polymer P-1

7.76 g (25 mmol) of 4,4'-oxydiphthalic acid dianhydride (ODPA) and 6.23 g (25 mmol) of 3,3', 4,4'-biphenyltetracarboxylic acid dianhydride were placed in a reaction container, and then 13.4 g of 2-hydroxyethyl methacrylate (HEMA) and 100 ml of γ-butyrolactone were added thereto. 7.91 g of pyridine was added thereto with stirring at room temperature to obtain a reaction mixture. After the heat generation due to the reaction was stopped, the reaction mixture was further allowed to cool to room temperature and left to stand for 16 hours.

Next, under ice-cooling, a solution obtained by dissolving 20.6 g (99.9 mmol) of dicyclohexylcarbodiimide (DCC) in 30 ml of γ-butyrolactone was added to the reaction mixture over 40 minutes with stirring. Subsequently, a suspension obtained by suspending 9.3 g (46 mmol) of 4,4'-diaminodiphenyl ether (DADPE) in 350 ml of γ-butyrolactone was added thereto over 60 minutes with stirring.

Further, the suspension was stirred at room temperature for 2 hours, and 3 ml of ethyl alcohol was added thereto, followed by stirring for 1 hour. Then, 100 ml of γ-butyrolactone was added thereto. The precipitate formed in the reaction mixture was removed by filtration to obtain a reaction solution.

The obtained reaction solution was added to 3 liters of ethyl alcohol to form a precipitate consisting of a crude polymer. The produced crude polymer was filtered and collected and then dissolved in 200 ml of tetrahydrofuran to obtain a crude polymer solution. The obtained crude polymer solution was dropwise added to 3 liters of water to precipitate the polyimide precursor, and the obtained polyimide precursor was filtered and collected, and then vacuum dried to obtain a powdery polyimide precursor (a polymer P-1).

As a result of measuring the weight-average molecular weight (Mw) of the polyimide precursor (the polymer P-1), it was 23,000.

The polymer P-1 is a resin having the following structure. The subscript attached to the parenthesis indicates the molar ratio of each repeating unit.

Synthesis Example 2; Synthesis of Polymer P-2

20.0 g (64.5 mmol) of 4,4'-oxydiphthalic acid anhydride (dried at 140° C. for 12 hours), 16.8 g (129 mmol) of 2-hydroxyethyl methacrylate, 0.05 g of hydroquinone, 20.4 g (258 mmol) of pyridine, 100 g of diglyme were mixed and stirred at a temperature of 60° C. for 18 hours to produce a diester of 4,4'-oxydiphthalic acid and 2-hydroxyethyl methacrylate. Next, the reaction mixture was cooled, and 16.12 g (135.5 mmol) of $SOCL_2$ was added thereto over 2 hours. Then, a solution prepared by dissolving 12.74 g (60.0 mmol) of 2,2'-dimethylbiphenyl-4,4'-diamine in 100 mL of N-methylpyrrolidone was dropwise added to the reaction mixture over 2 hours while adjusting the temperature in a range of −5° C. to 0° C. The reaction mixture was reacted at 0° C. for 1 hour, and then 70 g of ethanol was added thereto, followed by stirring at room temperature for 1 hour. The polyimide precursor was then precipitated in 5 L of water and the water-polyimide precursor mixture was stirred for 15 minutes at a speed of 5,000 rpm. The polyimide precursor was filtered off, stirred again in 4 liters of water for 30 minutes, and filtered again. Next, the obtained polyimide precursor was dried under reduced pressure for 2 days. The weight-average molecular weight of this polyimide precursor (the polymer P-2) was 29,000.

The polymer P-2 is a resin having the following structure.

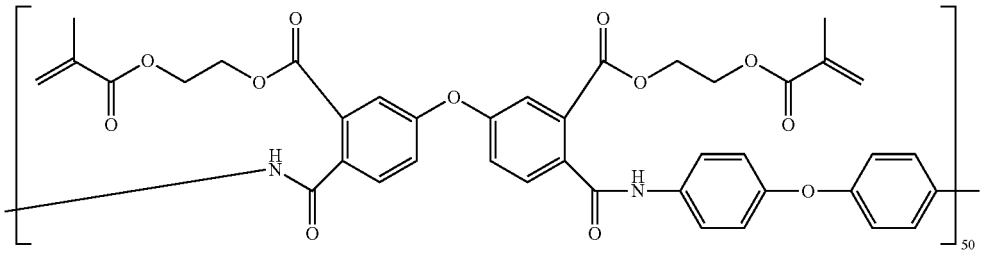

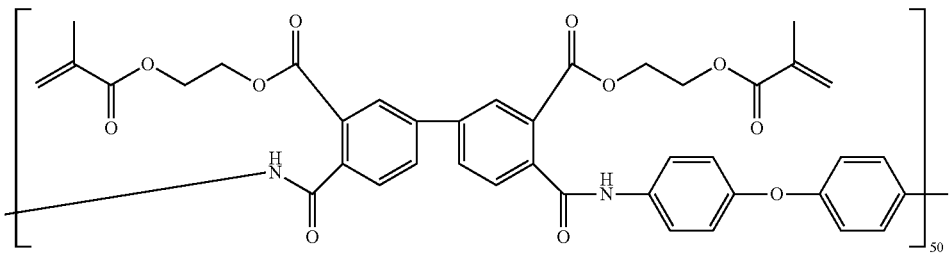

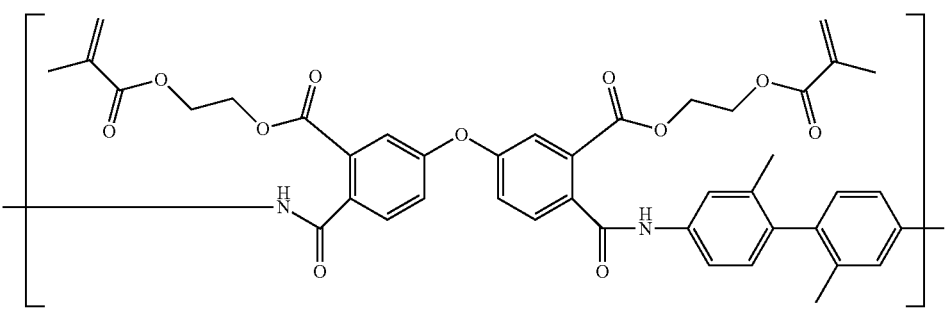

Synthesis Example 3; Synthesis of Polymer P-3

20.0 g (64.5 mmol) of 4,4'-oxydiphthalic acid anhydride (dried at 140° C. for 12 hours), 16.8 g (129 mmol) of 2-hydroxyethyl methacrylate, 0.05 g of hydroquinone, 20.4 g (258 mmol) of pyridine, 100 g of diglyme were mixed and stirred at a temperature of 60° C. for 18 hours to produce a diester of 4,4'-oxydiphthalic acid and 2-hydroxyethyl methacrylate. Next, after chlorinating the obtained diester with $SOCL_2$, a solution obtained by dissolving 4,4'-diaminodiphenyl ether in N-methylpyrrolidone was dropwise added to the reaction mixture in the same manner as in Synthesis Example 2, and then the obtained reaction mixture was purified and dried. The weight-average molecular weight of this polyimide precursor (the polymer P-3) was 18,000.

The polymer P-3 is a resin having the following structure.

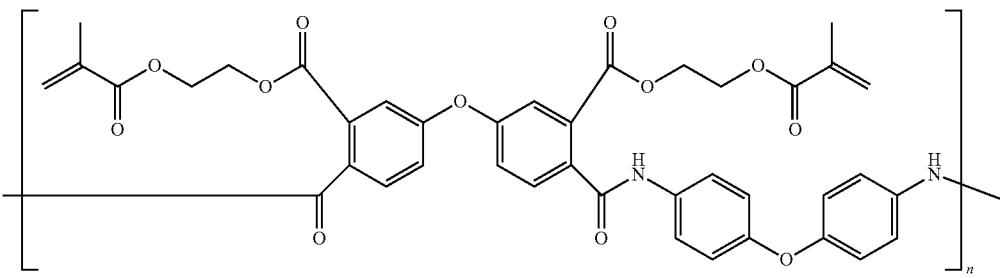

<Preparation of Resin Composition>

In each of Examples, the components shown in the table below were mixed to obtain each of the resin compositions.

Specifically, the blending amount of the component shown in the table was set to the blending amount (parts by mass) described in the table.

The obtained resin composition was filtered by pressurization through a high density polyethylene (HDPE) filter having a filter pore diameter of 0.2 μm.

In addition, in the table, the description of "−" indicates that the corresponding component is not contained in the composition.

TABLE 1

| Component | Composition 1 | Composition 2 | Composition 3 | Composition 4 | Composition 5 | Composition 6 | Composition 7 | Composition 8 | Composition 9 | Composition 10 | Composition 11 | Composition 12 | Composition 13 |
|---|---|---|---|---|---|---|---|---|---|---|---|---|---|
| P-1 | 28.49 | 37.3 | — | — | — | — | — | — | — | — | — | — | — |
| P-2 | — | — | 37.3 | — | — | — | — | — | — | — | — | — | — |
| P-3 | — | — | — | 37.3 | 37.3 | 34.6 | 36.65 | 33.6 | 35.65 | 36.65 | 35.48 | 35.80 | 35.35 |
| B-1 | — | 5.5 | 5.5 | 5.5 | — | — | — | — | — | — | 5.40 | 5.40 | — |
| B-2 | — | — | — | — | 5.5 | 5.5 | 5.5 | 5.5 | 5.5 | 5.5 | — | — | — |
| B-3 | — | — | — | — | — | — | — | — | — | — | — | — | 5.42 |
| C-1 | 0.9 | — | — | — | — | — | — | — | — | — | — | — | — |
| C-2 | — | 1.3 | 1.3 | — | — | 1 | 1 | 1 | 1 | 0.5 | 1.26 | — | 1.01 |
| C-3 | — | — | — | 1.3 | 1.3 | — | — | 1 | 1 | 0.5 | — | 1.26 | — |
| D-1 | 0.5 | 0.75 | 0.75 | 0.75 | 0.75 | 0.75 | 0.75 | 0.75 | 0.75 | 0.75 | 0.72 | 0.72 | 0.72 |
| E-1 | 0.08 | 0.1 | 0.1 | 0.1 | 0.1 | 0.15 | 0.15 | 0.15 | 0.15 | 0.15 | 0.12 | 0.12 | 0.15 |

TABLE 1-continued

| Component | Composition 1 | Composition 2 | Composition 3 | Composition 4 | Composition 5 | Composition 6 | Composition 7 | Composition 8 | Composition 9 | Composition 10 | Composition 11 | Composition 12 | Composition 13 |
|---|---|---|---|---|---|---|---|---|---|---|---|---|---|
| F-1 | 0.03 | 0.05 | 0.05 | 0.05 | 0.05 | 0.05 | 0.05 | 0.05 | 0.05 | 0.05 | 0.05 | — | 0.05 |
| F-2 | — | — | — | — | — | — | — | — | — | — | — | 0.20 | — |
| F-3 | — | — | — | — | — | — | — | — | — | — | — | 0.10 | — |
| H-1 | — | — | — | — | — | 2.05 | — | 2.05 | — | — | 0.87 | 1.01 | 0.88 |
| I-1 | — | — | — | — | — | 0.9 | 0.9 | 0.9 | 0.9 | 0.9 | — | — | 1.01 |
| J-1 | 56 | 14 | 44 | 44 | 44 | 44 | 44 | 44 | 44 | 44 | — | — | — |
| J-2 | 14 | 11 | 11 | 11 | 11 | 11 | 11 | 11 | 11 | 11 | — | — | — |
| J-3 | — | — | — | — | — | — | — | — | — | — | 56 | 55 | 55 |

Details of each of the components listed in the table are as follows.
[Precursor of cyclization resin]
P-1 to P-3: P-1 to P-3 synthesized as above
[Polymerizable compound]
B-1: Tetraethylene glycol dimethacrylate (SR209, manufactured by Sartomer Company Inc.)
B-2: Dipentaerythritol hexaacrylate (NK ESTER A-9550, manufactured by Shin-Nakamura Chemical Co., Ltd.)
B-3: Dipentaerythritol hexaacrylate (KAYARAD DPHA, manufactured by Nippon Kayaku Co., Ltd.)
[Polymerization initiator]
C-1: PERCUMYL D (manufactured by NOF Corporation)
C-2: Irgacure OXE-01 (manufactured by BASF SE)
C-3: Irgacure 784 (manufactured by BASF SE)
[Metal adhesiveness improving agent]
D-1: N-[3-(triethoxysilyl)propyl]maleamic acid
[Migration suppressing agent]
E-1: 5-aminotetrazole
[Polymerization inhibitor]
F-1: 4MeHQ (4-methoxyphenol)
F-2: 2,2,6,6-tetramethylpiperidin-1-oxyl free radical
F-3: 4-hydroxy-2,2,6,6-tetramethylpiperidin-1-oxyl free radical (POLYSTOP 7300P, manufactured by Hakuto Co., Ltd.)
[Thermal-base generator]
H-1: A compound having the following structure

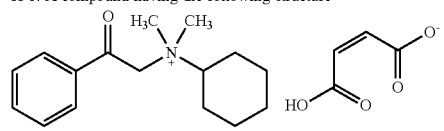

[Another additive]
I-1: An ester of 2,2',3,3'-tetrahydro-3,3,3',3'-tetramethyl-1,1'-spirobi(1H-indene)-5,5',6,6',7,7'-hexanol and 1,2-naphthoquinone-(2)-diazo-5-sulfonic acid
[Solvent]
J-1: γ-butyrolactone (GBL)
J-2: Dimethyl sulfoxide (DMSO)
J-3: N-methyl-2-pyrrolidone (NMP)

<Preparation of Treatment Liquid>

The following components were mixed and filtered through a high density polyethylene (HDPE) (manufactured by Nihon Pall Ltd., pore size: 10 nm) to prepare treatment liquids A1 to A15. In the following description, for example, the description of "pure water/2-propanol/N-[3-(dimethylamino)propyl]acetamide=51/46/3" indicates that 51 parts by mass of pure water, 46 parts by mass of 2-propanol, and 3 parts by mass of N-[3-(dimethylamino)propyl]acetamide are mixed. It is noted that in a case where only one component is described, for example, "butyl acetate=100", it indicates that one component such as butyl acetate is used alone without being mixed with the other components.

[Treatment Liquid]
A1: Pure water/2-propanol/N-[3-(dimethylamino)propyl]acetamide=51/46/3
A2: butyl acetate/N-[3-(dimethylamino)propyl]acetamide=95/5
A3: PGMEA/N-[3-(dimethylamino)propyl]methacrylamide=95/5
A4: PGMEA/N-[3-(dimethylamino)propyl]methacrylamide/4-methoxyphenol=95/4.99/0.01
A5: PGMEA/acetamide, N-methyl-N-[2-(methylamino)propyl]-(9CI)=95/5
A6: PGMEA/(E)-1-piperidino-3-(2-hydroxyphenyl)-2-propen-1-one=95/5
A7: GBL/butyl acetate/N-[3-(dimethylamino)propyl]acetamide=68/28/4
A8: Butyl cetate/N-[3-(dimethylamino)propyl]acrylamide/2,2,6,6-tetramethylpiperidine 1-oxyl=95/4.99/0.01
A9: PGMEA/N-[3-(dimethylamino)propyl]acrylamide=95/5
A10: PGMEA/N-[3-(dimethylamino)propyl]acrylamide=90/10
A11: PGMEA/N-[3-(dimethylamino)propyl]methacrylamide=90/10
A12: PGMEA/N-[3-(dimethylamino)propyl]methacrylamide/GBL=92.5/5/2.5
A13: PGMEA/N-[3-(dimethylamino)propyl]methacrylamide/GBL=71.25/5/23.75
A14: PGMEA/N-[3-(dimethylamino)propyl]azine/GBL=92.5/5/2.5
A15: PGMEA/N-[3-(dimethylamino)propyl]azine/GBL=71.25/5/23.75
G1: Butyl acetate=100
G2: Cyclopentanone=100
G3: PGMEA=100

Here, PGMEA indicates propylene glycol monomethyl ether acetate, and GBL indicates γ-butyrolactone.

Here, the ClogP value of each solvent is shown below.

TABLE 2

| Solvent name | ClogP Value |
| --- | --- |
| Butyl acetate | 1.769 |
| Cyclopentanone | 0.306 |
| PGMEA | 0.5992 |
| GBL | −0.803 |

(Evaluation)

<Measurement of Breaking Elongation>

In each Example and each Comparative Example, the breaking elongation was evaluated using the compositions shown in the following table.

In a case where a composition 1 was used as the composition, the composition 1 was applied onto a 4-inch wafer having a copper oxide film and baked at 100° C. for 5 minutes to obtain a coating film having a film thickness of 25 μm after baking. Then, the treatment liquid described in the column of "Treatment liquid" in the table was puddled onto the coating film, waited for 60 seconds, and then subjected to spin drying to remove the treatment liquid. Then, the coating film was cured under the curing conditions described in the column of "Curing conditions" in the following table. Then, the film (the cured substance) of the resin composition was peeled off from the wafer by being immersed in 2 N (2 mol/L) of hydrochloric acid for 2 hours, followed by washing with water to obtain a cured film. Then, a strip-shaped cured film having a size of 5 cm×0.4 cm was obtained as a test piece with a punching cutter. Using a stretch measuring instrument INSTRON5965 (manufactured by Instron), the test piece was stretched in the longitudinal direction of the strip at a stretching rate of 5 mm/min at a room temperature of 23.0° C., and the elongation at breaking point was measured. Six test pieces per specimen were subjected to the measurement, the arithmetic average value of the three values of the elongation at breaking point in descending order of the elongation at breaking point was obtained and used as an index value.

A test piece having a value of index value of 50% or more was denoted as "judgment A", a test piece having a value of index value of 49% to 30% was denoted as "judgment B", and a test piece having a value of index value of 29% or less was denoted as "judgment C". The evaluation results are described in the column of "Breaking elongation" in the following table. It can be said that the larger the elongation at breaking point (the index value), the better the film hardness.

In a case where any one of compositions 2 to 13 was used as the composition, the composition was applied onto a 8-inch wafer having a copper oxide film and baked at 100° C. for 5 minutes to obtain a coating film having a film thickness of 25 μm after baking. Then, an EVG aligner was used to carry out exposure with broadband light at an exposure amount of 400 mJ/cm$^2$ through a mask in which twelve exposed portions having a length of 5 cm and a width of 0.4 cm were formed, and then development was carried out with the treatment liquid described in the column of "Developer" in the following table. However, in Examples 44 to 63, equal amounts of the respective two kinds of treatment liquids described in the column of "Developer" in the table were simultaneously supplied to the film to carry out development. For example, in Example 44, development was carried out simultaneously using equal amounts of a treatment liquid G2 and a treatment liquid A2 as described as "G2/A2". Then, the treatment liquid described in the column of "Rinsing liquid" in the table was puddled onto the surface of the substrate on which the coating film was provided, waited for 60 seconds, and then subjected to spin drying to remove the rinsing liquid to obtain a pattern. However, in each of Examples 12, 21 to 43, and 52 to 63, after carrying out exposure, development, and rinsing in the same manner as described above to obtain a pattern, by using the treatment liquid described in the column of "Developer" and "Rinsing liquid" in the following table, the treatment liquid described in the column of "Treatment liquid" in the following table was puddled onto the pattern, waited for 60 seconds, and then subjected to spin drying to remove the treatment liquid.

Then, the coating film was cured under the curing conditions described in the column of "Curing conditions" in the following table. However, in Example 14, the entire surface was exposed with broadband light at an exposure amount of 1,500 mJ/cm$^2$ while being heated at 130° C., and then heated at 240° C. for 14 minutes.

Then, the film (the cured substance) of the resin composition was peeled off from the wafer by being immersed in 2 N (2 mol/L) of hydrochloric acid for 2 hours, followed by washing with water to obtain a strip-shaped cured film as a test piece. Then, the elongation at break point was measured and the index value was calculated in the same manner as in the case of using the composition 1 described above.

<Biased Highly Accelerated Stress Test (HAST)>

In each Example and each Comparative Example, a biased HAST test was carried out using the compositions shown in the following table.

The biased HAST test was carried out using a test vehicle.

FIG. 1 illustrates a schematic cross-sectional view of a test vehicle 100 used in the biased HAST test.

The test vehicle 100 has a configuration in which a SiO$_2$ layer 104, a patterned Ti layer 106, and a patterned Cu wiring line 108 having a 10 μm line-and-space (L/S) of a comb-tooth type are laminated in this order on a silicon wafer (Si wafer) 102, where the wiring line is covered by a cured substance 110 of each composition. In FIG. 1, d1 and d2 are 10 μm.

In a case where the composition 1 was used as the composition, a test vehicle was obtained by the following procedure. First, the composition 1 was applied onto a SiO$_2$ wafer and a Cu wiring line, which were included in the test vehicle, and baked at 100° C. for 5 minutes to form a coating film. Then, the treatment liquid described in the column of "Treatment liquid" in the table was puddled onto the coating film, waited for 60 seconds, and then subjected to spin drying to remove the treatment liquid. Then, the coating film was cured under the curing conditions described in the column of "Curing conditions" in the following table to obtain a test vehicle.

In a case where a composition other than the composition 1 was used as the composition, a test vehicle was obtained by the following procedure. First, the composition was applied onto a SiO$_2$ wafer and a Cu wiring line, which were included in the test vehicle, and baked at 100° C. for 5 minutes to form a coating film. Then, the entire surface of the coating film was exposed with broadband light at an exposure amount of 400 mJ/cm$^2$ and the development was carried out with the treatment liquid described in the column of "Treatment liquid" in the following table. Then, the rinsing liquid described in the column of "Rinsing liquid" in the following table was puddled onto the coating film after the development, waited for 60 seconds, and then subjected to spin drying to remove the rinsing liquid to obtain a pattern. However, in the case of Examples 12, 21 to 43, and 52 to 63, after carrying out exposure, development, and rinsing in the same manner as described above to obtain a pattern, by using the treatment liquid described in the column of "Developer" and "Rinsing liquid" in the following table, the treatment liquid described in the column of "Treatment liquid" in the following table was puddled onto the pattern, waited for 60 seconds, and then subjected to spin drying to remove the treatment liquid.

Then, the coating film was cured under the curing conditions described in the column of "Curing conditions" in the following table to obtain a test vehicle. Regarding Example 14, in the same manner as in the procedure in the measurement of the breaking elongation, the entire surface was exposed with broadband light at an exposure amount of 1,500 mJ/cm$^2$ while being heated at 130° C., and then heated at 240° C. for 14 minutes.

A biased HAST test was carried out using each test vehicle.

The biased HAST test was carried out at 130° C./85% relative humidity (RH)/96 h (96 hours) using an oven manufactured by HIRAYAMA Manufacturing Corporation. The voltage applied during the HAST test was 15 V, and the determination was made based on the presence or absence of a short circuit in the wiring line during the test. In a case where the electric resistance value was less than $10^5 \Omega$, it was determined that short circuiting occurred. The evaluation results are described in the column of "bHAST" in the table.

—Evaluation Standards—

A: No short circuit was observed in the wiring line at 96 h.

B: A short circuit in the wiring line was observed at 31 h or more and less than 96 h.

C: A short circuit in the wiring line was observed at 11 h or more and less than 31 h.

D: A short circuit in the wiring line was observed at less than 11 h.

TABLE 3

| | Composition | Treatment liquid | Developer | Rinsing liquid | Curing conditions | Breaking elongation | bHAST |
|---|---|---|---|---|---|---|---|
| Example 1 | Composition 1 | A1 | — | — | 230° C./120 minutes | B | A |
| Example 2 | Composition 1 | A2 | — | — | 180° C./120 minutes | B | B |
| Example 3 | Composition 2 | — | G2 | A2 | 180° C./120 minutes | A | B |
| Example 4 | Composition 3 | — | G2 | A3 | 180° C./120 minutes | A | B |
| Example 5 | Composition 4 | — | G2 | A2 | 180° C./120 minutes | A | B |
| Example 6 | Composition 4 | — | G2 | A3 | 180° C./120 minutes | A | B |
| Example 7 | Composition 4 | — | G2 | A4 | 180° C./120 minutes | A | B |
| Example 8 | Composition 4 | — | G2 | A5 | 180° C./120 minutes | A | B |
| Example 9 | Composition 4 | — | G2 | A6 | 180° C./120 minutes | A | B |
| Example 10 | Composition 4 | — | A7 | G1 | 180° C./120 minutes | A | B |
| Example 11 | Composition 4 | — | A7 | A6 | 180° C./120 minutes | A | B |
| Example 12 | Composition 4 | A2 | G2 | G1 | 180° C./120 minutes | A | B |
| Example 13 | Composition 5 | — | G2 | A8 | 180° C./120 minutes | A | B |
| Example 14 | Composition 5 | — | G2 | A8 | UV 130° C. + 240° C./14 minutes | A | B |
| Example 15 | Composition 4 | — | G2 | A2 | 170° C./120 minutes | A | B |
| Example 16 | Composition 6 | — | G2 | A2 | 170° C./120 minutes | A | A |
| Example 17 | Composition 7 | — | G2 | A2 | 170° C./120 minutes | A | B |
| Example 18 | Composition 8 | — | G2 | A2 | 170° C./120 minutes | A | A |
| Example 19 | Composition 9 | — | G2 | A2 | 170° C./120 minutes | A | B |
| Example 20 | Composition 10 | — | G2 | A2 | 170° C./120 minutes | A | B |
| Example 21 | Composition 4 | A9 | G2 | G3 | 170° C./120 minutes | A | B |
| Example 22 | Composition 4 | A10 | G2 | G3 | 170° C./120 minutes | A | B |
| Example 23 | Composition 4 | A11 | G2 | G3 | 170° C./120 minutes | A | B |
| Example 24 | Composition 4 | A12 | G2 | G3 | 170° C./120 minutes | B | A |
| Example 25 | Composition 4 | A13 | G2 | G3 | 170° C./120 minutes | A | B |
| Example 26 | Composition 4 | A14 | G2 | G3 | 170° C./120 minutes | B | A |
| Example 27 | Composition 4 | A15 | G2 | G3 | 170° C./120 minutes | A | B |
| Example 28 | Composition 6 | A9 | G2 | G3 | 170° C./120 minutes | A | B |
| Example 29 | Composition 6 | A10 | G2 | G3 | 170° C./120 minutes | A | B |
| Example 30 | Composition 6 | A11 | G2 | G3 | 170° C./120 minutes | A | B |
| Example 31 | Composition 6 | A12 | G2 | G3 | 170° C./120 minutes | B | A |
| Example 32 | Composition 6 | A13 | G2 | G3 | 170° C./120 minutes | A | B |
| Example 33 | Composition 6 | A14 | G2 | G3 | 170° C./120 minutes | B | A |
| Example 34 | Composition 6 | A15 | G2 | G3 | 170° C./120 minutes | A | B |
| Example 37 | Composition 7 | A9 | G2 | G3 | 170° C./120 minutes | A | A |
| Example 38 | Composition 7 | A10 | G2 | G3 | 170° C./120 minutes | A | A |
| Example 39 | Composition 7 | A11 | G2 | G3 | 170° C./120 minutes | A | A |
| Example 40 | Composition 7 | A12 | G2 | G3 | 170° C./120 minutes | A | A |

TABLE 4

| | Composition | Treatment liquid | Developer | Rinsing liquid | Curing conditions | Breaking elongation | bHAST |
|---|---|---|---|---|---|---|---|
| Example 41 | Composition 7 | A13 | G2 | G3 | 170° C./120 minutes | A | A |
| Example 42 | Composition 7 | A14 | G2 | G3 | 170° C./120 minutes | A | A |
| Example 43 | Composition 7 | A15 | G2 | G3 | 170° C./120 minutes | A | A |
| Example 44 | Composition 4 | — | G2/A2 | A2 | 170° C./120 minutes | A | B |
| Example 45 | Composition 4 | — | G2/A12 | A12 | 170° C./120 minutes | B | A |

TABLE 4-continued

| | Composition | Treatment liquid | Developer | Rinsing liquid | Curing conditions | Breaking elongation | bHAST |
|---|---|---|---|---|---|---|---|
| Example 46 | Composition 4 | — | G2/A13 | A13 | 170° C./120 minutes | A | B |
| Example 47 | Composition 7 | — | G2/A2 | A2 | 170° C./120 minutes | A | A |
| Example 48 | Composition 7 | — | G2/A12 | A12 | 170° C./120 minutes | A | A |
| Example 49 | Composition 7 | — | G2/A13 | A13 | 170° C./120 minutes | A | A |
| Example 50 | Composition 4 | — | G2/G3 | A2 | 170° C./120 minutes | A | B |
| Example 51 | Composition 7 | — | G2/G3 | A2 | 170° C./120 minutes | A | B |
| Example 52 | Composition 4 | A2 | G2/G3 | G3 | 170° C./120 minutes | A | B |
| Example 53 | Composition 4 | A12 | G2/G3 | G3 | 170° C./120 minutes | B | A |
| Example 54 | Composition 4 | A13 | G2/G3 | G3 | 170° C./120 minutes | A | B |
| Example 55 | Composition 6 | A2 | G2/G3 | G3 | 170° C./120 minutes | A | A |
| Example 56 | Composition 6 | A12 | G2/G3 | G3 | 170° C./120 minutes | A | A |
| Example 57 | Composition 6 | A13 | G2/G3 | G3 | 170° C./120 minutes | A | A |
| Example 58 | Composition 7 | A2 | G2/G3 | G3 | 170° C./120 minutes | A | A |
| Example 59 | Composition 7 | A12 | G2/G3 | G3 | 170° C./120 minutes | A | A |
| Example 60 | Composition 7 | A13 | G2/G3 | G3 | 170° C./120 minutes | A | A |
| Example 61 | Composition 11 | — | G2/A2 | A2 | 170° C./120 minutes | A | A |
| Example 62 | Composition 12 | — | G2/A12 | A12 | 170° C./120 minutes | A | A |
| Example 63 | Composition 13 | — | G2/A13 | A13 | 170° C./120 minutes | A | A |
| Comparative Example 1 | Composition 1 | G1 | — | — | 230° C./120 minutes | C | C |
| Comparative Example 2 | Composition 4 | — | G2 | G1 | 180° C./120 minutes | C | D |

From the above results, it can be seen that according to the manufacturing method or a cured substance according to the embodiment of the present invention, a cured substance having excellent breaking elongation can be obtained.

The manufacturing method for a cured substance according to Comparative Example 1 and Comparative Example 2 does not have a step of bringing the treatment liquid containing at least one compound selected from the group consisting of a basic compound having an amide group and a base generator having an amide group, into contact with the film formed from the composition. In such examples, it can be seen that the obtained cured substance is inferior in breaking elongation.

EXPLANATION OF REFERENCES

100: test vehicle
102: Si wafer
104: $SiO_2$ layer
106: Ti layer
108: Cu wiring line
110: cured substance

What is claimed is:

1. A manufacturing method for a cured substance: comprising:
   a film forming step of applying a resin composition containing a precursor of a cyclization resin onto a base material to form a film;
   a treatment step of bringing a treatment liquid into contact with the film; and
   a heating step of heating the film after the treatment step,
   wherein the treatment liquid contains at least one compound selected from the group consisting of a basic compound having an amide group and a base generator having an amide group.

2. The manufacturing method for a cured substance according to claim 1,
   wherein the basic compound is an amine, and
   the base generator is a compound that generates an amine.

3. The manufacturing method for a cured substance according to claim 1,
   wherein the basic compound is a secondary amine or a tertiary amine, and
   the base generator is a compound that generates a secondary amine or a tertiary amine.

4. The manufacturing method for a cured substance according to claim 1,
   wherein the compound selected from the group consisting of the basic compound and the base generator has an acrylamide group or a methacrylamide group.

5. The manufacturing method for a cured substance according to claim 1,
   wherein the treatment liquid further contains a polymerization inhibitor.

6. The manufacturing method for a cured substance according to claim 1, further comprising, between the film forming step and the treatment step:
   an exposure step of selectively exposing the film; and
   a development step of developing the exposed film with a developer to form a patterned film.

7. The manufacturing method for a cured substance according to claim 1,
   wherein the treatment liquid is a rinsing liquid.

8. The manufacturing method for a cured substance according to claim 1,
   wherein the treatment step is a rinsing step of cleaning the film with the treatment liquid.

9. The manufacturing method for a cured substance according to claim 1, further comprising, between the film forming step and the treatment step:
   an exposure step of selectively exposing the film,
   wherein the treatment step is a step of developing the film to form a patterned film by using the treatment liquid as a developer.

10. The manufacturing method for a cured substance according to claim 9, further comprising, after the treatment step:
    a second treatment step of bringing a second treatment liquid into contact with the patterned film,
    wherein the second treatment liquid contains at least one compound selected from the group consisting of a basic compound having an amide group and a base generator having an amide group.

11. The manufacturing method for a cured substance according to claim 6,
wherein the development is negative tone development.

12. The manufacturing method for a cured substance according to claim 1,
wherein a content of an organic solvent is 50% by mass or more with respect to a total mass of the treatment liquid.

13. The manufacturing method for a cured substance according to claim 1,
wherein the precursor of the cyclization resin is a polyimide precursor.

14. The manufacturing method for a cured substance according to claim 1,
wherein the heating step is a step of accelerating the cyclization of the precursor of the cyclization resin by heating under action of at least one basic compound selected from the group consisting of the basic compound having an amide group and a basic compound generated from the base generator having an amide group.

15. The manufacturing method for a cured substance according to claim 1,
wherein a heating temperature in the heating step is 120° C. to 230° C.

16. A manufacturing method for a laminate, comprising:
a plurality of times of the manufacturing method for a cured substance according to claim 1.

17. The manufacturing method for a laminate according to claim 16, further comprising:
a metal layer forming step of forming a metal layer on a cured substance between the manufacturing methods for a cured substance which are carried out the plurality of times.

18. A manufacturing method for a semiconductor device, comprising:
the manufacturing method for a cured substance according to claim 1.

19. A treatment liquid that is a treatment liquid used in a manufacturing method for a cured substance, the manufacturing method including a film forming step of applying a resin composition containing a precursor of a cyclization resin onto a base material to form a film, a treatment step of bringing a treatment liquid into contact with the film, and a heating step of heating the film after the treatment step, the treatment liquid comprising:
at least one compound selected from the group consisting of a basic compound having an amide group and a base generator having an amide group.

20. The treatment liquid according to claim 19,
wherein the manufacturing method for a cured substance further includes an exposure step of selectively exposing the film formed by the film forming step, and a development step of developing the exposed film with a developer to form a patterned film, and the treatment step is a rinsing step of cleaning the patterned film with the treatment liquid.

* * * * *